(12) United States Patent
Sekine et al.

(10) Patent No.: US 9,123,432 B2
(45) Date of Patent: Sep. 1, 2015

(54) SEMICONDUCTOR DEVICE AND METHOD FOR DRIVING SEMICONDUCTOR DEVICE

(71) Applicant: Semiconductor Energy Laboratory Co., Ltd., Atsugi-shi, Kanagawa-ken (JP)

(72) Inventors: Yusuke Sekine, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 6 days.

(21) Appl. No.: 14/024,769

(22) Filed: Sep. 12, 2013

(65) Prior Publication Data

US 2014/0016407 A1 Jan. 16, 2014

Related U.S. Application Data

(63) Continuation of application No. 13/197,438, filed on Aug. 3, 2011, now Pat. No. 8,542,528.

(30) Foreign Application Priority Data

Aug. 6, 2010 (JP) .................................. 2010-178146
May 13, 2011 (JP) .................................. 2011-108643

(51) Int. Cl.
*G11C 11/34* (2006.01)
*G11C 5/06* (2006.01)
(Continued)

(52) U.S. Cl.
CPC .............. *G11C 11/40* (2013.01); *G11C 11/405* (2013.01); *G11C 11/4076* (2013.01);
(Continued)

(58) Field of Classification Search
CPC ........... G11C 2211/4016; G11C 5/063; G11C 13/0069; G11C 5/147; G11C 7/00; G11C 11/4074
USPC ............................................. 365/174, 189.09
See application file for complete search history.

(56) References Cited

U.S. PATENT DOCUMENTS 4,466,081 A 8/1984 Masuoka
5,555,204 A 9/1996 Endoh et al.
(Continued)

FOREIGN PATENT DOCUMENTS

EP 1 737 044 A1 12/2006
EP 2 226 847 A2 9/2010
(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Ly D Pham
(74) *Attorney, Agent, or Firm* — Fish & Richardson P.C.

(57) ABSTRACT

A semiconductor device with a novel structure is provided, in which the operation voltage is reduced or the storage capacity is increased by reducing variation in the threshold voltages of memory cells after writing. The semiconductor device includes a plurality of memory cells each including a transistor including an oxide semiconductor and a transistor including a material other than an oxide semiconductor, a driver circuit that drives the plurality of memory cells, and a potential generating circuit that generates a plurality of potentials supplied to the driver circuit. The driver circuit includes a data buffer, a writing circuit that writes one potential of the plurality of potentials into each of the plurality of memory cells as data, a reading circuit that reads the data written into the memory cells, and a verifying circuit that verifies whether the read data agrees with data held in the data buffer or not.

14 Claims, 46 Drawing Sheets

(51) Int. Cl.
  *G11C 5/14* (2006.01)
  *G11C 11/419* (2006.01)
  *G11C 16/30* (2006.01)
  *G11C 7/00* (2006.01)
  *G11C 11/40* (2006.01)
  *G11C 11/405* (2006.01)
  *G11C 11/4076* (2006.01)
  *G11C 11/56* (2006.01)
  *G11C 13/00* (2006.01)
  *G11C 11/4074* (2006.01)

(52) U.S. Cl.
  CPC ......... *G11C 11/5685* (2013.01); *G11C 13/003* (2013.01); *G11C 13/0007* (2013.01); *G11C 13/0064* (2013.01); *G11C 13/0069* (2013.01); *G11C 5/063* (2013.01); *G11C 5/147* (2013.01); *G11C 7/00* (2013.01); *G11C 11/4074* (2013.01); *G11C 13/0033* (2013.01); *G11C 2211/4016* (2013.01); *G11C 2213/79* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,774,397 A | 6/1998 | Endoh et al. |
| 5,946,231 A | 8/1999 | Endoh et al. |
| 6,014,330 A | 1/2000 | Endoh et al. |
| 6,127,702 A | 10/2000 | Yamazaki et al. |
| 6,188,611 B1 | 2/2001 | Endoh et al. |
| 6,294,274 B1 | 9/2001 | Kawazoe et al. |
| 6,335,882 B1 | 1/2002 | Saeki et al. |
| 6,563,174 B2 | 5/2003 | Kawasaki et al. |
| 6,646,922 B2 | 11/2003 | Kato |
| 6,727,522 B1 | 4/2004 | Kawasaki et al. |
| 6,768,680 B2 | 7/2004 | Kato |
| 6,873,009 B2 | 3/2005 | Hisamoto et al. |
| 6,876,572 B2 | 4/2005 | Turner |
| 6,947,327 B2 | 9/2005 | Kato |
| 6,958,938 B2 | 10/2005 | Noguchi et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,173,858 B2 | 2/2007 | Kato |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,372,737 B2 | 5/2008 | Kato |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,561,464 B2 | 7/2009 | Toda |
| 7,561,476 B2 | 7/2009 | Kato |
| 7,674,650 B2 | 3/2010 | Akimoto et al. |
| 7,732,819 B2 | 6/2010 | Akimoto et al. |
| 7,800,944 B2 | 9/2010 | Chun et al. |
| 7,839,677 B2 | 11/2010 | Kato |
| 7,978,573 B1 | 7/2011 | Lee |
| 8,289,753 B2 * | 10/2012 | Yamazaki et al. ............ 365/149 |
| 8,339,828 B2 * | 12/2012 | Yamazaki et al. ............ 365/72 |
| 8,358,530 B2 * | 1/2013 | Kamata ........................ 365/149 |
| 8,542,528 B2 * | 9/2013 | Sekine et al. ............ 365/185.03 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0080788 A1 | 4/2011 | Saito |
| 2011/0116310 A1 | 5/2011 | Yamazaki et al. |
| 2011/0128777 A1 | 6/2011 | Yamazaki et al. |
| 2012/0033505 A1 * | 2/2012 | Sekine et al. ............ 365/189.05 |
| 2012/0275245 A1 * | 11/2012 | Sekine et al. ............ 365/189.15 |

FOREIGN PATENT DOCUMENTS

| | | |
|---|---|---|
| JP | 57-105889 A | 7/1982 |
| JP | 60-198861 A | 10/1985 |

(56) References Cited

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-159895 A | 6/1989 |
| JP | 05-251705 A | 9/1993 |
| JP | 07-169284 A | 7/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-028443 A | 1/2001 |
| JP | 2001-351386 A | 12/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-021170 A | 1/2010 |
| WO | WO 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

(56) References Cited

OTHER PUBLICATIONS

Hayashi, R et al., "42.1: Invited Paper: Improved Amorphous In—Ga—Zn—0 TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG—Silicon Technology,"SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure,"NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

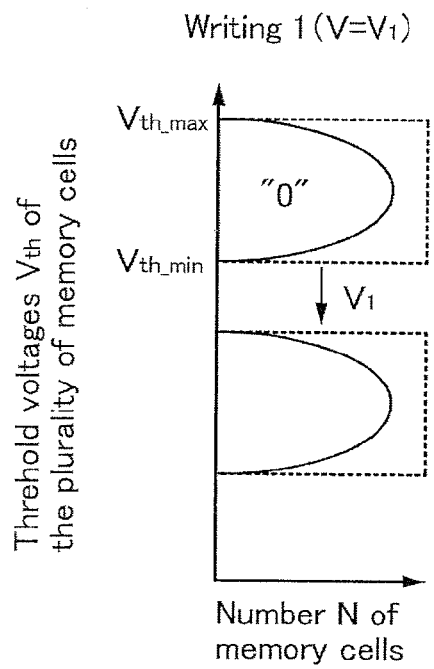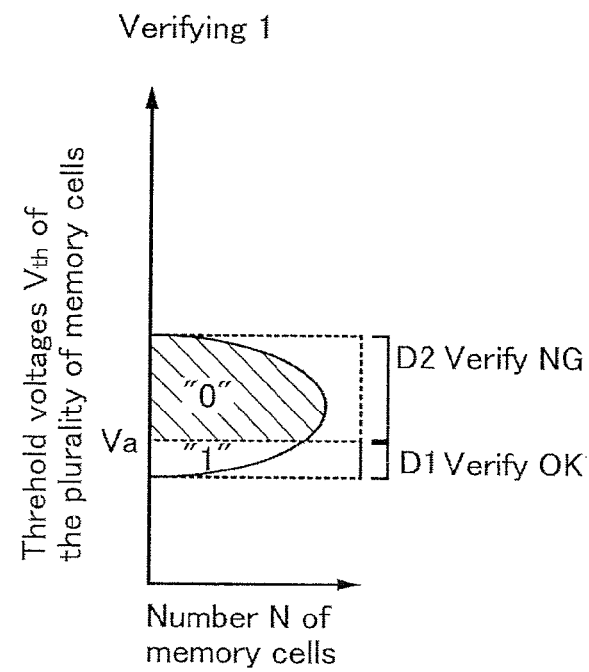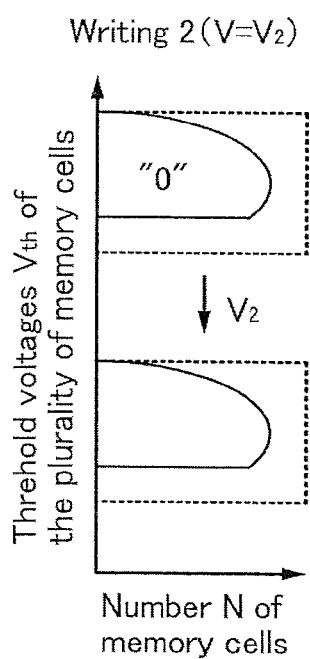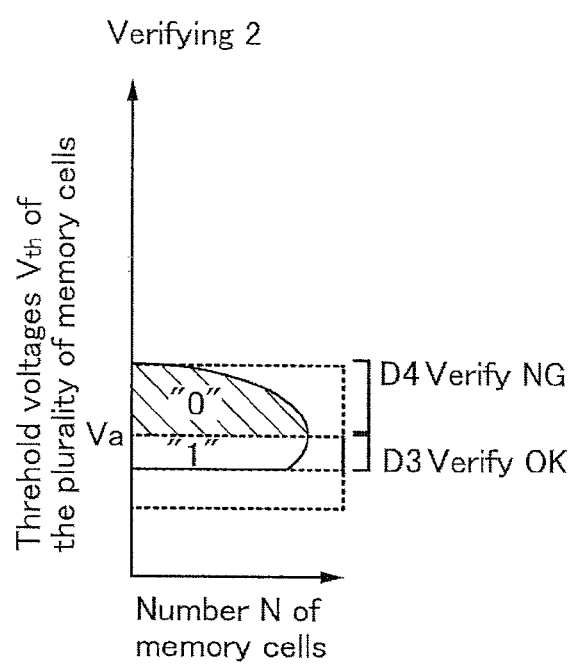

Writing 3 (V=V$_3$)

Verifying 3

Writing 4 (V=V$_4$)

Verifying 4

FIG. 5A1
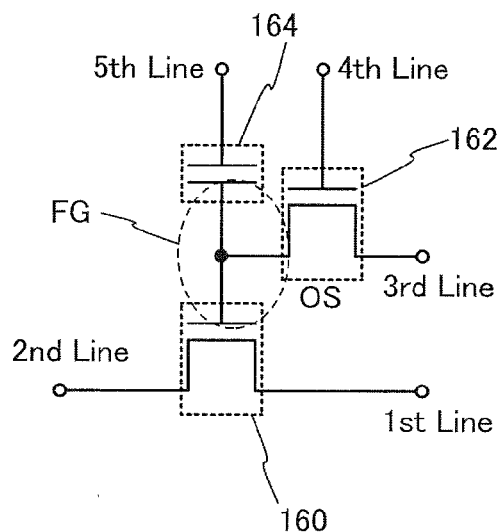
FIG. 5B
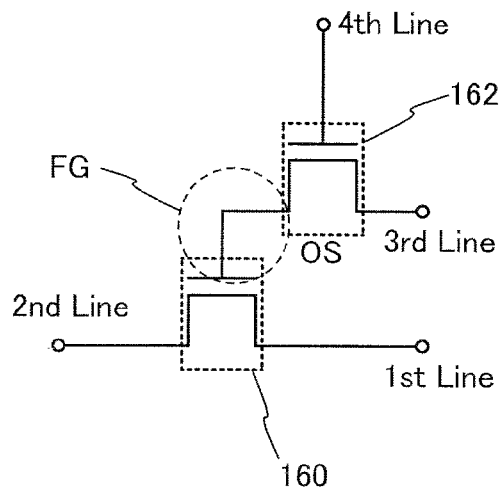
FIG. 5A2
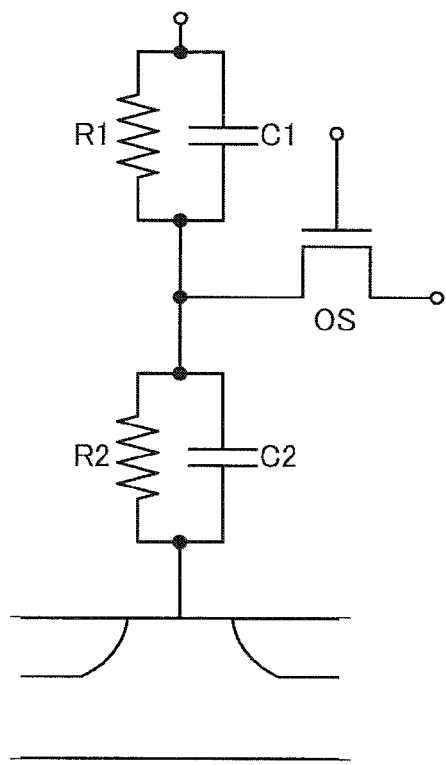

FIG. 31A         FIG. 31B
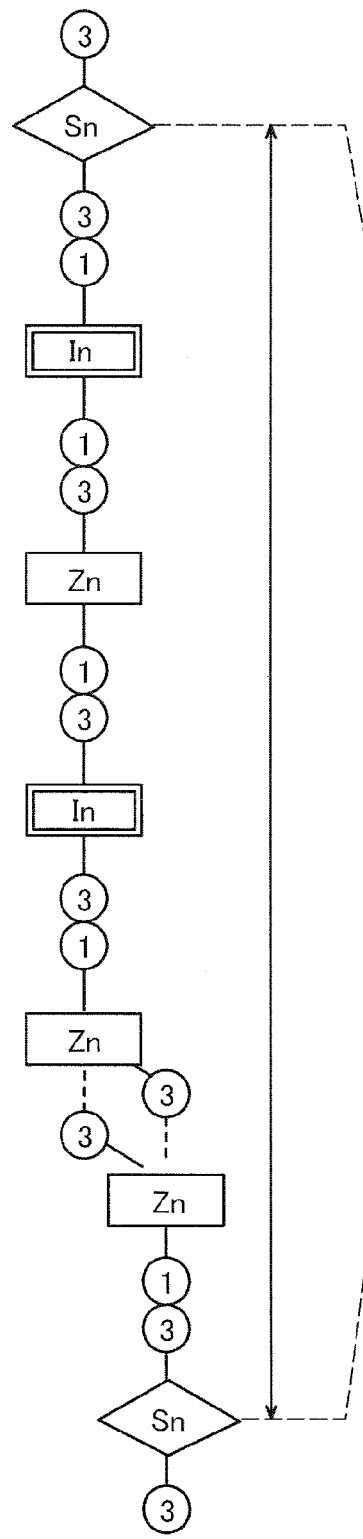
FIG. 31C
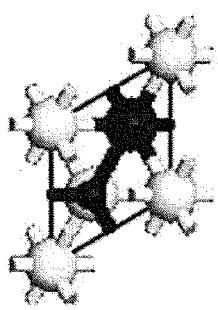
● In
☾ Sn
˛ Zn
● O

SEMICONDUCTOR DEVICE AND METHOD FOR DRIVING SEMICONDUCTOR DEVICE

CROSS-REFERENCE TO RELATED APPLICATIONS

This application is a continuation of U.S. application Ser. No. 13/197,438, filed Aug. 3, 2011, now allowed, which claims the benefit of foreign priority applications filed in Japan as Serial No. 2010-178146 on Aug. 6, 2010, and Serial No. 2011-108643 on May 13, 2011, all of which are incorporated by reference.

BACKGROUND OF THE INVENTION

1. Field of the Invention

The invention disclosed herein relates to a semiconductor device using a semiconductor element and a method for driving the semiconductor device.

2. Description of the Related Art

Memory devices using semiconductor elements are broadly classified into two categories: a volatile device that loses stored data when power supply stops, and a nonvolatile device that holds stored data even when power is not supplied.

A typical example of a volatile memory device is a dynamic random access memory (DRAM). A DRAM stores data in such a manner that a transistor included in a memory element is selected and charge is stored in a capacitor.

When data is read from a DRAM, charge in a capacitor is lost according to the above principle; thus, another writing operation is necessary every time data is read. Moreover, a transistor included in a memory element has leakage current (off-state current) between a source and a drain in an off state, or the like and charge flows into or out of a capacitor even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional memory device using a magnetic material or an optical material is needed in order to hold data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of a nonvolatile memory device is a flash memory. A flash memory includes a floating gate between a gate electrode and a channel formation region in a transistor and stores data by holding charge in the floating gate. Therefore, a flash memory has advantages in that the data holding period is extremely long (almost permanent) and refresh operation which is necessary in a volatile memory device is not needed (e.g., see Patent Document 1).

However, a gate insulating layer included in a memory element deteriorates by tunneling current generated in writing, so that the memory element stops its function after a predetermined number of times of writing. In order to reduce adverse effects of this problem, a method in which the number of times of writing for memory elements is equalized is employed, for example. However, a complicated peripheral circuit is needed to realize this method. Moreover, even when such a method is employed, the fundamental problem of lifetime is not solved. In other words, a flash memory is not suitable for applications in which data is frequently rewritten.

In addition, a flash memory needs high voltage for holding charge in the floating gate or removing charge from the floating gate, and also needs a circuit for generating high voltage. Further, it takes a relatively long time to hold or remove charge, and it is not easy to perform writing and erasing at higher speed.

REFERENCE

Patent Document

[Patent Document 1] Japanese Published Patent Application No. S57-105889

SUMMARY OF THE INVENTION

In addition to the above problems, fluctuation in the threshold voltage of a transistor included in a memory cell may cause fluctuation in potentials needed for driving a plurality of memory cells (such a potential is also referred to as the threshold voltage of a memory cell). If the operation voltages of the memory cells are determined without consideration of the fluctuation in the threshold voltages of the memory cells, an operation error might be caused. Therefore, the operation voltages of the plurality of memory cells are each set to have a certain range in consideration of the fluctuation in the threshold voltages of the memory cells. This has limited a reduction in the operation voltages of the memory cells.

Moreover, in the case where a memory cell is multi-valued, the operation voltage is increased; therefore, it has been difficult to increase the storage capacity without increasing the operation voltage and the area of the memory cell.

In view of the foregoing problems, an object of one embodiment of the disclosed invention is to provide a semiconductor device with a novel structure in which stored data can be held even when power is not supplied and there is no limit on the number of times of writing, and to provide a method for driving the semiconductor device. It is another object to provide a semiconductor device in which, by reducing variation (distribution width) in the threshold voltages of memory cells after writing, the operation voltage can be reduced, the storage capacity can be increased, or operation such as writing, holding, or reading can be surely performed, and to provide a method for driving the semiconductor device.

In one embodiment of the disclosed invention, a semiconductor device is manufactured using an oxide semiconductor. In particular, a highly purified oxide semiconductor is used. A transistor formed using an oxide semiconductor can hold data for a long time because leakage current thereof is extremely low. In the case of using a highly purified oxide semiconductor, leakage current is much lower and thus data can be held for an extremely long time.

One embodiment of the disclosed invention is a semiconductor device which includes a plurality of memory cells each including a transistor including an oxide semiconductor and a transistor including a material other than an oxide semiconductor, a driver circuit that drives the plurality of memory cells, and a potential generating circuit that generates a plurality of potentials supplied to the driver circuit. The driver circuit includes a data buffer that holds data to be written into each of the plurality of memory cells, a writing circuit that writes one potential of the plurality of potentials into each of the plurality of memory cells as data in accordance with the data held in the data buffer, a reading circuit that reads the data written into the memory cells, and a verifying circuit that verifies whether the read data agrees with the data held in the data buffer or not. The one potential is determined as a write potential in the memory cell where the data agree with each other. The write potential is changed to another potential of the plurality of potentials, for the memory cell where the data do not agree with each other.

Another embodiment of the disclosed invention is a method for driving a semiconductor device which includes a plurality of memory cells each including a transistor including an oxide semiconductor and a transistor including a material other than an oxide semiconductor. The method includes the steps of holding data to be written into each of the plurality of memory cells, writing one potential of a plurality of potentials into each of the plurality of memory cells as data in accordance with the held data, reading the data written into the memory cells, verifying whether the read data agrees with data held in a data buffer or not, determining the one potential as a write potential for the memory cell where the data agree with each other, and changing a write potential to another potential of the plurality of potentials, for the memory cell where the data do not agree with each other.

Another embodiment of the disclosed invention is a semiconductor device which includes a plurality of memory cells each including a transistor including an oxide semiconductor and a transistor including a material other than an oxide semiconductor; a driver circuit including a data buffer, a writing circuit, a reading circuit, and a verifying circuit; and a potential generating circuit that generates a plurality of potentials. The data buffer is electrically connected to the writing circuit. The writing circuit is electrically connected to the potential generating circuit through a plurality of first signal lines. The writing circuit is electrically connected to each of the plurality of memory cells through a second signal line. The reading circuit is electrically connected to each of the plurality of memory cells through a third signal line. The verifying circuit is electrically connected to the reading circuit, the data buffer, and the writing circuit.

In any of the above structures, the levels of the plurality of potentials generated in the potential generating circuit are different from each other. Each of the plurality of potentials having different levels, which is generated in the potential generating circuit, is supplied to any of the plurality of first signal lines and supplied to the writing circuit. The plurality of potentials generated in the potential generating circuit includes a plurality of potentials for writing of the same data. For example, the plurality of potentials generated in the potential generating circuit can include at least one potential on a low potential side and a plurality of potentials on a high potential side, and the plurality of potentials on the high potential side can include the plurality of potentials for writing of the same data.

In any of the above structures, in each of the plurality of memory cells, one of a source and a drain of the transistor including an oxide semiconductor is electrically connected to a gate of the transistor including a material other than an oxide semiconductor.

In any of the above structures, the writing circuit or the second signal line is electrically connected to the other of the source and the drain of the transistor including an oxide semiconductor included in each of the plurality of memory cells. The reading circuit or the third signal line is electrically connected to one of a source and a drain of the transistor including a material other than an oxide semiconductor included in each of the plurality of memory cells.

In any of the above structures, the data buffer has a function of holding data to be written into each of the plurality of memory cells. The writing circuit has a function of writing one potential of the plurality of potentials into each of the plurality of memory cells as data in accordance with the data held in the data buffer. The reading circuit has a function of reading the data written into the memory cells. The verifying circuit has a function of verifying whether the read data agrees with the data held in the data buffer or not.

In any of the above structures, the one potential is determined as the write potential for the memory cell where the read data agrees with the data held in the data buffer. The write potential is changed to another potential of the plurality of potentials, for the memory cell where the read data does not agree with the data held in the data buffer.

In any of the above structures, writing, reading, and verifying are performed again after the write potential of the memory cell where the data do not agree with each other is changed to the another potential. After the verifying, the another potential is determined as the write potential for the memory cell where the data agree with each other, and the write potential is changed to still another potential of the plurality of potentials, for the memory cell where the data do not agree with each other. In this manner, writing, reading, and verifying are performed while the write potential is sequentially changed to another potential; thus, the write potentials for the plurality of memory cells are determined.

In any of the above structures, writing operation is completed when all data of the plurality of memory cells agree with the data held in the data buffer in the verifying circuit. Alternatively, writing operation may be completed after performing writing, reading, and verifying predetermined number of times.

In any of the above structures, there is variation (distribution width) in the threshold voltages of the plurality of memory cells in some cases. In that case, the potential determined as the write potential might differ between a memory cell with minimum threshold voltage ($V_{th\_min}$) and a memory cell with maximum threshold voltage ($V_{th\_max}$).

It is preferable that a potential determined as the write potential for the memory cell with the minimum threshold voltage ($V_{th\_min}$) be higher than or equal to the lowest potential of a plurality of potentials for writing of the same data among the plurality of potentials generated in the potential generating circuit. In addition, it is preferable that a potential determined as the write potential for the memory cell with the maximum threshold voltage ($V_{th\_max}$) be lower than or equal to the highest potential among the plurality of potentials generated in the potential generating circuit.

In other words, it is preferable that the lowest potential of the plurality of potentials for writing of the same data among the plurality of potentials generated in the potential generating circuit be lower than or equal to the potential determined as the write potential for the memory cell with the minimum threshold voltage ($V_{th\_min}$). In addition, it is preferable that the highest potential among the plurality of potentials generated in the potential generating circuit be higher than or equal to the potential determined as the write potential for the memory cell with the maximum threshold voltage ($V_{th\_max}$).

In any of the above structures, it is preferable that the transistor including a material other than an oxide semiconductor include a channel formation region provided in a substrate including a semiconductor material.

Note that the substrate including a semiconductor material is preferably a single crystal semiconductor substrate or an SOI substrate. The semiconductor material included in the substrate is preferably silicon. An oxide semiconductor layer preferably includes an oxide semiconductor material including In, Ga, and Zn.

Note that although the transistor is formed using an oxide semiconductor in the above description, the disclosed invention is not limited to this. A material which can realize off-state current characteristics comparable to those of the oxide semiconductor, such as a wide gap material like silicon carbide (specifically, a semiconductor material whose energy gap Eg is larger than 3 eV), may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are used simply for convenience of explanation.

In addition, in this specification and the like, the term "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

Since the off-current of a transistor including an oxide semiconductor is extremely low, stored data can be held for an extremely long time by using the transistor, even if power is not supplied. In other words, power consumption can be sufficiently reduced because refresh operation becomes unnecessary or the frequency of refresh operation can be extremely low.

In a semiconductor device according to the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

Further, the semiconductor device according to the disclosed invention does not need high voltage for data writing and there is no problem of element deterioration. For example, unlike a conventional nonvolatile memory, it is not necessary to inject and extract electrons or holes into and from a floating gate, and thus a problem such as deterioration of a gate insulating layer does not occur at all. In other words, the semiconductor device according to the disclosed invention does not have a limit on the number of times of rewriting which is a problem in a conventional nonvolatile memory, and reliability thereof is drastically improved. Furthermore, data is written by turning on or off the transistor, whereby high-speed operation can be easily realized. In addition, there is an advantage in that operation for erasing data is not needed.

Since a transistor including a material other than an oxide semiconductor can operate at sufficiently high speed, a semiconductor device in which the transistor is used in combination with a transistor including an oxide semiconductor can perform operation (e.g., data reading) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a semiconductor material other than an oxide semiconductor (a transistor capable of operation at sufficiently high speed, in general) and the transistor including an oxide semiconductor (a transistor whose off-state current is sufficiently low, in general).

BRIEF DESCRIPTION OF THE DRAWINGS

In the accompanying drawings:
FIGS. 2A to 2D each show distribution of the threshold voltages of memory cells included in a semiconductor device;
FIGS. 5A1, 5A2, and 5B are circuit diagrams of a memory cell included in a semiconductor device.

FIGS. 31A to 31C illustrate a structure of an oxide material;

DETAILED DESCRIPTION OF THE INVENTION

Figure 1:
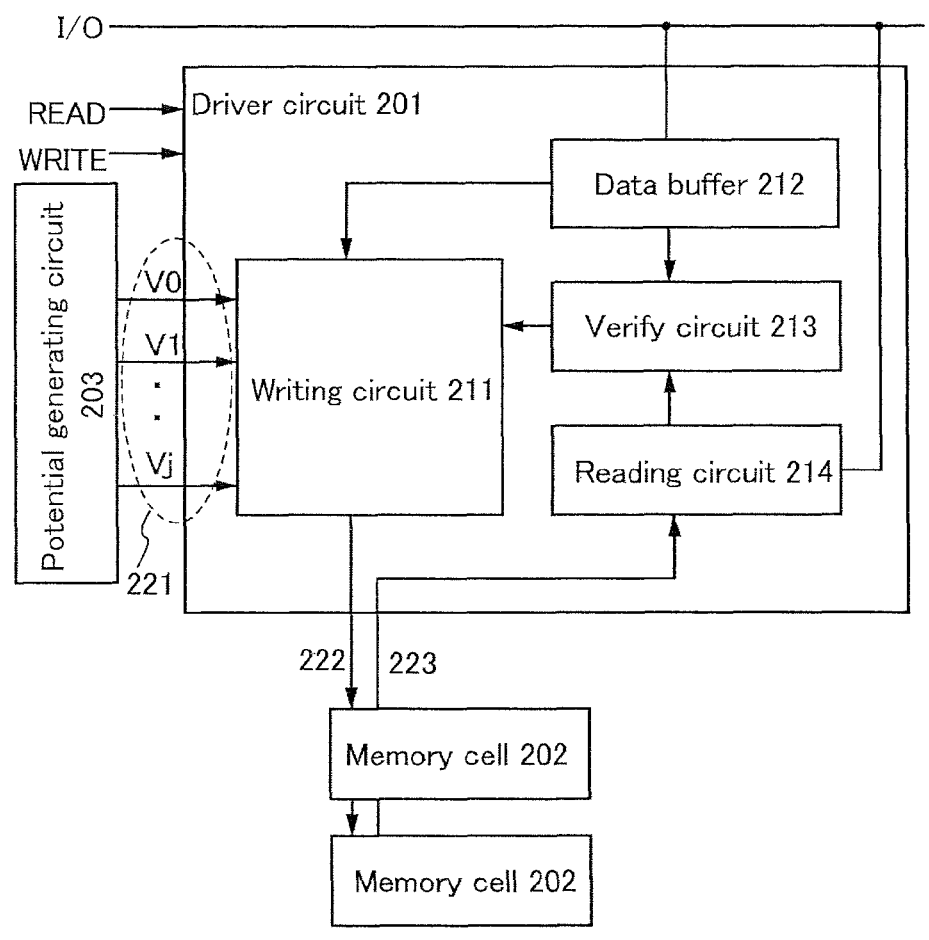
FIG. 1 is a block diagram of a semiconductor device.

Hereinafter, embodiments of the disclosed invention will be described with reference to the drawings. Note that the present invention is not limited to the following description and it is easily understood by those skilled in the art that modes and details can be modified in various ways without departing from the spirit and the scope of the present invention. Therefore, the present invention is construed as being limited to the description in the following embodiments.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure and operation of a semiconductor device according to one embodiment of the disclosed invention will be described with reference to FIG. 1, FIGS. 2A to 2D, FIGS. 3A to 3D, and FIGS. 4A and 4B.

FIG. 1 is an example of a block diagram of a semiconductor device including memory cells.

The semiconductor device includes a plurality of memory cells 202, a driver circuit 201, and a potential generating circuit 203. The driver circuit 201 includes a data buffer 212, a writing circuit 211, a reading circuit 214, and a verifying circuit 213. Each of the plurality of memory cells 202 includes a transistor (not shown) including an oxide semiconductor and a transistor (not shown) including a material other than an oxide semiconductor. Further, the semiconductor device includes a wiring for supplying an input/output signal (I/O) (also referred to as a data input/output line), a wiring for supplying a read signal (READ), and a wiring for supplying a write signal (WRITE). The driver circuit 201 is provided for each column having the plurality of memory cells 202.

The data buffer 212 is electrically connected to the writing circuit 211. The writing circuit 211 is electrically connected to the potential generating circuit 203 through a plurality of first signal lines 221. The writing circuit 211 is electrically connected to each of the plurality of memory cells 202 through a second signal line 222. The reading circuit 214 is electrically connected to each of the plurality of memory cells 202 through a third signal line 223. The verifying circuit 213 is electrically connected to the reading circuit 214, the data buffer 212, and the writing circuit 211.

The driver circuit 201 has a function of driving the plurality of memory cells. The potential generating circuit 203 has a function of generating a plurality of potentials ($V_0$, $V_1$, $V_2$, ... $V_j$) (j is an integer of 2 or more).

The levels of the plurality of potentials ($V_0$, $V_1$, $V_2$, ... $V_j$) generated in the potential generating circuit 203 are different from each other. Each of the plurality of potentials ($V_0$, $V_1$, $V_2$, ... $V_j$) having different levels, which is generated in the potential generating circuit 203, is supplied to any of the plurality of first signal lines 221 and supplied to the writing circuit 211.

The data buffer 212 has a function of holding data to be written into each of the plurality of memory cells 202. The writing circuit 211 has a function of writing one potential (e.g., $V_1$) of the plurality of potentials generated in the potential generating circuit 203 into each of the plurality of memory cells 202 as data in accordance with the data held in the data buffer 212. The reading circuit 214 has a function of reading the data written into the memory cells 202. The verifying circuit 213 has a function of verifying whether the data read by the reading circuit 214 agrees with the data held in the data buffer 212 or not.

The one potential (e.g., $V_1$) is determined as a write potential for the memory cell 202 where the data read by the reading circuit 214 agrees with the data held in the data buffer 212. The write potential is changed to another potential (e.g., $V_2$) of the plurality of potentials generated in the potential generating circuit 203, for the memory cell 202 where the data read by the reading circuit 214 does not agree with the data held in the data buffer 212.

After the write potential is changed to the another potential (e.g., $V_2$), writing, reading, and verifying are performed again on the memory cell 202 where the data read by the reading circuit 214 does not agree with the data held in the data buffer 212. After the verifying, the another potential (e.g., $V_2$) is determined as the write potential for the memory cell 202 where the data read by the reading circuit 214 agrees with the data held in the data buffer 212. For the memory cell 202 where the data read by the reading circuit 214 does not agree with the data held in the data buffer 212, the write potential is changed to still another potential (e.g., $V_j$) of the plurality of potentials. In this manner, writing, reading, and verifying are performed while the write potential is sequentially changed to another potential; thus, the write potentials for the plurality of memory cells are determined.

Writing operation is completed when all data of the plurality of memory cells 202 agree with the data held in the data buffer 212 in the verifying circuit 213. Writing operation may be completed after performing writing, reading, and verifying predetermined number of times (e.g., j times).

In the above structure, fluctuation in the threshold voltage of a transistor included in the memory cell 202, or the like may cause variation (distribution width) in potentials needed for driving the plurality of memory cells 202 (such a potential is also referred to as the threshold voltage of a memory cell).

An example of a procedure for writing data "1" into the plurality of memory cells 202 having data "0" in the case where there is variation (distribution width) in the threshold voltages of the plurality of memory cells 202 is shown in FIGS. 2A to 2D and FIGS. 3A to 3D. Note that among the plurality of potentials ($V_0$, $V_1$, $V_2$, ... $V_j$) generated in the potential generating circuit 203, the potential $V_0$ (e.g., a ground potential) is a potential for writing data "0" and the potentials $V_1$, $V_2$, ... $V_j$ are potentials for writing data "1".

FIG. 2A is a graph showing distribution of the threshold voltages $V_{th}$ of the plurality of memory cells 202, where the horizontal axis represents the number N of memory cells and the vertical axis represents the threshold voltage $V_{th}$ of the memory cells 202. FIG. 2A shows distribution of the threshold voltages $V_{th}$ before writing (data "0") and after writing. The distribution of the threshold voltages $V_{th}$ before writing (data "0") is shown above an arrow, and the distribution of the threshold voltages $V_{th}$ after writing is shown below the arrow. The level of a potential used for writing ($V=V_1$) is shown beside the arrow.

As shown in FIG. 2A, writing (referred to as Writing 1) is performed on the plurality of memory cells 202 with the use of one potential (here, $V_1$) of the plurality of potentials ($V_0$, $V_1$, $V_2$, ... $V_j$) generated in the potential generating circuit 203 as a write potential. Consequently, the distribution of the threshold voltages $V_{th}$ before writing (data "0") is changed to the distribution of the threshold voltages $V_{th}$ after writing.

Next, as shown in FIG. 2B, data written into the memory cells 202 where Writing 1 is performed is read by the reading circuit 214, and whether the data read by the reading circuit 214 agrees with data held in the data buffer 212 (i.e., data to be written into the memory cells 202) or not is verified (this step is referred to as Verifying 1).

In Verifying 1, the data read by the reading circuit 214 is judged as data "0" when the threshold voltage $V_{th}$ of the memory cell 202 is higher than a given voltage Va or is judged as data "1" when the threshold voltage $V_{th}$ of the memory cell 202 is lower than or equal to Va.

Specifically, a range denoted by D1 in FIG. 2B is the range where the data read by the reading circuit 214 agrees with the data held in the data buffer 212 (i.e., the data to be written into the memory cells 202) (this state is also referred to as Verify OK). In the memory cells 202 in the range denoted by D1 in FIG. 2B (i.e., the memory cells 202 in the state of Verify OK), data "1" can be obtained when the potential $V_1$ is used as the write potential. Thus, in the memory cells 202 in the range denoted by D1 in FIG. 2B (i.e., the memory cells 202 in the state of Verify OK), the one potential ($V_1$) is determined as the write potential.

A range denoted by D2 in FIG. 2B is the range where the data read by the reading circuit 214 does not agree with the data held in the data buffer 212 (i.e., the data to be written into the memory cells 202) (this state is also referred to as Verify NG). In the memory cells 202 in the range denoted by D2 in FIG. 2B (i.e., the memory cells 202 in the state of Verify NG), data "1" cannot be obtained and data "0" is detected when the potential $V_1$ is used as the write potential.

In the memory cells 202 in the range denoted by D2 in FIG. 2B (i.e., the memory cells 202 in the state of Verify NG, in which data "0" is detected), the write potential is changed to another potential (here, $V_2$) of the plurality of potentials generated in the potential generating circuit 203. After that, writing, reading, and verifying are performed again.

FIG. 2C shows the distribution of the threshold voltages $V_{th}$ in the case where writing (referred to as Writing 2) is performed on the memory cells 202 in the range denoted by D2 in FIG. 2B with the use of the another potential $V_2$ of the plurality of potentials generated in the potential generating circuit 203 as the write potential. Note that FIG. 2C shows only the memory cells 202 in the range denoted by D2 in FIG. 2B for convenience; however, writing may be concurrently performed on other memory cells 202 in the step of Writing 2. In other words, the potential $V_1$ may be concurrently written into the memory cells 202 in the range denoted by D1 in FIG. 2B in the step of Writing 2.

In FIG. 2C, the threshold voltage before writing (data "0") of the potential $V_2$ is substantially as high as the threshold voltage before writing (data "0" in FIG. 2A) of the potential $V_1$ for convenience; however, the threshold voltage before writing (data "0") of the potential $V_2$ may be substantially as high as the threshold voltage after writing (data "0" in FIG. 2B) of the potential $V_1$.

As shown in FIG. 2C, when writing (Writing 2) is performed with the use of the potential $V_2$ of the plurality of potentials ($V_0$, $V_1$, $V_2$, ... $V_j$) generated in the potential generating circuit 203 as the write potential, the distribution of the threshold voltages $V_{th}$ before writing (data "0") is changed to the distribution of the threshold voltages $V_{th}$ after writing.

Next, as shown in FIG. 2D, data written into the memory cells 202 is read by the reading circuit 214, and whether the data read by the reading circuit 214 agrees with the data held in the data buffer 212 (i.e., the data to be written into the memory cells 202) or not is verified (this step is referred to as Verifying 2). Also here, only the memory cells 202 in the range denoted by D2 in FIG. 2B are shown for convenience.

In Verifying 2, the data read by the reading circuit 214 is judged as data "0" when the threshold voltage $V_{th}$ of the memory cell 202 is higher than Va or is judged as data "1" when the threshold voltage $V_{th}$ of the memory cell 202 is lower than or equal to Va.

Specifically, a range denoted by D3 in FIG. 2D is the range where the data read by the reading circuit 214 agrees with the data held in the data buffer 212 (i.e., the data to be written into the memory cells 202) (this state is also referred to as Verify OK). In the memory cells 202 in the range denoted by D3 in FIG. 2D (i.e., the memory cells 202 in the state of Verify OK), data "1" can be obtained when the potential $V_2$ is used as the write potential. Thus, in the memory cells 202 in the range denoted by D3 in FIG. 2D (i.e., the memory cells 202 in the state of Verify OK), the another potential ($V_2$) is determined as the write potential.

A range denoted by D4 in FIG. 2D is the range where the data read by the reading circuit 214 does not agree with the data held in the data buffer 212 (i.e., the data to be written into the memory cells 202) (this state is also referred to as Verify NG). In the memory cells 202 in the range denoted by D4 in FIG. 2D (i.e., the memory cells 202 in the state of Verify NG), data "1" cannot be obtained and data "0" is detected when the potential $V_2$ is used as the write potential.

In the memory cells 202 in the range denoted by D4 in FIG. 2D (i.e., the memory cells 202 in the state of Verify NG, in which data "0" is detected), the write potential is changed to still another potential (here, $V_3$) of the plurality of potentials generated in the potential generating circuit 203. After that, writing, reading, and verifying are performed again.

Figure 3A:
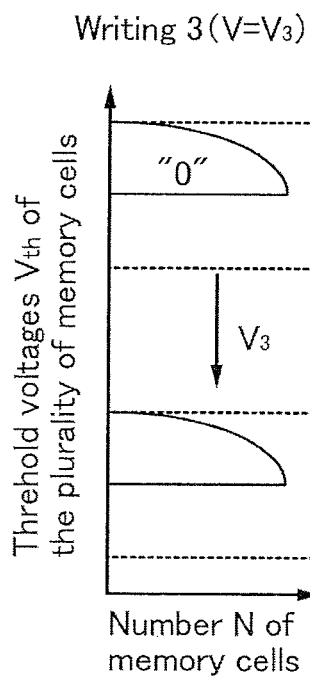
FIGS. 3A to 3D each show distribution of the threshold voltages of memory cells included in a semiconductor device.

FIG. 3A shows the distribution of the threshold voltages $V_{th}$ in the case where writing (referred to as Writing 3) is performed on the memory cells 202 in the range denoted by D4 in FIG. 2D with the use of the still another potential $V_3$ of the plurality of potentials generated in the potential generating circuit 203 as the write potential. Note that FIG. 3A shows only the memory cells 202 in the range denoted by D4 in FIG. 2D for convenience; however, writing may be concurrently performed on other memory cells 202 in the step of Writing 3. In other words, the potential $V_1$ may be concurrently written into the memory cells 202 in the range denoted by D1 in FIG. 2B in the step of Writing 3, and the potential $V_2$ may be concurrently written into the memory cells 202 in the range denoted by D3 in FIG. 2D in the step of Writing 3.

In FIG. 3A, the threshold voltage before writing (data "0") of the potential $V_3$ is substantially as high as the threshold voltage before writing (data "0" in FIG. 2A) of the potential $V_1$ for convenience; however, the threshold voltage before writing (data "0") of the potential $V_3$ may be substantially as high as the threshold voltage after writing (data "0" in FIG. 2D) of the potential $V_2$.

As shown in FIG. 3A, when writing (Writing 3) is performed with the use of the potential $V_3$ of the plurality of potentials ($V_0$, $V_1$, $V_2$, ... $V_j$) generated in the potential generating circuit 203 as the write potential, the distribution of the threshold voltages $V_{th}$ before writing (data "0") is changed to the distribution of the threshold voltages $V_{th}$ after writing.

Figure 3B:
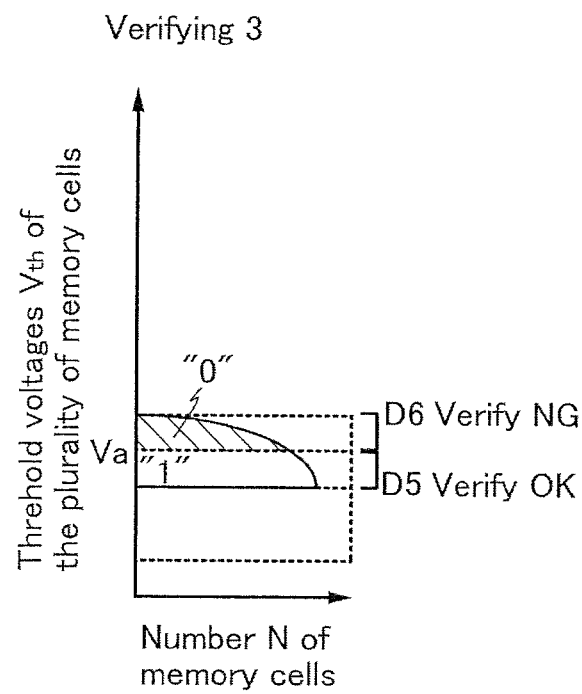

Next, as shown in FIG. 3B, data written into the memory cells 202 is read by the reading circuit 214, and whether the data read by the reading circuit 214 agrees with the data held in the data buffer 212 (i.e., the data to be written into the memory cells 202) or not is verified (this step is referred to as Verifying 3). Also here, only the memory cells 202 in the range denoted by D4 in FIG. 2D are shown for convenience.

In Verifying 3, the data read by the reading circuit 214 is judged as data "0" when the threshold voltage $V_{th}$ of the memory cell 202 is higher than Va or is judged as data "1" when the threshold voltage $V_{th}$ of the memory cell 202 is lower than or equal to Va.

Specifically, a range denoted by D5 in FIG. 3B is the range where the data read by the reading circuit 214 agrees with the data held in the data buffer 212 (i.e., the data to be written into the memory cells 202) (this state is also referred to as Verify OK). In the memory cells 202 in the range denoted by D5 in FIG. 3B (i.e., the memory cells 202 in the state of Verify OK), data "1" can be obtained when the potential $V_3$ is used as the write potential. Thus, in the memory cells 202 in the range denoted by D5 in FIG. 3B (i.e., the memory cells 202 in the state of Verify OK), the still another potential ($V_3$) is determined as the write potential.

A range denoted by D6 in FIG. 3B is the range where the data read by the reading circuit 214 does not agree with the data held in the data buffer 212 (i.e., the data to be written into the memory cells 202) (this state is also referred to as Verify NG). In the memory cells 202 in the range denoted by D6 in FIG. 3B (i.e., the memory cells 202 in the state of Verify NG), data "1" cannot be obtained and data "0" is detected when the potential $V_3$ is used as the write potential.

In the memory cells 202 in the range denoted by D6 in FIG. 3B (i.e., the memory cells 202 in the state of Verify NG, in which data "0" is detected), the write potential is changed to further still another potential (here, $V_4$) of the plurality of potentials generated in the potential generating circuit 203. After that, writing, reading, and verifying are performed again.

Figure 3C:
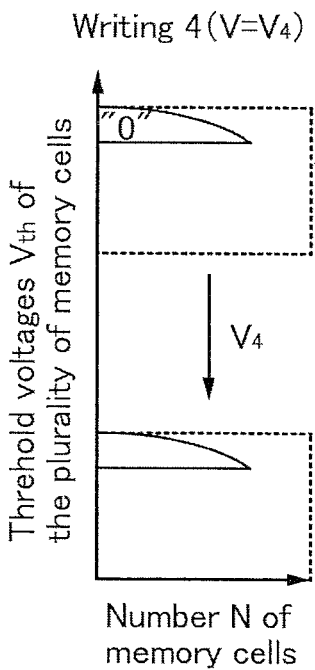

FIG. 3C shows the distribution of the threshold voltages $V_{th}$ in the case where writing (referred to as Writing 4) is performed on the memory cells 202 in the range denoted by D6 in FIG. 3B with the use of the further still another potential $V_4$ of the plurality of potentials generated in the potential generating circuit 203 as the write potential. Note that FIG. 3C shows only the memory cells 202 in the range denoted by D6 in FIG. 3B for convenience; however, writing may be concurrently performed on other memory cells 202 in the step of Writing 4. In other words, the potential $V_1$ may be concurrently written into the memory cells 202 in the range denoted by D1 in FIG. 2B in the step of Writing 4, the potential $V_2$ may be concurrently written into the memory cells 202 in the range denoted by D3 in FIG. 2D in the step of Writing 4, and the potential $V_3$ may be concurrently written into the memory cells 202 in the range denoted by D5 in FIG. 3B in the step of Writing 4.

In FIG. 3C, the threshold voltage before writing (data "0") of the potential $V_4$ is substantially as high as the threshold voltage before writing (data "0" in FIG. 2A) of the potential $V_1$ for convenience; however, the threshold voltage before writing (data "0") of the potential $V_4$ may be substantially as high as the threshold voltage after writing (data "0" in FIG. 2D) of the potential $V_3$.

As shown in FIG. 3C, when writing (Writing 4) is performed with the use of the potential $V_4$ of the plurality of potentials ($V_0$, $V_1$, $V_2$, ... $V_j$) generated in the potential generating circuit 203 as the write potential, the distribution of the threshold voltages $V_{th}$ before writing (data "0") is changed to the distribution of the threshold voltages $V_{th}$ after writing (data "1").

Figure 3D:
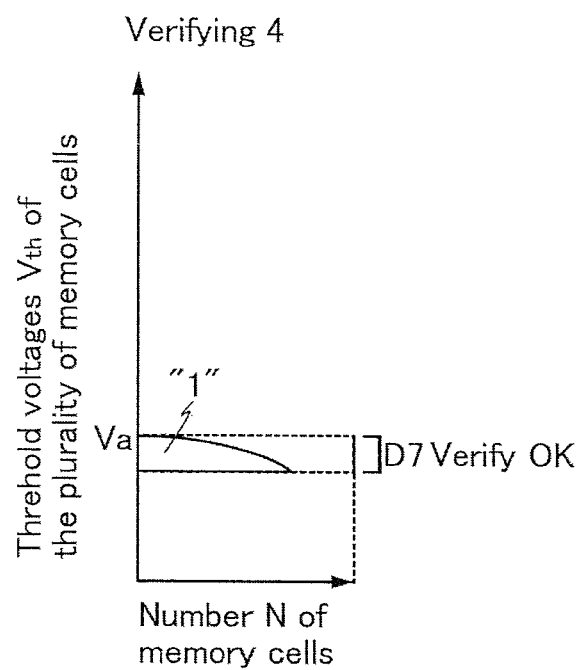

Next, as shown in FIG. 3D, data written into the memory cells 202 is read by the reading circuit 214, and whether the data read by the reading circuit 214 agrees with the data held in the data buffer 212 (i.e., the data to be written into the memory cells 202) or not is verified (this step is referred to as Verifying 4). Also here, only the memory cells 202 in the range denoted by D6 in FIG. 3B are shown for convenience.

In Verifying 4, the data read by the reading circuit 214 is judged as data "0" when the threshold voltage $V_{th}$ of the memory cell 202 is higher than Va or is judged as data "1" when the threshold voltage $V_{th}$ of the memory cell 202 is lower than or equal to Va.

Here, the data read by the reading circuit 214 all agrees with the data held in the data buffer 212 (i.e., the data to be written into the memory cells 202) (this state is also referred to as Verify OK). The range is denoted by D7 in FIG. 3D. At this stage, the write potentials (here, any of $V_1$, $V_2$, $V_3$, and $V_4$) are determined for all the plurality of memory cells 202. Note that the range of the threshold voltages $V_{th}$ denoted by D7 in FIG. 3D corresponds to the range of the threshold voltages $V_{th}$ denoted by D1 in FIG. 2B.

Figure 4A:
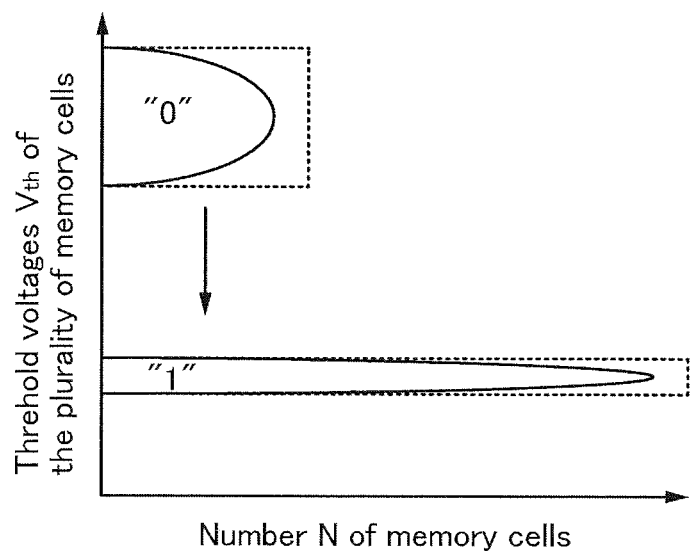
FIGS. 4A and 4B each show distribution of the threshold voltages of memory cells included in a semiconductor device.

Writing operation is completed when all the plurality of memory cells 202 are in the state of Verify OK. Alternatively, writing operation may be completed after writing, reading, and verifying performing predetermined number of times (e.g., j times). When the writing operation is completed, variation (distribution width) in the threshold voltages $V_{th}$ after writing (data "1") can be smaller than variation (distribution width) in the threshold voltages $V_{th}$ before writing (data "0") as shown in FIG. 4A, for example. Consequently, the operation voltage can be reduced.

Figure 4B:
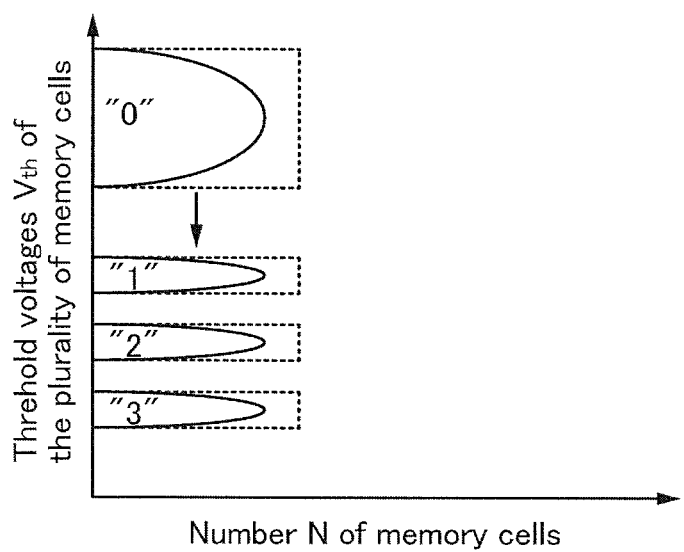

An example in which the memory cell 202 has two-level data "0" or "1" is described above; the above structure can also be applied in the case where the memory cell 202 has data of three or more levels (multi-level data). Since variation (distribution width) in the threshold voltages $V_{th}$ after writing can be made smaller than variation (distribution width) in the threshold voltages $V_{th}$ before writing, the above structure is advantageous also in the case of a multi-valued memory. As shown in FIG. 4B, for example, variation (distribution width) in the threshold voltages $V_{th}$ after writing (data "1", "2", and "3") can be made smaller than variation (distribution width) in the threshold voltages $V_{th}$ before writing (data "0"). Consequently, the storage capacity can be increased without increasing the operation voltage and the area of a memory cell.

Variation (distribution width) in the threshold voltages $V_{th}$ after writing can be suppressed to around a potential width between adjacent potentials of plurality of potentials for writing of the same data. By generating the plurality of potentials for writing of the same data at short intervals, variation (distribution width) in the threshold voltages $V_{th}$ of the memory cells after writing can be reduced.

As shown in FIGS. 2A to 2D and FIGS. 3A to 3D, in the case where there is variation (distribution width) in the threshold voltages of the plurality of memory cells 202, the potential determined as the write potential might differ between a memory cell with the minimum threshold voltage ($V_{th\_min}$) and a memory cell with the maximum threshold voltage ($V_{th\_max}$) even when the same data is written.

For example, a potential determined as the write potential for writing data "1" into the memory cell 202 with the minimum threshold voltage ($V_{th\_min}$) is the potential $V_1$ as shown in FIGS. 2A and 2B, whereas a potential determined as the write potential for writing data "1" into the memory cell 202 with the maximum threshold voltage ($V_{th\_max}$) is the potential $V_4$ as shown in FIGS. 3C and 3D.

Here, it is preferable that a potential (here, $V_1$) determined as the write potential for the memory cell 202 with the minimum threshold voltage ($V_{th\_min}$) be higher than or equal to the lowest potential of potentials (i.e., $V_1$, $V_2$, ... $V_j$) for writing data "1" among the plurality of potentials ($V_0$, $V_1$, $V_2$, ... $V_j$) generated in the potential generating circuit. In addition, it is preferable that a potential (here, $V_4$) determined as the write potential for the memory cell 202 with the maximum threshold voltage ($V_{th\_max}$) be lower than or equal to the highest potential among the plurality of potentials ($V_0$, $V_1$, $V_2$, ... $V_j$) generated in the potential generating circuit.

In other words, it is preferable that the lowest potential of the potentials (i.e., $V_1$, $V_2$ ... $V_j$) for writing data "1" among the plurality of potentials generated in the potential generating circuit be lower than or equal to the potential (here, $V_1$) determined as the write potential for the memory cell with the minimum threshold voltage ($V_{th\_min}$). In addition, it is preferable that the highest potential among the plurality of potentials generated in the potential generating circuit be higher than or equal to the potential (here, $V_4$) determined as the write potential for the memory cell with the maximum threshold voltage ($V_{th\_max}$).

In the above structure, in each of the plurality of memory cells 202, one of a source and a drain of the transistor (not shown) including an oxide semiconductor can be electrically connected to a gate of the transistor (not shown) including a material other than an oxide semiconductor.

In the above structure, the second signal line 222 which electrically connects the writing circuit 211 to each of the plurality of memory cells 202 can be electrically connected to the other of the source and the drain of the transistor (not shown) including an oxide semiconductor included in each of the plurality of memory cells 202.

In the above structure, the third signal line 223 which electrically connects the reading circuit 214 to each of the plurality of memory cells 202 can be electrically connected to one of a source and a drain of the transistor (not shown) including a material other than an oxide semiconductor included in each of the plurality of memory cells 202.

In the above structure, it is preferable that the transistor (not shown) including a material other than an oxide semiconductor include a channel formation region provided in a substrate including a semiconductor material.

In the semiconductor device according to this embodiment, even when the threshold voltage of a transistor included in the memory cell 202 fluctuates, variation (distribution width) in the threshold voltages of the plurality of memory cells 202 after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 2

In this embodiment, a circuit configuration and operation of a memory cell included in a semiconductor device according to one embodiment of the disclosed invention will be described with reference to FIGS. 5A1, 5A2, and 5B. Note that in some circuit diagrams, "OS" is written beside a transistor in order to indicate that the transistor includes an oxide semiconductor.

<Basic Configuration of Memory Cell>

In a memory cell illustrated in FIG. 5A-1, a first wiring (a 1st Line) and a source electrode (or a drain electrode) of a transistor 160 are electrically connected to each other, and a second wiring (a 2nd Line) and the drain electrode (or the source electrode) of the transistor 160 are electrically connected to each other. In addition, a third wiring (a 3rd Line) and a source electrode (or a drain electrode) of a transistor 162 are electrically connected to each other, and a fourth wiring (a 4th Line) and a gate electrode of the transistor 162 are electrically connected to each other. Further, a gate electrode of the transistor 160 and the drain electrode (or the source electrode) of the transistor 162 are electrically connected to one electrode of a capacitor 164, and a fifth wiring (a 5th Line) and the other electrode of the capacitor 164 are electrically connected to each other.

Here, a transistor including an oxide semiconductor is used as the transistor 162, for example. A transistor including an oxide semiconductor has a characteristic of an extremely low off-state current. For that reason, a potential of the gate electrode of the transistor 160 can be held for an extremely long time by turning off the transistor 162. Provision of the capacitor 164 facilitates holding of charge given to the gate electrode of the transistor 160 and reading of stored data.

A transistor including a material other than an oxide semiconductor is used as the transistor 160. In terms of increasing the speed of data reading, it is preferable to use, for example, a transistor with high switching rate such as a transistor including single crystal silicon.

A structure in which the capacitor 164 is not provided as illustrated in FIG. 5B can also be employed.

The memory cell illustrated in FIG. 5A1 utilizes a characteristic in which the potential of the gate electrode of the transistor 160 can be held, whereby writing, holding, and reading of data can be performed as follows.

Firstly, writing and holding of data will be described. First, the potential of the fourth wiring is set to a potential at which the transistor 162 is turned on, so that the transistor 162 is turned on. Accordingly, the potential of the third wiring is applied to the gate electrode of the transistor 160 and the capacitor 164. That is, predetermined charge is given to the gate electrode of the transistor 160 (writing). Here, one of charges for supply of two different potentials (hereinafter, charge for supply of a low potential is referred to as charge $Q_L$ and charge for supply of a high potential is referred to as charge $Q_H$) is given. Note that charges for supply of three or more different potentials may be employed to improve the storage capacity. After that, the potential of the fourth wiring is set to a potential at which the transistor 162 is turned off, so that the transistor 162 is turned off. Thus, the charge given to the gate electrode of the transistor 160 is held (holding).

Since the off-state current of the transistor 162 is extremely low, the charge of the gate electrode of the transistor 160 is held for a long time.

Secondly, reading of data will be described. By supplying an appropriate potential (a read potential) to the fifth wiring while a predetermined potential (a constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge given to the gate electrode of the transistor 160 can be determined. For example, in the case where $Q_H$ is given in writing, when the potential of the fifth wiring is $V_0$ ($>V_{th\_H}$), the transistor 160 is turned on. In the case where $Q_L$ is given in writing, even when the potential of the fifth wiring is $V_0$ ($<V_{th\_L}$), the transistor 160 remains in an off state. Therefore, the stored data can be read by measuring the potential of the second wiring.

However, fluctuation in the threshold voltage of a transistor (e.g., the transistor 160) included in the memory cell may cause fluctuation in potentials needed for driving a plurality of memory cells (such a potential is also referred to as the threshold voltage of a memory cell). For example, fluctuation in the threshold voltage of the transistor 160 may cause variation in the threshold voltages of the memory cells in data reading. Therefore, the operation voltages of the plurality of memory cells are each set to have a certain range in consideration of the variation in the threshold voltages of the memory cells. This has limited a reduction in the operation voltages of the memory cells.

In the semiconductor device according to one embodiment of the disclosed invention, writing, reading, and verifying are performed while the write potential is sequentially changed to another potential as shown in FIG. 1, FIGS. 2A to 2D, FIGS. 3A to 3D, and FIGS. 4A and 4B; thus, the write potentials for the plurality of memory cells are determined. Accordingly, a semiconductor device in which, by reducing variation (distribution width) in the threshold voltages of memory cells after writing, the operation voltage can be reduced, the storage capacity can be increased, or operation such as writing, holding, or reading can be surely performed can be provided. In addition, a method for driving the semiconductor device can be provided.

Note that in the case where a plurality of memory cells is arrayed to be used, only data of desired memory cells is needed to be read. Thus, in the case where data of predetermined memory cells is read and data of the other memory cells is not read, a potential which allows the transistor 160 to be turned off regardless of a state of the gate electrode, that is, a potential lower than $V_{th\_H}$ may be supplied to fifth wirings of the memory cells whose data is not to be read. Alternatively, a potential which allows the transistor 160 to be turned on regardless of a state of the gate electrode, that is, a potential higher than $V_{th\_L}$ may be supplied to the fifth wirings.

Next, rewriting of data (also referred to as another writing) will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (potential related to new data) is applied to the gate electrode of the transistor 160 and the capacitor 164. After that, the potential of the fourth wiring is set to a potential at which the transistor 162 is turned off, so that the transistor 162 is turned off. Accordingly, charge related to new data is given to the gate electrode of the transistor 160.

In the memory cell included in the semiconductor device according to the disclosed invention, data can be directly rewritten by another writing of data as described above. Therefore, extraction of electrons or holes from a floating gate with the use of high voltage needed in a flash memory or the like is not necessary and thus, a reduction in operation speed, which is attributed to erasing operation, can be suppressed. In other words, high-speed operation of the semiconductor device including the memory cell can be realized.

Note that the third wiring illustrated in FIGS. 5A1 and 5B corresponds to the second signal line 222 illustrated in FIG. 1. The second wiring illustrated in FIGS. 5A1 and 5B corresponds to the third signal line 223 illustrated in FIG. 1.

Note that the drain electrode (or the source electrode) of the transistor 162 is electrically connected to the gate electrode of the transistor 160, thereby having a function similar to that of a floating gate of a floating-gate transistor which is used as a nonvolatile memory element. Hereinafter, the portion where the drain electrode (or the source electrode) of the transistor 162 and the gate electrode of the transistor 160 are electrically connected to each other is called a node FG in some cases. When the transistor 162 is off, the node FG can be regarded as being embedded in an insulator and charge is held in the node FG. The off-state current of the transistor 162 including an oxide semiconductor is less than or equal to one hundred thousandth of the off-state current of a transistor including a silicon semiconductor; thus, loss of the charge accumulated in the node FG due to leakage current of the transistor 162 is negligible. That is, with the transistor 162 including an oxide semiconductor, a nonvolatile memory device which can hold data even when power is not supplied can be realized.

For example, when the off-state current of the transistor 162 is 10 zA (1 zA (zeptoampere) is $1 \times 10^{-21}$ A) or lower at room temperature (25° C.) and the capacitance of the capacitor 164 is approximately 10 fF, data can be held for $10^4$ seconds or longer. Needless to say, the holding time depends on transistor characteristics and the capacitance.

In the memory cell included in the semiconductor device of the disclosed invention, a problem of deterioration of a gate insulating layer (a tunnel insulating film), which occurs in a conventional floating-gate transistor, does not exist. That is, deterioration of a gate insulating layer due to injection of electrons into a floating gate, which has been regarded as a problem, can be solved. This means that there is no limit on the number of times of writing in principle. Furthermore, high voltage needed for writing or erasing in a conventional floating-gate transistor is not necessary.

Components such as transistors in the memory cell illustrated in FIG. 5A1 can be regarded as including resistors and capacitors as illustrated in FIG. 5A2. That is, in FIG. 5A2, the transistor 160 and the capacitor 164 are each regarded as including a resistor and a capacitor. R1 and C1 denote the resistance and the capacitance of the capacitor 164, respectively. The resistance R1 corresponds to the resistance of an insulating layer included in the capacitor 164. R2 and C2 denote the resistance and the capacitance of the transistor 160, respectively. The resistance R2 corresponds to the resistance of a gate insulating layer at the time when the transistor 160 is in an on state. The capacitance C2 corresponds to a so-called gate capacitance (capacitance formed between the gate electrode and the source or drain electrode, and capacitance formed between the gate electrode and a channel formation region).

A charge holding period (also referred to as a data holding period) is determined mainly by the off-state current of the transistor 162 under the conditions where the gate leakage current of the transistor 162 is sufficiently low and the relations R1≥ROS and R2≥ROS are satisfied, where ROS is the resistance (also referred to as effective resistance) between the source electrode and the drain electrode in the case where the transistor 162 is in an off state.

On the other hand, when the conditions are not met, it is difficult to secure a sufficient holding period even if the off-state current of the transistor 162 is low enough. This is because leakage current other than the off-state current of the transistor 162 (e.g., leakage current generated between the source electrode and the gate electrode of the transistor 160) is high. Accordingly, it can be said that the memory cell disclosed in this embodiment preferably satisfies the relations R1≥ROS and R2≥ROS.

It is preferable that C1≥C2 be satisfied. This is because by increasing C1, the potential of the fifth wiring can be efficiently applied to the node FG when the potential of the node FG is controlled by the fifth wiring, and thus the difference between the potentials supplied to the fifth wiring (e.g., a read potential and a non-read potential) can be reduced.

When the above relations are satisfied, a semiconductor device including a more favorable memory cell can be realized. Note that R1 and R2 are controlled by the gate insulating layer of the transistor 160 and the insulating layer of the capacitor 164. The same applies to C1 and C2. Therefore, the material, the thickness, and the like of the gate insulating layer are preferably set as appropriate to satisfy the above relations.

In the semiconductor device described in this embodiment, the node FG has a function similar to that of a floating gate of a floating-gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of factors inhibiting higher integration of the semiconductor device. The factor is attributed to a basic principle of a flash memory, in which tunneling current is generated by application of a high electric field.

In contrast, the memory cell included in the semiconductor device according to this embodiment is operated by switching of a transistor including an oxide semiconductor and does not use the above principle of charge injection by tunneling current. That is, a high electric field for charge injection is not necessary unlike a flash memory. Accordingly, it is not necessary to consider an influence of a high electric field from a control gate on an adjacent cell, which facilitates higher integration.

In addition, there is another advantage over a flash memory in that a high electric field and a large peripheral circuit (such as a booster circuit) are unnecessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where two-level (one-bit) data is written.

In the case where the relative permittivity $\varepsilon r1$ of the insulating layer included in the capacitor 164 is different from the relative permittivity $\varepsilon r2$ of the insulating layer included in the transistor 160, it is easy to satisfy C1≥C2 while satisfying 2·S2≥S1 (preferably S2≥S1), where S1 is the area of the insulating layer included in the capacitor 164 and S2 is the area of the insulating layer forming a gate capacitor of the transistor 160. Specifically, for example, a film including a high-k material such as hafnium oxide or a stack of a film including a high-k material such as hafnium oxide and a film including an oxide semiconductor is used for the insulating layer included in the capacitor 164 so that $\varepsilon r1$ can be 10 or more, preferably 15 or more, and silicon oxide is used for the insulating layer forming the gate capacitor so that $\varepsilon r2$ can be 3 to 4.

Combination of such structures enables higher integration of the memory cell included in the semiconductor device according to the disclosed invention.

Note that in addition to the increase in the integration degree, a multilevel technique can be employed in order to increase the storage capacity of the memory cell included in the semiconductor device. For example, data of three or more levels is written into one memory cell, whereby the storage capacity can be increased as compared to that in the case where two-level (one-bit) data is written. The multilevel technique can be achieved by, for example, giving charge Q to a gate electrode of a first transistor, in addition to the charge $Q_L$ for supply of a low potential and the charge $Q_H$ for supply of a high potential, which are described above.

Since the off-state current of the transistor 162 including an oxide semiconductor in the semiconductor device described in this embodiment is extremely low, stored data can be held for an extremely long time by using the transistor. In other words, power consumption can be sufficiently reduced because refresh operation becomes unnecessary or the frequency of refresh operation can be extremely low. Moreover, stored data can be held for a long time even when power is not supplied (note that a potential is preferably fixed).

In the semiconductor device according to the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

Further, the semiconductor device described in this embodiment does not need high voltage for data writing and there is no problem of element deterioration. For example, unlike a conventional nonvolatile memory, it is not necessary to inject and extract electrons into and from a floating gate, and thus a problem such as deterioration of a gate insulating layer does not occur at all. In other words, the semiconductor device according to the disclosed invention does not have a limit on the number of times of rewriting which is a problem in a conventional nonvolatile memory, and reliability thereof is drastically improved. Furthermore, data is written by turning on or off the transistor, whereby high-speed operation can be easily realized.

Since a transistor including a material other than an oxide semiconductor can operate at sufficiently high speed, a semiconductor device in which the transistor is used in combination with a transistor including an oxide semiconductor can perform operation (e.g., data reading) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a material other than an oxide semiconductor (a transistor capable of operation at sufficiently high speed, in general) and the transistor including an oxide semiconductor (a transistor whose off-state current is sufficiently low, in general).

The structures, methods, and the like described in this embodiment can be combined as appropriate with any of the structures, methods, and the like described in the other embodiments.

Embodiment 3

In this embodiment, application examples of a semiconductor device according to one embodiment of the disclosed invention will be described with reference to FIGS. 6A to 6C. Here, examples of a memory device will be described. Note that in some circuit diagrams, "OS" is written beside a transistor in order to indicate that the transistor includes an oxide semiconductor.

Figure 6A:
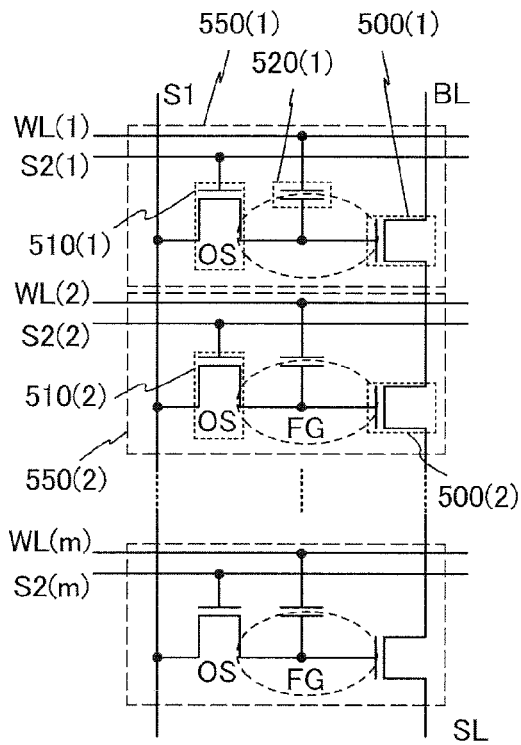
FIGS. 6A to 6C are circuit diagrams of semiconductor devices.
Figure 6B:
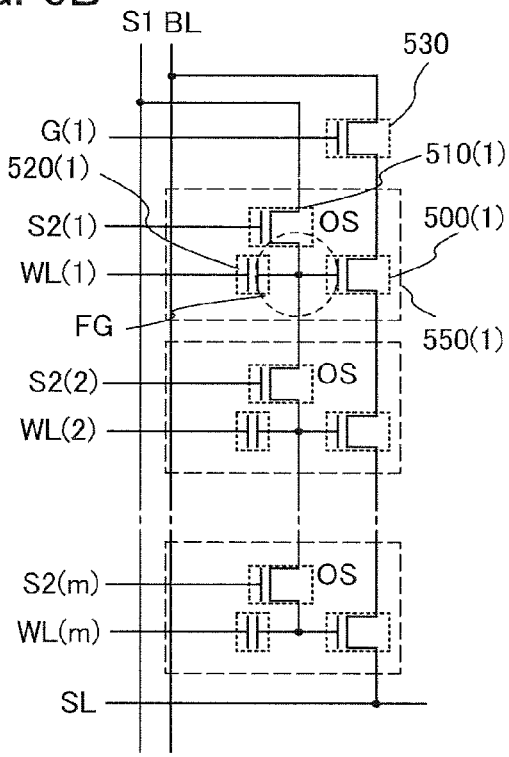
Figure 6C:
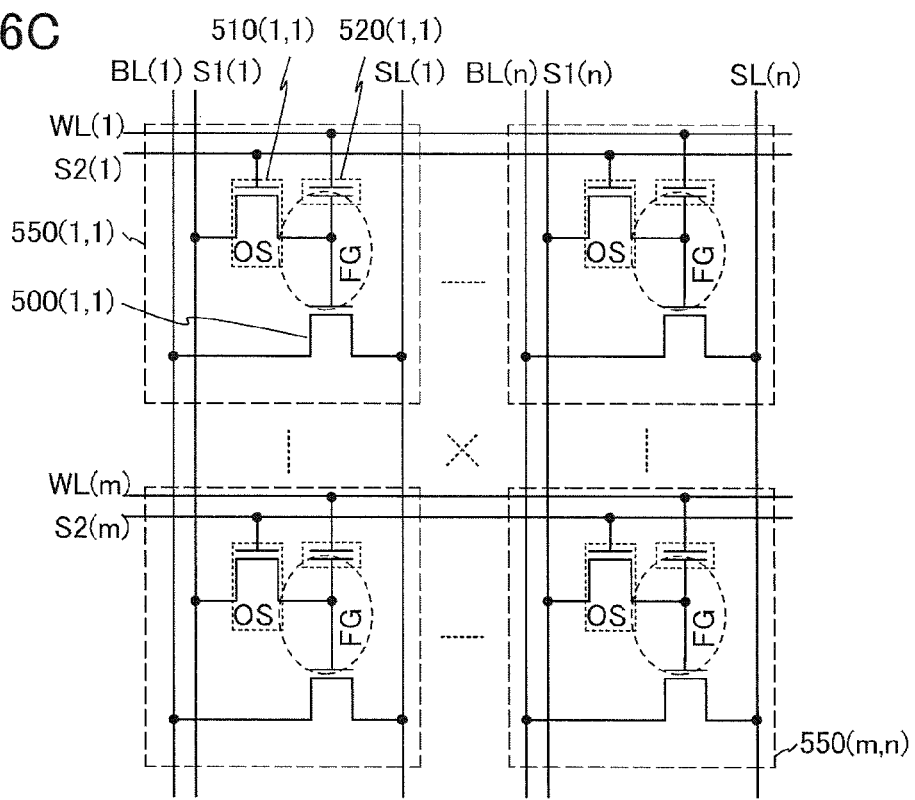

FIGS. 6A to 6C are each a circuit diagram of a semiconductor device, which can be used as a memory device, including a plurality of semiconductor devices (hereinafter also referred to as memory cells) illustrated in FIG. 5A1. FIGS. 6A and 6B are circuit diagrams of so-called NAND semiconductor devices in which memory cells are connected in series, and FIG. 6C is a circuit diagram of a so-called NOR semiconductor device in which memory cells are connected in parallel.

The semiconductor device in FIG. 6A includes a source line SL, a bit line BL, a first signal line S1, m second signal lines S2, m word lines WL, and m memory cells. In FIG. 6A, one source line SL and one bit line BL are provided; however, one embodiment of the disclosed invention is not limited to this. A plurality of source lines SL and a plurality of bit lines BL may be provided.

A memory cell $550(i)$ is considered as a typical example of the memory cells, where is an integer greater than or equal to 1 and less than or equal to m. In the memory cell $550(i)$, a gate electrode of a transistor $500(i)$, a drain electrode (or a source electrode) of a transistor $510(i)$, and one electrode of a capacitor $520(i)$ are electrically connected to each other. The first signal line S1 and the source electrode (or the drain electrode) of the transistor $510(i)$ are electrically connected to each other. The second signal line S2(i) and a gate electrode of the transistor $510(i)$ are electrically connected to each other. The word line WL(i) and the other electrode of the capacitor $520(i)$ are electrically connected to each other.

Further, a drain electrode of the transistor $500(i)$ in the memory cell $550(i)$ is electrically connected to a source electrode of a transistor $500(i-1)$ in an adjacent memory cell $550(i-1)$. A source electrode of the transistor $500(i)$ in the memory cell $550(i)$ is electrically connected to a drain electrode of a transistor $500(i+1)$ in an adjacent memory cell $550(i+1)$. Note that a drain electrode of a transistor $500(1)$ in a memory cell $550(1)$ among the m memory cells connected in series is electrically connected to the bit line BL. In addition, a source electrode of a transistor $500(m)$ in a memory cell $550(m)$ among the m memory cells connected in series is electrically connected to the source line SL.

The transistor $500(1)$ in the memory cell $550(1)$ may be electrically connected to the bit line BL through a selection transistor (not shown). In that case, a selection line $G(1)$ is connected to a gate electrode of the selection transistor. Further, the transistor $500(m)$ in the memory cell $550(m)$ may be electrically connected to the source line SL through a selection transistor (not shown). In that case, a selection line $G(2)$ is connected to a gate electrode of the selection transistor.

In the semiconductor device in FIG. 6A, writing operation and reading operation per row are performed. The writing operation is performed as follows. A potential at which the transistor $510(i)$ is turned on is supplied to the second signal line S2(i) in a row subjected to writing (e.g., the i-th row), so that the transistor $510(i)$ in the row subjected to writing is turned on. Accordingly, the potential of the first signal line S1 is applied to the gate electrode of the transistor $500(i)$ in the specified row, so that predetermined charge is given to the gate electrode. Thus, data can be written into the memory cell of the specified row.

The reading operation is performed as follows. The word lines WL of rows other than the row subjected to reading (e.g., the i-th row) are supplied with a potential at which the transistors $500$ that are not in the row subjected to reading are turned on regardless of charge given to the gate electrode of the transistor $500(i)$, so that the transistors $500$ in the rows other than the row subjected to reading are turned on. Then, the word line WL(i) of the row subjected to reading is supplied with a potential (a reading potential) at which the on state or the off state of the transistor $500(i)$ is selected depending on data to which the charge stored in the gate electrode of the transistor $500(i)$ corresponds. Moreover, a constant potential is supplied to the source line SL so that a reading circuit (not shown) connected to the bit line BL operates. Here, among a plurality of transistors $500(1)$ to $500(m)$ between the source line SL and the bit line BL, all the transistors $500$ except the transistor $500(i)$ in the row subjected to reading is in an on state; therefore, the level of the conductance between the source line SL and the bit line BL is determined by the state (the on state or the off state) of the transistor $500(i)$ in the row subjected to reading. The state (the on state or the off state) of the transistor $500(i)$ differs depending on data to which the charge stored in the gate electrode of the transistor $500(i)$ in the row subjected to reading corresponds; thus, the potential of the bit line BL varies accordingly. By reading the potential of the bit line BL with the reading circuit, data can be read out from the memory cell of the specified row.

However, fluctuation in the threshold voltage of a transistor (e.g., the transistor $500(i)$) included in the memory cell may cause fluctuation in potentials needed for driving the plurality of memory cells (such a potential is also referred to as the threshold voltage of a memory cell). For example, fluctuation in the threshold voltage of the transistor $500(i)$ may cause fluctuation in the threshold voltages of the memory cells in data reading. Therefore, the operation voltages of the plurality of memory cells are each set to have a certain range in consideration of the variation in the threshold voltages of the memory cells. This has limited a reduction in the operation voltages of the memory cells.

In the semiconductor device according to one embodiment of the disclosed invention, writing, reading, and verifying are performed while the write potential is sequentially changed to another potential as shown in FIG. 1, FIGS. 2A to 2D, FIGS. 3A to 3D, and FIGS. 4A and 4B; thus, the write potentials for the plurality of memory cells are determined. Accordingly, a semiconductor device in which, by reducing variation (distribution width) in the threshold voltages of memory cells after writing, the operation voltage can be reduced, the storage capacity can be increased, or operation such as writing, holding, or reading can be surely performed can be provided. In addition, a method for driving the semiconductor device can be provided.

Note that the first signal line S1 illustrated in FIG. 6A corresponds to the second signal line 222 illustrated in FIG. 1. The bit line BL illustrated in FIG. 6A corresponds to the third signal line 223 illustrated in FIG. 1.

FIG. 6B illustrates a semiconductor device whose configuration is partly different from that in FIG. 6A.

One of differences between the semiconductor device in FIG. 6B and the semiconductor device in FIG. 6A is that the bit line BL and the drain electrode of the transistor 500(1) in the memory cell 550(1) are electrically connected to each other through a selection transistor 530 in the semiconductor device in FIG. 6B. A gate electrode of the selection transistor 530 is electrically connected to the selection line G(1) for switching between the on and off states of the selection transistor 530.

Another difference between the semiconductor device in FIG. 6B and the semiconductor device in FIG. 6A is that the source electrode (or the drain electrode) of the transistor 510 in each memory cell is connected to the first signal line S1 in the semiconductor device in FIG. 6A, whereas the transistors 510 in the memory cells are connected in series in the semiconductor device in FIG. 6B. That is, the source electrode of the transistor 510(*i*) in the memory cell 550(*i*) is electrically connected to a drain electrode of a transistor 510(*i*−1) in the adjacent memory cell 550(*i*−1). The drain electrode of the transistor 510(*i*) in the memory cell 550(*i*) is electrically connected to a source electrode of a transistor 510(*i*+1) in the adjacent memory cell 550(*i*+1). Note that the source electrode of the transistor 510(1) in the memory cell 550(1) among the m memory cells connected in series is electrically connected to the first signal line S1. Moreover, in each of the memory cells connected in series, the drain electrode (or the source electrode) of the transistor 510 is electrically connected to the gate electrode of the transistor 500 and one electrode of the capacitor 520 as in the semiconductor device in FIG. 6A.

The configuration of other portions of the semiconductor device in FIG. 6B is similar to that of the semiconductor device in FIG. 6A; therefore, the above description can be referred to for the details.

Note that the first signal line S1 and the bit line BL are separately provided in the semiconductor device in FIG. 6B; however, the disclosed invention is not limited to this. The first signal line S1 and the bit line BL may be one wiring.

In the semiconductor device in FIG. 6B, writing operation and reading operation per row are performed. The writing operation is performed as follows.

The writing operation is sequentially performed every row from the m-th row. In order to perform writing on the i-th row (*i*=1 to m), a potential at which the transistor 510(*i*) is turned on is supplied to the second signal line S2(*i*) in the row (the i-th row) subjected to writing, so that the transistor 510(*i*) in the row subjected to writing is turned on. Here, in the case where the transistors 510(1) to 510(*i*−1) are placed between the transistor (i) and the first signal line S1, the transistors 510(1) to 510(*i*−1) in the rows that precede the row subjected to writing are turned on so that the potential of the first signal line S1 is applied to the memory cell 550(*i*) of the row subjected to writing. Accordingly, the potential of the first signal line S1 is supplied to the gate electrode of the transistor 500(*i*) in the specified row, so that predetermined charge is given to the gate electrode. Then, the potential of the second signal line S2(*i*) is fixed at GND, so that charge accumulated in the gate electrode of the transistor 500(*i*) is held. Thus, data can be written into the memory cell of the specified row (the i-th row).

Note that in the semiconductor device in FIG. 6B, since the transistors 510 included in the memory cells 550 are connected in series, it is difficult to rewrite data only in a given row. Therefore, operation for erasing data in a plurality of rows at once is preferably performed. For example, erasing per block is preferably performed, dividing the first to m-th rows into blocks. In order to rewrite data in a predetermined block, it is preferable that data in the block be erased first, and then data writing be sequentially performed from the m-th row. Note that in the case where data in a row on which writing has just been performed is rewritten, erasing operation is unnecessary.

The reading operation is performed as follows. First, the selection transistor is turned on by supply of a potential to the selection line G(1). Note that in the case where there are a selection transistor connected to the selection line G(1) and a selection transistor connected to the selection line G(2), the two transistors are turned on. Moreover, the word lines WL of rows other than the row (e.g., the i-th row) subjected to reading are supplied with a potential at which the transistors 500 that are not in the row subjected to reading are turned on regardless of charge given to the gate electrode of the transistor 500(*i*), so that the transistors 500 in the rows other than the row subjected to reading are turned on. Then, the word line WL(i) of the row subjected to reading is supplied with a potential (a reading potential) at which the on state or the off state of the transistor 500(*i*) is selected depending on data to which the charge stored in the gate electrode of the transistor 500(*i*) corresponds. Moreover, a constant potential is supplied to the source line SL so that a reading circuit (not shown) connected to the bit line BL operates. Here, among the plurality of transistors 500(1) to 500(*m*) between the source line SL and the bit line BL, all the transistors 500 except the transistor 500(*i*) in the row subjected to reading is in an on state; therefore, the level of the conductance between the source line SL and the bit line BL is determined by the state (the on state or the off state) of the transistor 500(*i*) in the row subjected to reading. The state (the on state or the off state) of the transistor 500(*i*) differs depending on data to which the charge stored in the gate electrode of the transistor 500(*i*) in the row subjected to reading corresponds; thus, the potential of the bit line BL varies accordingly. By reading the potential of the bit line BL with the reading circuit, data can be read from the memory cell of the specified row.

Also in the semiconductor device illustrated in FIG. 6B, writing, reading, and verifying are performed while the write potential is sequentially changed to another potential as shown in FIG. 1, FIGS. 2A to 2D, FIGS. 3A to 3D, and FIGS. 4A and 4B; thus, the write potentials for the plurality of memory cells are determined. Accordingly, a semiconductor device in which, by reducing variation (distribution width) in the threshold voltages of memory cells after writing, the operation voltage can be reduced, the storage capacity can be increased, or operation such as writing, holding, or reading can be surely performed can be provided. In addition, a method for driving the semiconductor device can be provided.

Note that the first signal line S1 illustrated in FIG. 6B corresponds to the second signal line 222 illustrated in FIG. 1. The bit line BL illustrated in FIG. 6B corresponds to the third signal line 223 illustrated in FIG. 1.

The semiconductor device in FIG. 6C includes n source lines SL, n bit lines BL, n first signal lines S1, m second signal lines S2, m word lines WL, and a plurality of memory cells 550(1,1) to 550(m,n).

A memory cell 550(i,j) is considered as a typical example of the memory cells, where i is an integer greater than or equal to 1 and less than or equal to m and j is an integer greater than or equal to 1 and less than or equal to n. In the memory cell 550(i,j) a gate electrode of a transistor 500(i,j), a drain electrode (or a source electrode) of a transistor 510(i,j), and one electrode of a capacitor 520(i,j) are electrically connected to each other. The source line SL(j) and a source electrode of the transistor 500(i,j) are electrically connected to each other. The bit line BL(j) and a drain electrode of the transistor 500(i,j) are electrically connected to each other. The first signal line S1(j) and the source electrode (or the drain electrode) of the transistor 510(i,j) are electrically connected to each other. The second signal line S2(i) and a gate electrode of the transistor 510(i,j) are electrically connected to each other. The word line WL(i) and the other electrode of the capacitor 520(i,j) are electrically connected to each other.

In the semiconductor device in FIG. 6C, writing operation and reading operation per row are performed. The writing operation is performed in the same manner as that in the semiconductor device in FIG. 6A. The reading operation is performed as follows. First, the word lines WL of rows other than a row subjected to reading (e.g., the i-th row having the memory cells 550(i,1) to 550(i,n)) are supplied with a potential at which the transistors 500 that are not in the row subjected to reading are turned off regardless of data to which charge given to gate electrodes of the transistors 500(i,1) to 500(i,n) corresponds, so that the transistors 500 in the rows other than the row subjected to reading are turned off. Then, the word line WL(i) of the row subjected to reading is supplied with a potential (a reading potential) at which the on state or the off state of the transistors 500(i,1) to 500(i,n) is selected depending on data to which the charge stored in the gate electrodes of the transistors 500(i,1) to 500(i,n) corresponds. Moreover, a constant potential is supplied to the source line SL(j) so that a reading circuit (not shown) connected to the bit line BL(j) operates. Here, the level of the conductance between the source line SL(j) and the bit line BL(j) is determined by the state (the on state or the off state) of the transistors 500(i,1) to 500(i,n) in the row subjected to reading. That is, the potential of the bit line BL(j) differs depending on data to which the charge stored in the gate electrodes of the transistors 500(i,1) to 500(i,n) in the row subjected to reading corresponds. By reading the potential of the bit line BL(j) with the reading circuit, data can be read from the memory cell of the specified row.

Also in the semiconductor device illustrated in FIG. 6C, writing, reading, and verifying are performed while the write potential is sequentially changed to another potential as shown in FIG. 1, FIGS. 2A to 2D, FIGS. 3A to 3D, and FIGS. 4A and 4B; thus, the write potentials for the plurality of memory cells are determined. Accordingly, a semiconductor device in which, by reducing variation (distribution width) in the threshold voltages of memory cells after writing, the operation voltage can be reduced, the storage capacity can be increased, or operation such as writing, holding, or reading can be surely performed can be provided. In addition, a method for driving the semiconductor device can be provided.

Note that the first signal line S1(j) illustrated in FIG. 6C corresponds to the second signal line 222 illustrated in FIG. 1. The bit line BL(j) illustrated in FIG. 6C corresponds to the third signal line 223 illustrated in FIG. 1.

Although the amount of data which can be held in each of the memory cells 550 is one bit in the above description, the structure of the semiconductor device of this embodiment is not limited to this. The amount of data which can be held in each of the memory cells 550 may be increased by preparing three or more potentials to be applied to the gate electrode of the transistor 500 in writing. For example, in the case where the number of potentials to be applied to the gate electrode of the transistor 500 in writing is four, data of two bits can be held in each of the memory cells.

In FIGS. 6A to 6C, the first signal line S1(j) and the bit line BL(j) may be one wiring. When one wiring serves as both the first signal line S1(j) and the bit line BL(j), the number of wirings can be reduced.

In the semiconductor device according to the disclosed invention, even when the threshold voltage of a transistor included in a memory cell fluctuates, variation (distribution width) in the threshold voltages of the plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 4

In this embodiment, a structure and a manufacturing method of a memory cell included in a semiconductor device according to one embodiment of the disclosed invention will be described with reference to FIGS. 7A and 7B, FIGS. 8A to 8D, FIGS. 9A to 9D, FIGS. 10A to 10D, and FIGS. 11A and 11B.

<Cross-Sectional Structure and Plan View of Memory Cell>

Figure 7A:
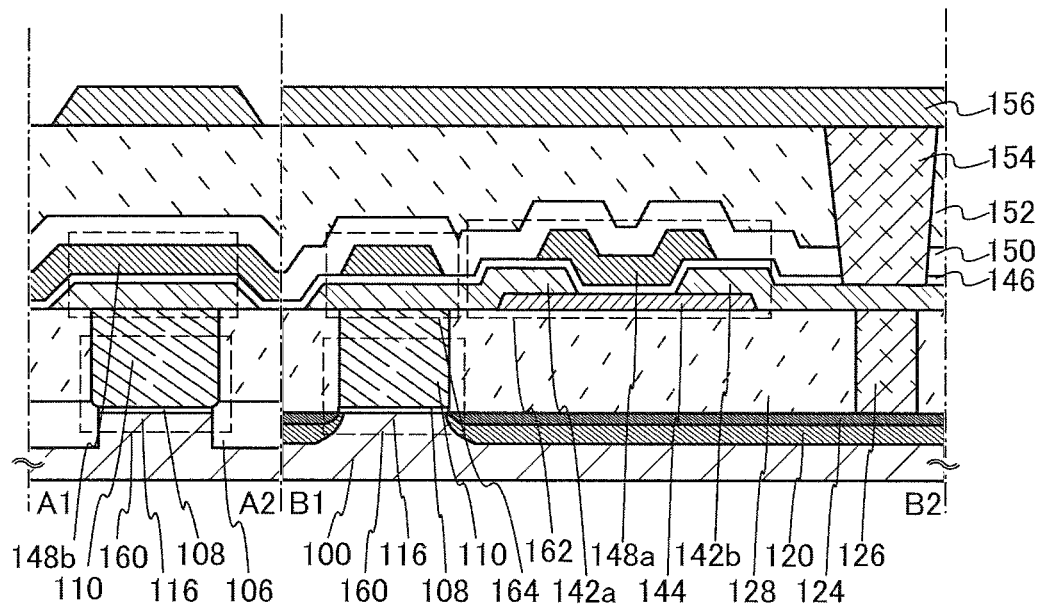
FIGS. 7A and 7B are a cross-sectional view and a plan view of a memory cell included in a semiconductor device.
Figure 7B:
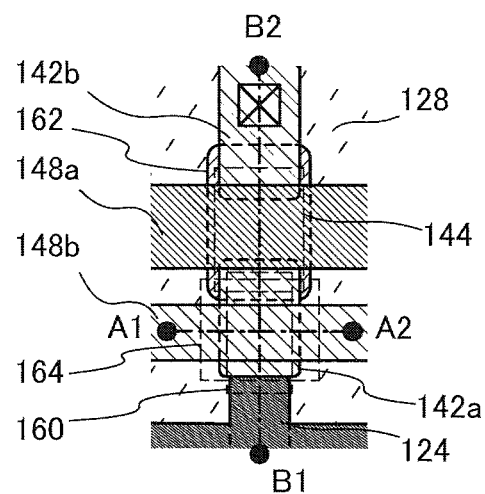

FIGS. 7A and 7B illustrate an example of a structure of a memory cell included in a semiconductor device. FIG. 7A illustrates a cross section of the memory cell included in the semiconductor device, and FIG. 7B illustrates a plan view of the memory cell included in the semiconductor device. In FIG. 7A, A1-A2 is a cross section perpendicular to a channel length direction of a transistor, and B1-B2 is a cross section parallel to the channel length direction of the transistor. The semiconductor device illustrated in FIGS. 7A and 7B includes the transistor 160 including a first semiconductor material in a lower portion, and the transistor 162 including a second semiconductor material in an upper portion. FIGS. 7A and 7B illustrate the semiconductor device including one transistor 160, one transistor 162, and one capacitor 164; alternatively, the semiconductor device may include a plurality of transistors 160, transistors 162, and capacitors 164.

Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like, and a single crystal semiconductor is preferably used. Alternatively, an organic semiconductor material or the like may be used. A transistor including such a semiconductor material can operate at high speed easily. On the other hand, a transistor including an oxide semiconductor can hold charge for a long time owing to its characteristics.

Either an n-channel transistor or a p-channel transistor can be employed as the transistor 160 and the transistor 162. Here, the case where the transistor 160 and the transistor 162 are both n-channel transistors is described. Since the technical feature of one embodiment of the present invention is to use a semiconductor material like an oxide semiconductor, which can sufficiently reduce off-state current, for the transistor 162 in order to hold data, it is not necessary to limit specific conditions such as a structure or a material of the semiconductor device to those given here.

The transistor 160 includes a channel formation region 116 provided in a substrate 100 including a semiconductor material (e.g., silicon), impurity regions 120 (also referred to as a source region and a drain region) provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that FIGS. 7A and 7B illustrate an element in which distinct source and drain electrodes are not provided; such an element is sometimes referred to as a transistor for the sake of convenience. Further, in such a case, in description of connection of a transistor, a source region and a source electrode may be collectively referred to as a "source electrode," and a drain region and a drain electrode may be collectively referred to as a "drain electrode". That is, in this specification, the term "source electrode" may include a source region.

An electrode 126 is connected to part of the metal compound region 124 of the transistor 160. Here, the electrode 126 functions as a source electrode or a drain electrode of the transistor 160. Further, an element isolation insulating layer 106 is provided on the substrate 100 so as to surround the transistor 160, and an insulating layer 128 is provided on the transistor 160. Note that it is preferable that the transistor 160 do not have a sidewall insulating layer as illustrated in FIGS. 7A and 7B to realize high integration. On the other hand, in the case where characteristics of the transistor 160 are emphasized, a sidewall insulating layer may be provided on a side surface of the gate electrode 110 and the impurity regions 120 may include an impurity region having a different impurity concentration in a region overlapping with the sidewall insulating layer.

The transistor 162 includes an oxide semiconductor layer 144 provided over the insulating layer 128 and the like; a source or drain electrode 142a and a source or drain electrode 142b which are electrically connected to the oxide semiconductor layer 144; a gate insulating layer 146 covering the oxide semiconductor layer 144, the source or drain electrode 142a, and the source or drain electrode 142b; and a gate electrode 148a provided over the gate insulating layer 146 so as to overlap with the oxide semiconductor layer 144.

Here, it is preferable that the oxide semiconductor layer 144 used for the transistor 162 be highly purified by sufficient removal of impurities such as hydrogen and sufficient supply of oxygen. The hydrogen concentration of the oxide semiconductor layer 144 is $5\times10^{19}$ atoms/cm$^3$ or lower, preferably $5\times10^{18}$ atoms/cm$^3$ or lower, further preferably $5\times10^{17}$ atoms/cm$^3$ or lower, for example. Note that the hydrogen concentration of the oxide semiconductor layer 144 is measured by secondary ion mass spectrometry (SIMS). In the oxide semiconductor layer 144 which is highly purified by sufficiently reducing the hydrogen concentration and in which defect levels in the energy gap due to oxygen deficiency are reduced by sufficiently supplying oxygen, the carrier concentration is lower than $1\times10^{12}$/cm$^3$, preferably lower than $1\times10^{11}$/cm$^3$, further preferably lower than $1.45\times10^{10}$/cm$^3$. For example, the off-state current (here, current per micrometer (μm) of a channel width) at room temperature (25° C.) is lower than or equal to 100 zA (1 zA (zeptoampere) is $1\times10^{-21}$ A), preferably lower than or equal to 10 zA. Thus, the transistor 162 can have extremely excellent off-state current characteristics by using the i-type (intrinsic) or substantially i-type oxide semiconductor layer 144.

Although the oxide semiconductor layer which is processed into an island shape is used in the transistor 162 in order to suppress leakage current generated between elements due to miniaturization, an oxide semiconductor layer which is not processed into an island shape may be used. In the case where the oxide semiconductor layer is not processed into an island shape, contamination of the oxide semiconductor layer due to etching in the processing can be prevented.

The capacitor 164 includes the source or drain electrode 142a, the gate insulating layer 146, and a conductive layer 148b. That is, the source or drain electrode 142a functions as one electrode of the capacitor 164, and the conductive layer 148b functions as the other electrode of the capacitor 164. With such a structure, capacitance can be sufficiently secured. Further, insulation between the source or drain electrode 142a and the conductive layer 148b can be sufficiently secured by stacking the oxide semiconductor layer 144 and the gate insulating layer 146. In the case where a capacitor is not needed, the capacitor 164 may be omitted.

Note that in the transistor 162 and the capacitor 164, end portions of the source or drain electrode 142a and the source or drain electrode 142b are preferably tapered. The end portions of the source or drain electrode 142a and the source or drain electrode 142b are tapered, so that coverage with the gate insulating layer 146 can be improved and disconnection can be prevented. Here, the taper angle is greater than or equal to 30° and less than or equal to 60°, for example. Note that the taper angle refers to an inclination angle formed with a side surface and a bottom surface of a layer having a tapered shape (e.g., the source or drain electrode 142a) when seen from a direction perpendicular to a cross section (a plane perpendicular to a surface of a substrate) of the layer.

An insulating layer 150 and an insulating layer 152 are provided over the transistor 162 and the capacitor 164. An electrode 154 is provided in an opening formed in the gate insulating layer 146, the insulating layer 150, the insulating layer 152, and the like, and a wiring 156 is formed over the insulating layer 152 to be connected to the electrode 154. Note that although the metal compound region 124, the source or drain electrode 142b, and the wiring 156 are connected to one another through the electrode 126 and the electrode 154 in FIG. 7A, one embodiment of the present invention is not limited this. For example, the source or drain electrode 142b may be directly in contact with the metal compound region 124. Alternatively, the wiring 156 may be directly in contact with the source or drain electrode 142b.

In FIGS. 7A and 7B, the electrode 126 connecting the metal compound region 124 to the source or drain electrode 142b and the electrode 154 connecting the source or drain electrode 142b to the wiring 156 overlap with each other. In other words, a region in which the electrode 126 functioning as a source electrode or a drain electrode of the transistor 160 is in contact with the source or drain electrode 142b of the transistor 162 overlaps with a region in which the source or drain electrode 142b of the transistor 162 is in contact with the electrode 154. With such a planar layout, an increase in the element area due to a contact region can be suppressed. In other words, the integration degree of the semiconductor device can be increased.

In FIGS. 7A and 7B, the transistor 160 and the transistor 162 are provided so as to overlap at least partly with each other. In addition, the transistor 162 and the capacitor 164 are provided so as to overlap with the transistor 160. For example, the conductive layer 148b of the capacitor 164 is provided to overlap at least partly with the gate electrode 110 of the transistor 160. With such a planar layout, higher integration can be achieved. For example, given that the minimum feature size is F, the area occupied by a memory cell can be $15F^2$ to $25F^2$.

<Method for Manufacturing Memory Cell Included in Semiconductor Device>

Next, an example of a method for manufacturing the memory cell included in the semiconductor device will be described. First, a method for manufacturing the transistor 160 in the lower portion will be described below with reference to FIGS. 8A to 8D and FIGS. 9A to 9D; then a method for manufacturing the transistor 162 and the capacitor 164 in the upper portion will be described with reference to FIGS. 10A to 10D and FIGS. 11A and 11B.

<Method for Manufacturing Transistor in Lower Portion>

A method for manufacturing the transistor 160 in the lower portion will be described with reference to FIGS. 8A to 8D and FIGS. 9A to 9D.

First, the substrate 100 including a semiconductor material is prepared. As the substrate including a semiconductor material, a single crystal semiconductor substrate of silicon, silicon carbide, or the like; a polycrystalline semiconductor substrate; a compound semiconductor substrate of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer positioned therebetween.

As the substrate 100 including a semiconductor material, a single crystal semiconductor substrate of silicon or the like is preferably used because the speed of reading operation of the semiconductor device can be increased.

Figure 8A:
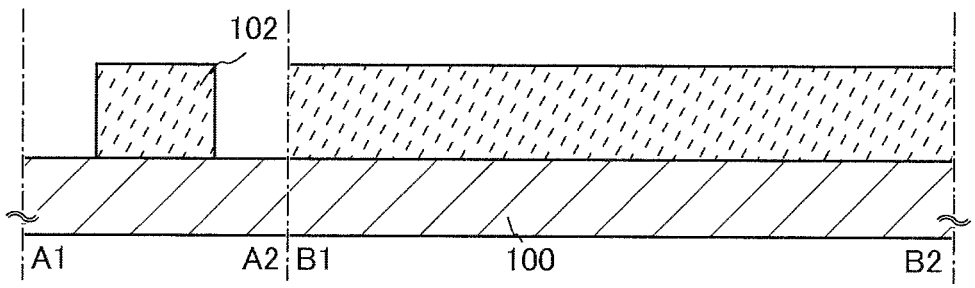
FIGS. 8A to 8D are cross-sectional views illustrating a manufacturing process of a semiconductor device.
Figure 8B:
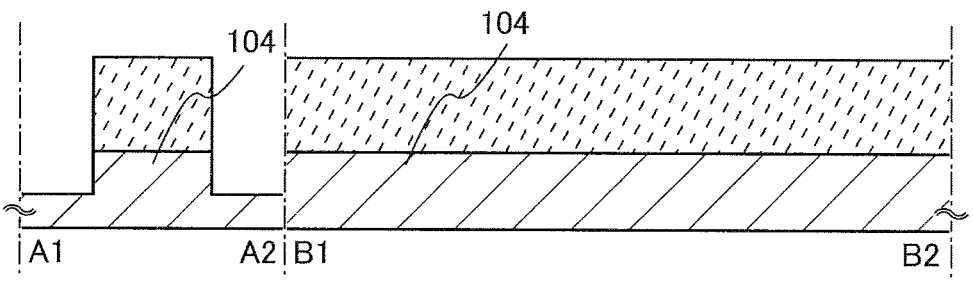

Over the substrate 100, a protective layer 102 serving as a mask for forming an element isolation insulating layer is formed (see FIG. 8A). As the protective layer 102, for example, an insulating layer formed using silicon oxide, silicon nitride, silicon oxynitride, or the like can be used. Note that before or after this step, an impurity element imparting n-type conductivity or an impurity element imparting p-type conductivity may be added to the substrate 100 in order to control the threshold voltage of the transistor. In the case where silicon is used as the semiconductor, phosphorus, arsenic, or the like can be used as the impurity element imparting n-type conductivity. Boron, aluminum, gallium, or the like can be used as the impurity element imparting p-type conductivity, for example.

Next, part of the substrate 100 in a region that is not covered with the protective layer 102 (in an exposed region) is removed by etching with the use of the protective layer 102 as a mask. Thus, a semiconductor region 104 isolated from the other semiconductor regions is formed (see FIG. 8B). As the etching, dry etching is preferably performed, but wet etching may be performed. An etching gas and an etchant can be selected as appropriate in accordance with a material to be etched.

Figure 8C:
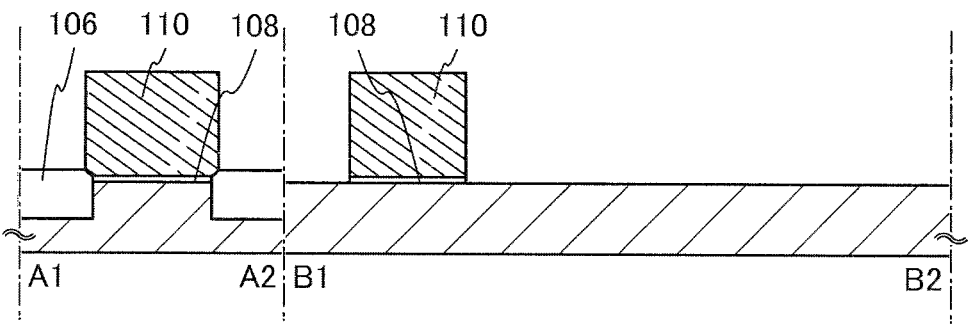

Then, an insulating layer is formed so as to cover the semiconductor region 104, and the insulating layer in a region overlapping with the semiconductor region 104 is selectively removed, so that the element isolation insulating layer 106 is formed (see FIG. 8C). The insulating layer is formed using silicon oxide, silicon nitride, silicon oxynitride, or the like. As a method for removing the insulating layer, any of etching treatment, polishing treatment such as chemical mechanical polishing (CMP), and the like may be employed. Note that the protective layer 102 is removed after the formation of the semiconductor region 104 or after the formation of the element isolation insulating layer 106.

Here, the CMP treatment is treatment for planarizing a surface of an object to be processed by a combination of chemical and mechanical actions with the use of the surface as a reference. Specifically, the CMP treatment is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

Note that as a method for forming the element isolation insulating layer 106, a method in which an insulating region is formed by introduction of oxygen, or the like can be used instead of the method in which the insulating layer is selectively removed.

Next, an insulating layer is formed over a surface of the semiconductor region 104, and a layer including a conductive material is formed over the insulating layer.

The insulating layer is to be a gate insulating layer later and can be formed by performing heat treatment (such as thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, hydrogen, and the like. Needless to say, the insulating layer may be formed by a chemical vapor deposition ("CVD") method, a sputtering method, or the like. The insulating layer preferably has a single-layer structure or a stacked structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate (HfAl$_x$O$_y$ (x>0, y>0)) to which nitrogen is added, and the like. The thickness of the insulating layer can be, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, or a spin coating method can be employed. Note that an example in which the layer including a conductive material is formed using a metal material is described in this embodiment.

After that, the insulating layer and the layer including a conductive material are selectively etched, so that the gate insulating layer 108 and the gate electrode 110 are formed (see FIG. 8C).

Figure 8D:
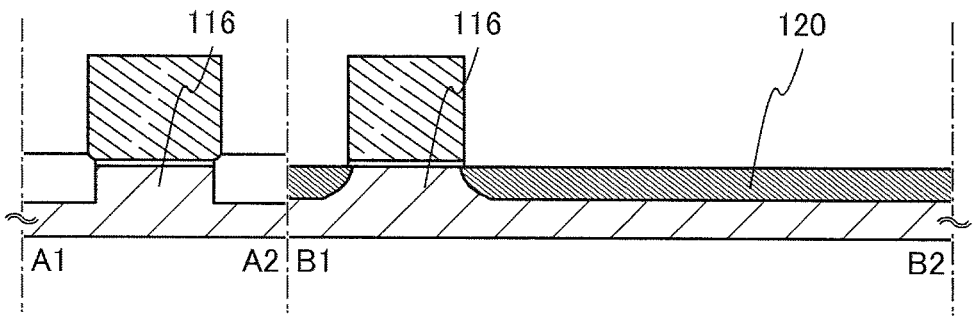

Then, phosphorus (P), arsenic (As), or the like is added to the semiconductor region 104, so that the channel formation region 116 and the impurity regions 120 are formed (see FIG. 8D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably high when a semiconductor element is highly miniaturized.

Note that a sidewall insulating layer may be formed in the periphery of the gate electrode 110, and an impurity region to which an impurity element is added at a different concentration may be formed.

Figure 9A:
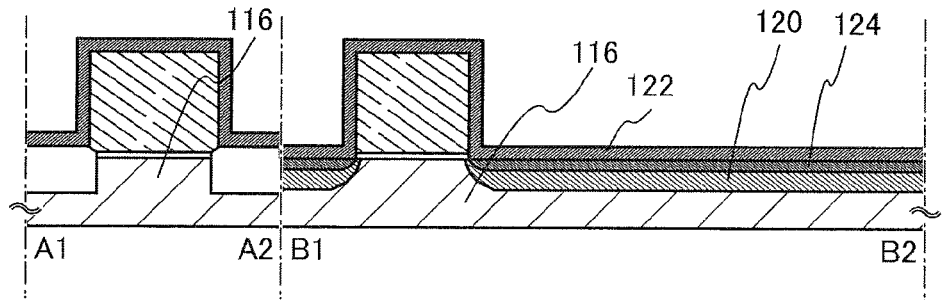
FIGS. 9A to 9D are cross-sectional views illustrating a manufacturing process of a semiconductor device.

Then, a metal layer 122 is formed so as to cover the gate electrode 110, the impurity regions 120, and the like (see FIG. 9A). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to form a low-resistance metal compound. Examples of such a metal material include titanium, tantalum, tungsten, nickel, cobalt, and platinum.

Next, heat treatment is performed so that the metal layer 122 reacts with the semiconductor material. Thus, the metal compound regions 124 which are in contact with the impurity regions 120 are formed (see FIG. 9A). Note that in the case where the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Needless to say, another heat treatment method may be used; however, a method by which heat treatment for an extremely short time can be achieved is preferably used in order to improve the controllability of chemical reaction in formation of the metal compound. Note that the metal compound regions are formed by reaction between the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 9B:
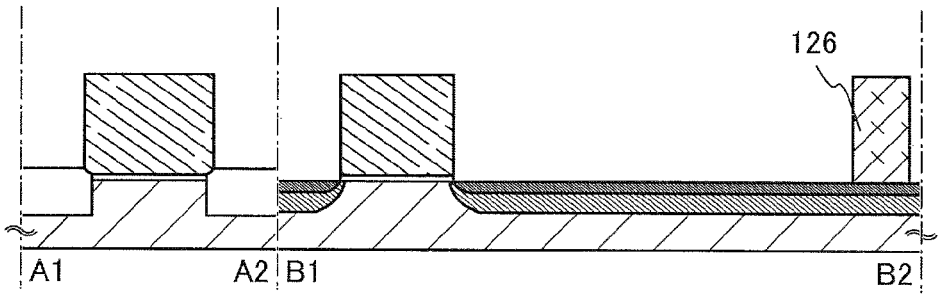

Next, the electrode 126 is formed in a region in contact with part of the metal compound region 124 (see FIG. 9B). The electrode 126 is formed by, for example, forming a layer including a conductive material and then selectively etching the layer. The layer including a conductive material can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, or a spin coating method can be employed.

Figure 9C:
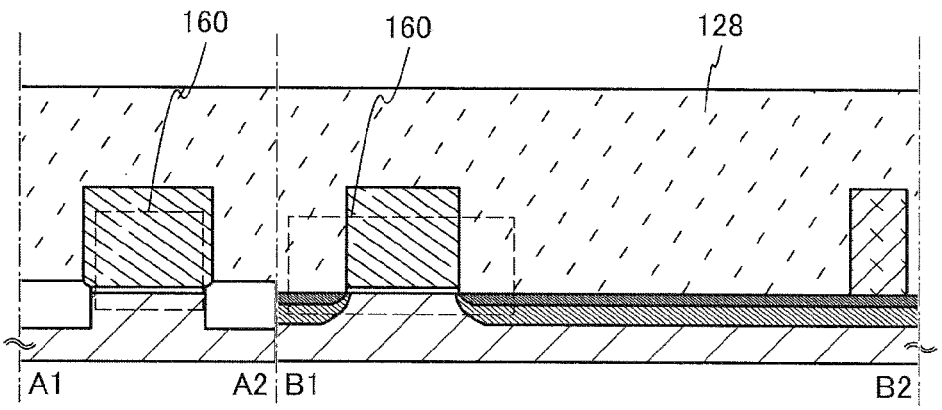

Then, the insulating layer 128 is formed so as to cover the components formed in the above steps (see FIG. 9C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance due to overlap of electrodes or wirings can be sufficiently reduced. Note that the insulating layer 128 may be a porous insulating layer formed using any of those materials. Since a porous insulating layer has a lower dielectric constant than a dense insulating layer, capacitance due to electrodes or wirings can be further reduced. Further, the insulating layer 128 can be formed using an organic insulating material such as polyimide or acrylic. Note that although the insulating layer 128 has a single-layer structure here, one embodiment of the present invention is not limited to this. The insulating layer 128 may have a stacked structure including two or more layers. In the case of a three-layer structure, for example, a stacked structure of a silicon oxynitride layer, a silicon nitride oxide layer, and a silicon oxide layer can be employed.

Note that the electrode 126 can be formed so as to fill an opening which is formed in the insulating layer 128 to reach the metal compound region 124 after the formation of the insulating layer 128.

In that case, it is possible to use a method, for example, in which a thin titanium film is formed in a region including the opening by a physical vapor deposition ("PVD") method and a thin titanium nitride film is formed by a CVD method, and then a tungsten film is formed so as to be embedded in the opening. Here, the titanium film formed by a PVD method has a function of reducing an oxide film (such as a natural oxide film) formed on a surface over which the titanium film is formed, thereby lowering the contact resistance with a lower electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 160 is formed with the use of the substrate 100 including a semiconductor material (see FIG. 9C). A feature of the transistor 160 is that it can operate at high speed. Thus, when the transistor is used as a reading transistor, data can be read at high speed.

Figure 9D:
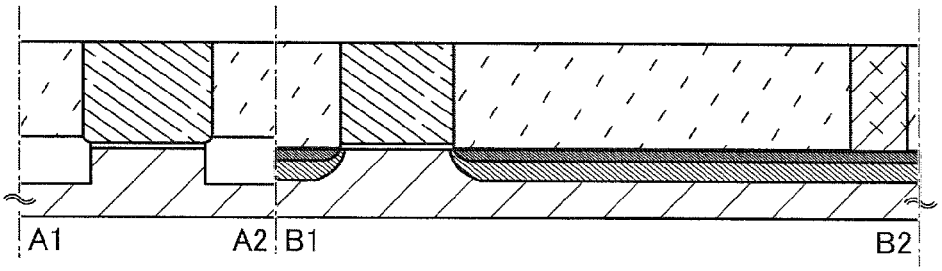

Then, as pretreatment for formation of the transistor 162 and the capacitor 164, CMP treatment is performed on the insulating layer 128 so that top surfaces of the gate electrode 110 and the electrode 126 are exposed (see FIG. 9D). As the treatment for exposing the top surfaces of the gate electrode 110 and the electrode 126, etching treatment or the like can also be employed instead of CMP treatment; in order to improve characteristics of the transistor 162, the surface of the insulating layer 128 is preferably made as flat as possible.

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, whereby a highly integrated semiconductor device can be realized.

<Method for Manufacturing Transistor in Upper Portion>

Next, a method for manufacturing the transistor 162 and the capacitor 164 in the upper portion will be described with reference to FIGS. 10A to 10D and FIGS. 11A and 11B.

Figure 10A:
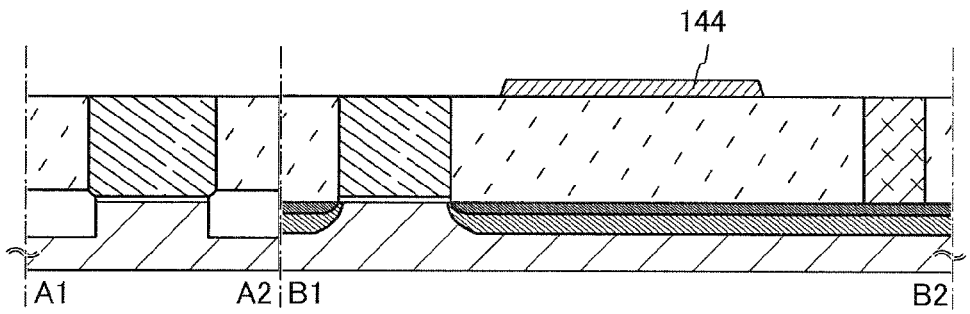
FIGS. 10A to 10D are cross-sectional views illustrating a manufacturing process of a semiconductor device.

First, an oxide semiconductor layer is formed over the gate electrode 110, the electrode 126, the insulating layer 128, and the like and is processed, so that the oxide semiconductor layer 144 is formed (see FIG. 10A). Note that an insulating layer functioning as a base may be provided over the gate electrode 110, the electrode 126, and the insulating layer 128 before the oxide semiconductor layer is formed. The insulating layer can be formed by a PVD method such as a sputtering method, a CVD method such as a plasma CVD method, or the like.

An oxide semiconductor to be used preferably includes at least indium (In) or zinc (Zn). In particular, In and Zn are preferably included. As a stabilizer for reducing fluctuation in electric characteristics of a transistor including the oxide semiconductor, gallium (Ga) is preferably additionally included. Tin (Sn) is preferably included as a stabilizer. Hafnium (Hf) is preferably included as a stabilizer. Aluminum (Al) is preferably included as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be included.

As a material for the oxide semiconductor layer, a four-component metal oxide such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, or In—Hf—Al—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material; or the like can be used. In addition, the above materials may include $SiO_2$. Here, for example, an In—Ga—Zn—O-based material means an oxide film including indium (In), gallium (Ga), and zinc (Zn), and there is no particular limitation on the composition ratio. Further, the In—Ga—Zn—O-based material may include an element other than In, Ga, and Zn.

As the oxide semiconductor, a material expressed as the chemical formula $InMO_3(ZnO)_m$ (m>0, m is not an integer) may be used. Here, M represents one or more metal elements selected from Ga, Al, Fe, Mn, and Co. For example, M can be Ga, Ga and Al, Ga and Mn, Ga and Co, or the like. As the oxide semiconductor, a material expressed as $In_3SnO_5(ZnO)_n$ (n>0, n is an integer) may be used.

For example, an In—Ga—Zn—O-based material with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn—O-based material with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used in accordance with necessary semiconductor characteristics (such as mobility, threshold voltage, and fluctuation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn—O-based material, a high mobility can be relatively easily obtained. However, the mobility can be increased by reducing the defect density in the bulk also in the case of using the In—Ga—Zn—O-based material.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced, and mobility higher than that of an amorphous oxide semiconductor can be obtained by increasing the surface planarity. In order to improve the surface planarity, the oxide semiconductor is preferably formed over a flat surface. Specifically, the oxide semiconductor may be formed over a surface with an average surface roughness (Ra) of 1 nm or less, preferably 0.3 nm or less, further preferably 0.1 nm or less.

Note that, Ra is obtained by expanding, into three dimensions, center line average roughness that is defined by JIS B 0601 so as to be applied to a surface. Ra can be expressed as an "average value of the absolute values of deviations from a reference surface to a designated surface" and is defined by the following formula.

$$Ra = \frac{1}{S_0} \int_{x_2}^{x_1} \int_{y_2}^{y_1} |f(x,y) - Z_0| dx dy \qquad \text{[FORMULA 1]}$$

In the above formula, $S_0$ represents the area of a measurement surface (a rectangular region which is defined by four points represented by coordinates $(x_1,y_1)$, $(x_1,y_2)$, $(x_2,y_1)$, and $(x_2,y_2)$), and $Z_0$ represents the average height of the measurement surface. Ra can be measured using an atomic force microscope (AFM).

In the case where an In—Ga—Zn—O-based material is used as the oxide semiconductor, a target having a composition ratio of $In_2O_3:Ga_2O_3:ZnO=1:x:y$ [molar ratio] (x is 0 or more, y is greater than or equal to 0.5 and less than or equal to 5) is preferably used. For example, a target having a composition ratio of $In_2O_3:Ga_2O_3:ZnO=1:1:2$ [molar ratio] or the like can be used. It is also possible to use a target having a composition ratio of $In_2O_3:Ga_2O_3:ZnO=1:1:1$ [molar ratio] or a target having a composition ratio of $In_2O_3:Ga_2O_3:ZnO=1:1:4$ [molar ratio].

In the case where an In—Zn—O-based material is used as the oxide semiconductor, the composition ratio of a target used is In:Zn=50:1 to 1:2 in an atomic ratio ($In_2O_3:ZnO$=25:1 to 1:4 in a molar ratio), preferably In:Zn=20:1 to 1:1 in an atomic ratio ($In_2O_3:ZnO$=10:1 to 1:2 in a molar ratio), further preferably In:Zn=15:1 to 1.5:1 in an atomic ratio ($In_2O_3:ZnO$=15:2 to 3:4 in a molar ratio). For example, in a target used for formation of an In—Zn—O-based oxide semiconductor which has an atomic ratio of In:Zn:O=X:Y:Z, the relation Z>1.5X+Y is satisfied.

An In—Sn—Zn—O-based material can be referred to as ITZO, and an oxide target having an atomic ratio of In:Sn:Zn=1:2:2, In:Sn:Zn=2:1:3, In:Sn:Zn=1:1:1, In:Sn:Zn=20:45:35, or the like is used for deposition of ITZO.

The thickness of the oxide semiconductor layer is preferably greater than or equal to 3 nm and less than or equal to 30 nm. This is because the transistor might be normally on when the oxide semiconductor layer is too thick (e.g., the thickness is 50 nm or more).

The oxide semiconductor layer is preferably formed by a method with which impurities such as hydrogen, water, a hydroxyl group, or hydride do not easily enter the oxide semiconductor layer. For example, a sputtering method can be used.

In this embodiment, the oxide semiconductor layer is formed by a sputtering method using a target for deposition of an In—Ga—Zn—O-based oxide semiconductor.

The fill rate of the target for deposition of the oxide semiconductor is higher than or equal to 90% and lower than or equal to 100%, preferably higher than or equal to 95% and lower than or equal to 99.9%. With the use of the target for deposition of the oxide semiconductor having high fill rate, a dense oxide semiconductor layer can be formed.

The deposition atmosphere may be a rare gas (typically argon) atmosphere, an oxygen atmosphere, or a mixed atmosphere of a rare gas and oxygen. An atmosphere of a high-purity gas from which impurities such as hydrogen, water, a hydroxyl group, or hydride are sufficiently removed is preferable, in order to prevent hydrogen, water, a hydroxyl group, hydride, or the like from entering the oxide semiconductor layer.

For example, the oxide semiconductor layer can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen, water, a hydroxyl group, or hydride are sufficiently removed is introduced while moisture remaining in the deposition chamber is removed, and the oxide semiconductor layer is formed over the substrate with the use of the above target. In order to remove moisture remaining in the deposition chamber, an entrapment vacuum pump such as a cryopump, an ion pump, or a titanium sublimation pump is preferably used as an evacuation unit. Further, the evacuation unit may be a turbo pump provided with a cold trap. In the deposition chamber which is evacuated with the cryopump, for example, impurities such as hydrogen, water, a hydroxyl group, or hydride (preferably, also a compound including a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (e.g., 100° C. or lower) during deposition, a substance including a hydrogen atom might enter the oxide semiconductor; thus, it is preferable that the substrate be heated at the above temperature. When the oxide semiconductor layer is formed with the substrate heated at the temperature, the substrate temperature is high, so that hydrogen bonds are cut by heat and the substance including a hydrogen atom is less likely to be taken into the oxide semiconductor layer. Therefore, the oxide semiconductor layer is formed with the substrate heated at the above temperature, whereby the concentration of impurities such as hydrogen, water, a hydroxyl group, or hydride in the oxide semiconductor layer can be sufficiently reduced. In addition, damage to the oxide semiconductor layer due to sputtering can be reduced.

An example of deposition conditions is as follows: the distance between the substrate and the target is 60 mm, the pressure is 0.4 Pa, the direct current (DC) power is 0.5 kW, the substrate temperature is 400° C., and the deposition atmosphere is an oxygen atmosphere (the proportion of oxygen flow is 100%). Note that a pulsed direct current power source is preferable because powder substances (also referred to as particles or dust) generated in deposition can be reduced and the distribution of the film thicknesses can be small.

Note that before the oxide semiconductor layer is formed by a sputtering method, powder substances (also referred to as particles or dust) attached to a surface over which the oxide semiconductor layer is formed are preferably removed by reverse sputtering in which an argon gas is introduced and plasma is generated. The reverse sputtering refers to a method in which voltage is applied to a substrate to generate plasma in the vicinity of the substrate so that a surface on the substrate side is modified. Note that instead of argon, a gas such as nitrogen, helium, or oxygen may be used.

The oxide semiconductor layer can be processed by being etched after a mask having a desired shape is formed over the oxide semiconductor layer. The mask can be formed by a method such as photolithography. Alternatively, the mask may be formed by a method such as an ink jet method. For the etching of the oxide semiconductor layer, either dry etching or wet etching may be employed. Needless to say, both of them may be employed in combination.

After that, heat treatment (first heat treatment) may be performed on the oxide semiconductor layer 144. The heat treatment further removes the substance including a hydrogen atom in the oxide semiconductor layer 144; thus, the structure of the oxide semiconductor layer 144 can be improved and defect levels in the energy gap can be reduced. The heat treatment is performed in an inert gas atmosphere at a temperature higher than or equal to 250° C. and lower than or equal to 700° C., preferably higher than or equal to 450° C. and lower than or equal to 600° C. The temperature of the heat treatment is preferably lower than the strain point of the substrate. The inert gas atmosphere is preferably an atmosphere which includes nitrogen or a rare gas (such as helium, neon, or argon) as a main component and does not include water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (i.e., the impurity concentration is 1 ppm or lower, preferably 0.1 ppm or lower).

The heat treatment can be performed in such a manner that, for example, an object to be heated is introduced into an electric furnace in which a resistance heating element or the like is used and heated at 450° C. for one hour in a nitrogen atmosphere. The oxide semiconductor layer 144 is not exposed to the air during the heat treatment so that entry of water or hydrogen can be prevented.

The impurities are reduced by the heat treatment, whereby an i-type (intrinsic) or substantially i-type oxide semiconductor layer is formed. Accordingly, a transistor having extremely excellent characteristics can be realized.

The above heat treatment can be referred to as dehydration treatment, dehydrogenation treatment, or the like because of its effect of removing hydrogen, water, or the like. The heat treatment can be performed at the timing, for example, before the oxide semiconductor layer is processed into an island shape or after the gate insulating layer is formed. Such dehydration treatment or dehydrogenation treatment may be performed once or plural times.

Figure 10B:
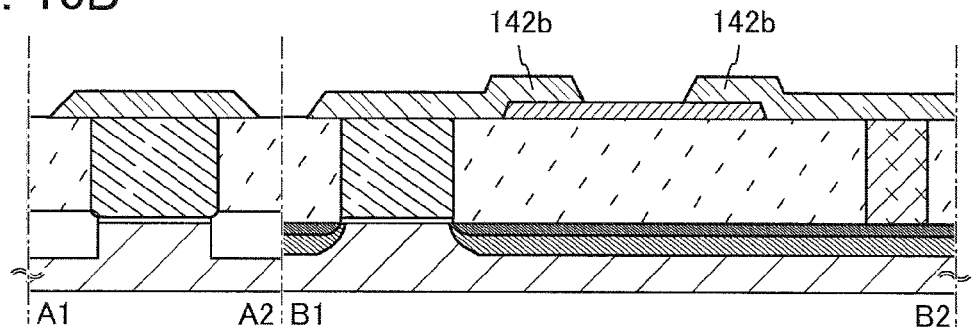

Next, a conductive layer for forming a source electrode and a drain electrode (including a wiring formed in the same layer as the source electrode and the drain electrode) is formed over the oxide semiconductor layer 144 and the like and is processed, so that the source or drain electrode 142a and the source or drain electrode 142b are formed (see FIG. 10B).

The conductive layer can be formed by a PVD method or a CVD method. As a material for the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of any of these elements may be used.

The conductive layer may have a single-layer structure or a stacked structure including two or more layers. For example, the conductive layer can have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, or the like. Note that in the case where the conductive layer has a single-layer structure of a titanium film or a titanium nitride film, there is an advantage in that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials including silicon or silicon oxide can be used.

The conductive layer is preferably etched so that end portions of the source or drain electrode 142a and the source or drain electrode 142b are tapered. Here, the taper angle is preferably greater than or equal to 30° and less than or equal to 60°, for example. The etching is performed so that the end portions of the source or drain electrode 142a and the source or drain electrode 142b are tapered, whereby coverage with the gate insulating layer 146 formed later can be improved and disconnection can be prevented.

The channel length (L) of the transistor in the upper portion is determined by the distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet light whose wavelength is as short as several nanometers to several tens of nanometers. In the light exposure with extreme ultraviolet light, the resolution is high and the focus depth is large. For these reasons, the channel length (L) of the transistor to be formed later can be greater than or equal to 10 nm and less than or equal to 1000 nm (1 μm), and the operation speed of a circuit can be increased. Moreover, miniaturization can lead to lower power consumption of the semiconductor device.

Figure 10C:
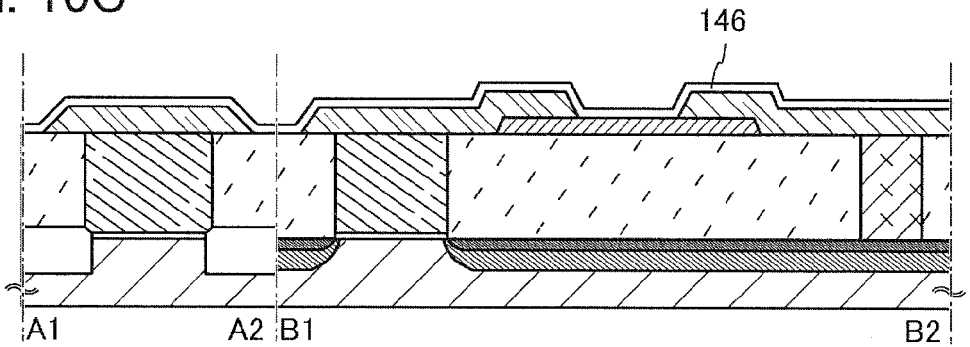

Next, the gate insulating layer 146 is formed so as to cover the source or drain electrode 142a and the source or drain electrode 142b and to be in contact with part of the oxide semiconductor layer 144 (see FIG. 10C).

The gate insulating layer 146 can be formed by a CVD method, a sputtering method, or the like. The gate insulating layer 146 is formed using a material such as silicon oxide, silicon nitride, or silicon oxynitride. Alternatively, the gate insulating layer 146 can be formed using a material including a Group 13 element and oxygen. As the material including a Group 13 element and oxygen, for example, gallium oxide, aluminum oxide, aluminum gallium oxide, or the like can be used. Furthermore, the gate insulating layer 146 may be formed so as to include tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked structure including a combination of any of the above materials. There is no particular limitation on the thickness; however, in the case where the semiconductor device is miniaturized, the thickness is preferably small for securing operation of the transistor. For example, in the case where silicon oxide is used, the thickness can be greater than or equal to 1 nm and less than or equal to 100 nm, preferably greater than or equal to 10 nm and less than or equal to 50 nm.

The gate insulating layer 146 is preferably formed by a method with which impurities such as hydrogen or water do not enter the gate insulating layer 146. This is because, when impurities such as hydrogen or water are included in the gate insulating layer 146, the impurities such as hydrogen or water enter the oxide semiconductor layer or oxygen in the oxide semiconductor layer is extracted by the impurities such as hydrogen or water, so that a back channel of the oxide semiconductor layer might have lower resistance (have n-type conductivity) and a parasitic channel might be formed. Therefore, the gate insulating layer 146 is preferably formed so as to exclude impurities such as hydrogen or water as much as possible. For example, the gate insulating layer 146 is preferably formed by a sputtering method. A high-purity gas from which impurities such as hydrogen or water are removed is preferable as a sputtering gas used for film formation.

Many oxide semiconductor materials that can be used for the oxide semiconductor layer 144 include a Group 13 element. Therefore, in the case where the gate insulating layer 146 in contact with the oxide semiconductor layer 144 is formed using a material including a Group 13 element and oxygen, the state of the interface between the oxide semiconductor layer 144 and the gate insulating layer 146 can be kept favorable. This is because a material including a Group 13 element and oxygen is compatible with an oxide semiconductor material. For example, when the oxide semiconductor layer 144 and the gate insulating layer 146 including gallium oxide are provided in contact with each other, pileup of hydrogen at the interface between the oxide semiconductor layer 144 and the gate insulating layer 146 can be reduced. Aluminum oxide has a property of not easily transmitting water. Thus, it is preferable to use aluminum oxide for the gate insulating layer 146 in terms of preventing entry of water into the oxide semiconductor layer 144.

When the gate insulating layer is thin as described above, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate (Hf-Si$_x$O$_y$, (x>0, y>0)), hafnium silicate (HfSi$_x$O$_y$, (x>0, y>0)) to which nitrogen is added, or hafnium aluminate (HfAl$_x$O$_y$, (x>0, y>0)) to which nitrogen is added. By using a high-k material for the gate insulating layer 146, the thickness can be increased to suppress gate leakage with electric characteristics ensured. Note that a stacked structure of a film including a high-k material and a film including any of silicon oxide, silicon nitride, silicon oxynitride, silicon nitride oxide, aluminum oxide, and the like may be employed.

In addition, the gate insulating layer 146 preferably includes oxygen more than that in the stoichiometric composition ratio. For example, when gallium oxide is used for the gate insulating layer 146, the stoichiometric composition ratio can be expressed as Ga$_2$O$_{3+\alpha}$, ($0<\alpha<1$). When aluminum oxide is used, the stoichiometric composition ratio can be expressed as Al$_2$O$_{3+\alpha}$ ($0<\alpha<1$). When gallium aluminum oxide is used, the stoichiometric composition ratio can be expressed as Ga$_x$Al$_{2-x}$O$_{3+\alpha}$ ($0<x<2$, $0<\alpha<1$).

Note that oxygen doping treatment may be performed after the oxide semiconductor layer is formed, after the oxide semiconductor layer 144 is formed, or the gate insulating layer 146 is formed. "Oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen that is made to be plasma is added to a bulk. By the oxygen doping treatment, oxygen can be included in the oxide semiconductor layer or the gate insulating layer more than that in the stoichiometric composition ratio.

The oxygen doping treatment is preferably performed by an inductively coupled plasma (ICP) method with the use of oxygen plasma which is excited by a microwave (with a frequency of 2.45 GHz, for example).

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce fluctuation in electric characteristics of the transistor. Moreover, in the case where the gate insulating layer 146 includes oxygen, oxygen is supplied to the oxide semiconductor layer 144 to compensate for oxygen deficiency in the oxide semiconductor layer 144, whereby an i-type (intrinsic) or substantially i-type oxide semiconductor layer can be formed.

Note that in this embodiment, the second heat treatment is performed after the gate insulating layer 146 is formed; the timing of the second heat treatment is not limited this. For example, the second heat treatment may be performed after the gate electrode is formed. Alternatively, the first heat treatment and the second heat treatment may be successively performed, the first heat treatment may also serve as the second heat treatment, or the second heat treatment may also serve as the first heat treatment.

As described above, at least one of the first heat treatment and the second heat treatment is employed, whereby the substance including a hydrogen atom can be excluded as much as possible and the oxide semiconductor layer 144 can be highly purified.

Figure 10D:
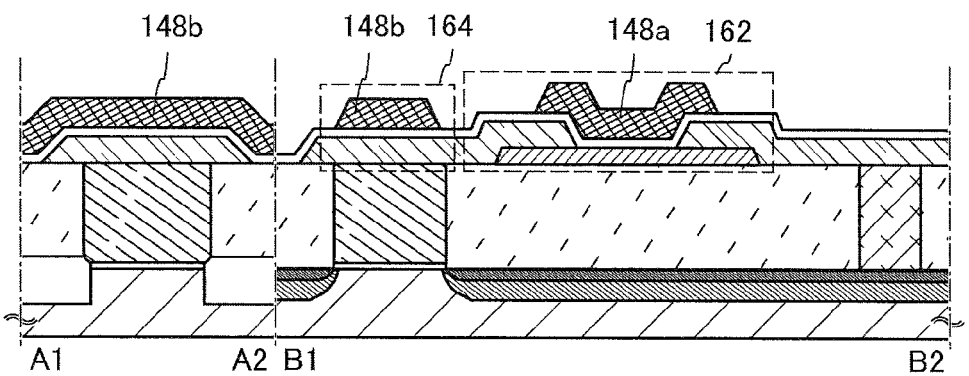

Next, a conductive layer for forming a gate electrode (including a wiring formed in the same layer as the gate electrode) is formed and is processed, so that the gate electrode 148a and the conductive layer 148b are formed (see FIG. 10D).

The gate electrode 148a and the conductive layer 148b can be formed using a metal material such as molybdenum, titanium, tantalum, tungsten, aluminum, copper, neodymium, or scandium, or an alloy material including any of these materials as a main component. Note that the gate electrode 148a and the conductive layer 148b may have a single-layer structure or a stacked structure.

Figure 11A:
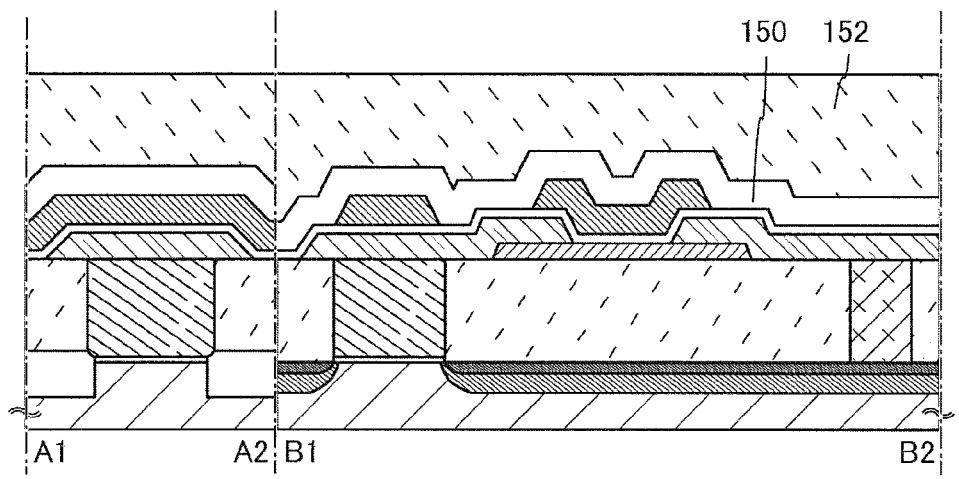
FIGS. 11A and 11B are cross-sectional views illustrating a manufacturing process of a semiconductor device.

Then, the insulating layer 150 and the insulating layer 152 are formed over the gate insulating layer 146, the gate electrode 148a, and the conductive layer 148b (see FIG. 11A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, gallium oxide, aluminum oxide, or gallium aluminum oxide. Note that the insulating layer 150 and the insulating layer 152 are preferably formed using a low dielectric constant material or to have a structure with a low dielectric constant (such as a porous structure). This is because by reducing the dielectric constant of the insulating layer 150 and the insulating layer 152, capacitance between wirings, electrodes, or the like can be reduced; thus, operation at higher speed can be achieved. Note that although the insulating layer 150 and the insulating layer 152 each have a single-layer structure in this embodiment, one embodiment of the present invention is not limited to this. The insulating layer 150 and the insulating layer 152 may each have a stacked structure including two or more layers.

Then, an opening 153 reaching the source or drain electrode 142b is formed in the gate insulating layer 146, the insulating layer 150, and the insulating layer 152. After that, the electrode 154 which is in contact with the source or drain electrode 142b is formed in the opening 153, and the wiring 156 which is in contact with the electrode 154 is formed over the insulating layer 152 (see FIG. 11B). Note that the opening is formed by selective etching using a mask or the like.

The electrode 154 can be formed in such a manner that, for example, a conductive layer is formed by a PVD method, a CVD method, or the like in a region including the opening 153 and then part of the conductive layer is removed by etching treatment, CMP treatment, or the like.

Specifically, it is possible to use a method, for example, in which a thin titanium film is formed in a region including the opening 153 by a PVD method and a thin titanium nitride film is formed by a CVD method, and then a tungsten film is formed so as to be embedded in the opening 153. Here, the titanium film formed by a PVD method has a function of reducing an oxide film (such as a natural oxide film) formed on a surface over which the titanium film is formed, thereby lowering the contact resistance with a lower electrode or the like (the source or drain electrode 142b, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 154 is formed by removing part of the conductive layer, processing is preferably performed so that the surface is planarized. For example, when a thin titanium film or a thin titanium nitride film is formed in a region including the opening 153 and then a tungsten film is formed so as to be embedded in the opening 153, excessive tungsten, titanium, titanium nitride, or the like can be removed and the planarity of the surface can be improved by subsequent CMP treatment. The surface including the electrode 154 is planarized in such a manner, whereby an electrode, a wiring, an insulating layer, a semiconductor layer, or the like can be favorably formed in a subsequent step.

The wiring 156 is formed by forming a conductive layer by a PVD method such as a sputtering method or a CVD method such as a plasma CVD method, and then by patterning the conductive layer. As a material for the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of any of these elements may be used. The details are similar to those of the source or drain electrode 142a, the source or drain electrode 142b, and the like.

Figure 11B:
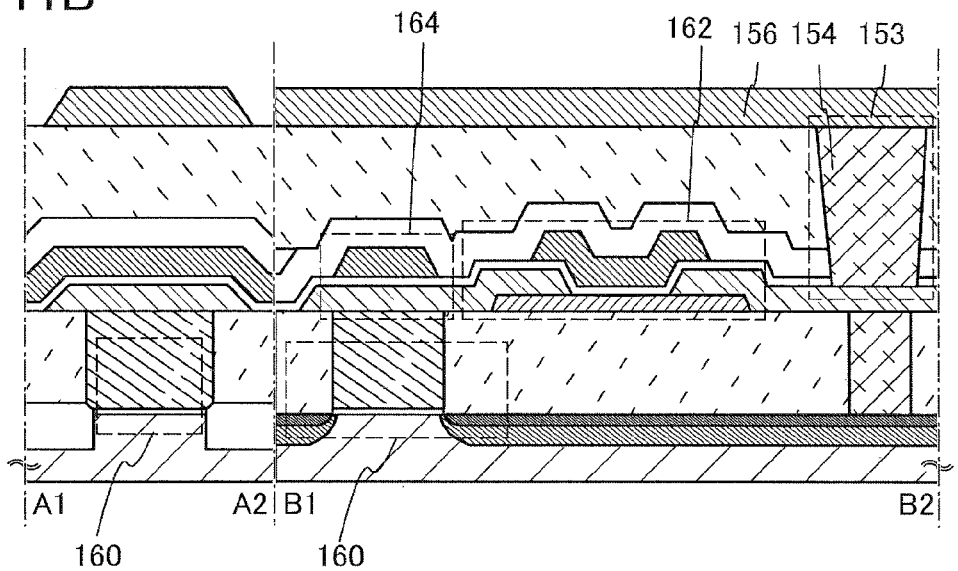

Through the above steps, the semiconductor device including the transistor 160, the transistor 162, and the capacitor 164 is completed (see FIG. 11B).

Figure 27A:
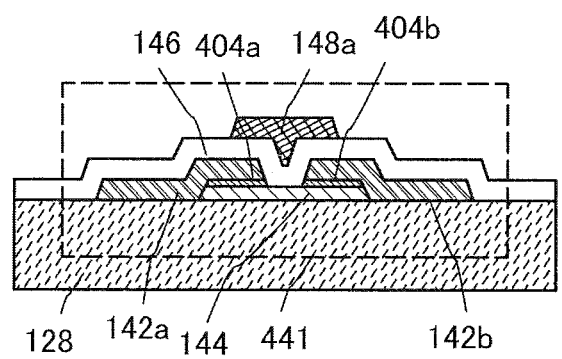
FIGS. 27A and 27B are each a cross-sectional view of transistors included in a semiconductor device.
Figure 27B:
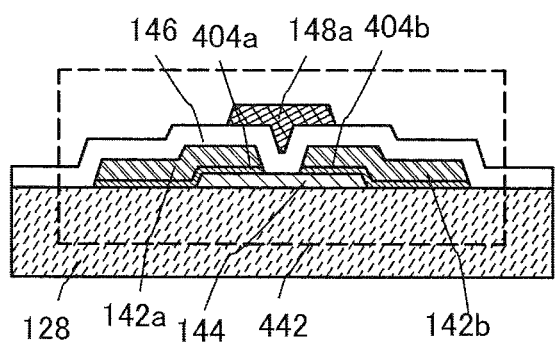

Oxide conductive layers functioning as a source region and a drain region may be provided as buffer layers between the oxide semiconductor layer 144 and the source or drain electrodes 142a and 142b. FIGS. 27A and 27B illustrate a transistor 441 and a transistor 442, respectively, where oxide conductive layers are provided in the transistor 162 in FIG. 11B.

In each of the transistors 441 and 442 in FIGS. 27A and 27B, an oxide conductive layer 404a and an oxide conductive layer 404b which function as a source region and a drain region are formed between the oxide semiconductor layer 144 and the source or drain electrodes 142a and 142b. The shapes of the oxide conductive layers 404a and 404b differ between the transistors 441 and 442 in FIGS. 27A and 27B owing to the manufacturing process.

In the transistor 441 in FIG. 27A, a stack of an oxide semiconductor layer and an oxide conductive film is formed and processed at a time in a photolithography step, so that the oxide semiconductor layer 144 having an island shape and an oxide conductive film having an island shape are formed. The source or drain electrode 142a and the source or drain electrode 142b are formed over the oxide semiconductor layer and the oxide conductive film, and then the island-shaped oxide conductive film is etched using the source or drain electrode 142a and the source or drain electrode 142b as masks, so that the oxide conductive layer 404a and the oxide conductive layer 404b which serve as a source region and a drain region are formed.

In the transistor 442 in FIG. 27B, an oxide conductive film is formed over the oxide semiconductor layer 144, a metal conductive film is formed over the oxide conductive film, and the oxide conductive film and the metal conductive film are processed at a time in a photolithography step; thus, the oxide conductive layer 404a and the oxide conductive layer b which serve as a source region and a drain region, the source or drain electrode 142a, and the source or drain electrode 142b are formed.

In order to prevent excessive etching of the oxide semiconductor layer in etching treatment for processing the oxide conductive film, etching conditions (such as the kind of etchant, the concentration, and the etching time) are adjusted as appropriate.

As a method for forming the oxide conductive layer 404a and the oxide conductive layer 404b, a sputtering method, a vacuum evaporation method (such as an electron beam evaporation method), an arc discharge ion plating method, or a spray method is used. As a material for the oxide conductive layers, zinc oxide, zinc aluminum oxide, zinc aluminum oxynitride, zinc gallium oxide, indium tin oxide including silicon oxide (ITSO), or the like can be used. In addition, the above materials may include silicon oxide.

By providing the oxide conductive layer as the source region and the drain region between the oxide semiconductor layer 144 and the source or drain electrodes 142a and 142b, the resistance of the source region and the drain region can be reduced and the transistor 441 and the transistor 442 can operate at high speed.

With the structure including the oxide semiconductor layer 144, the oxide conductive layer 404b, and the source or drain electrode 142b, the withstand voltage of the transistor 441 and the transistor 442 can be improved.

In a manufacturing process of a transistor including an oxide semiconductor layer, high-temperature treatment is not needed and thus the transistor can be manufactured without affecting another device or wiring, such as a transistor in the lower portion. Further, the manufacturing process of the transistor including an oxide semiconductor layer has a smaller number of steps than a manufacturing process of a transistor including a semiconductor material (e.g., silicon) other than an oxide semiconductor.

The structures, methods, and the like described in this embodiment can be combined as appropriate with any of the structures, methods, and the like described in the other embodiments.

Embodiment 5

In this embodiment, a circuit configuration and operation of a semiconductor device according to one embodiment of the disclosed invention will be described with reference to FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, and FIG. 25. Note that in some circuit diagrams, "OS" is written beside a transistor in order to indicate that the transistor includes an oxide semiconductor.

(Driver Circuit)

Figure 12:
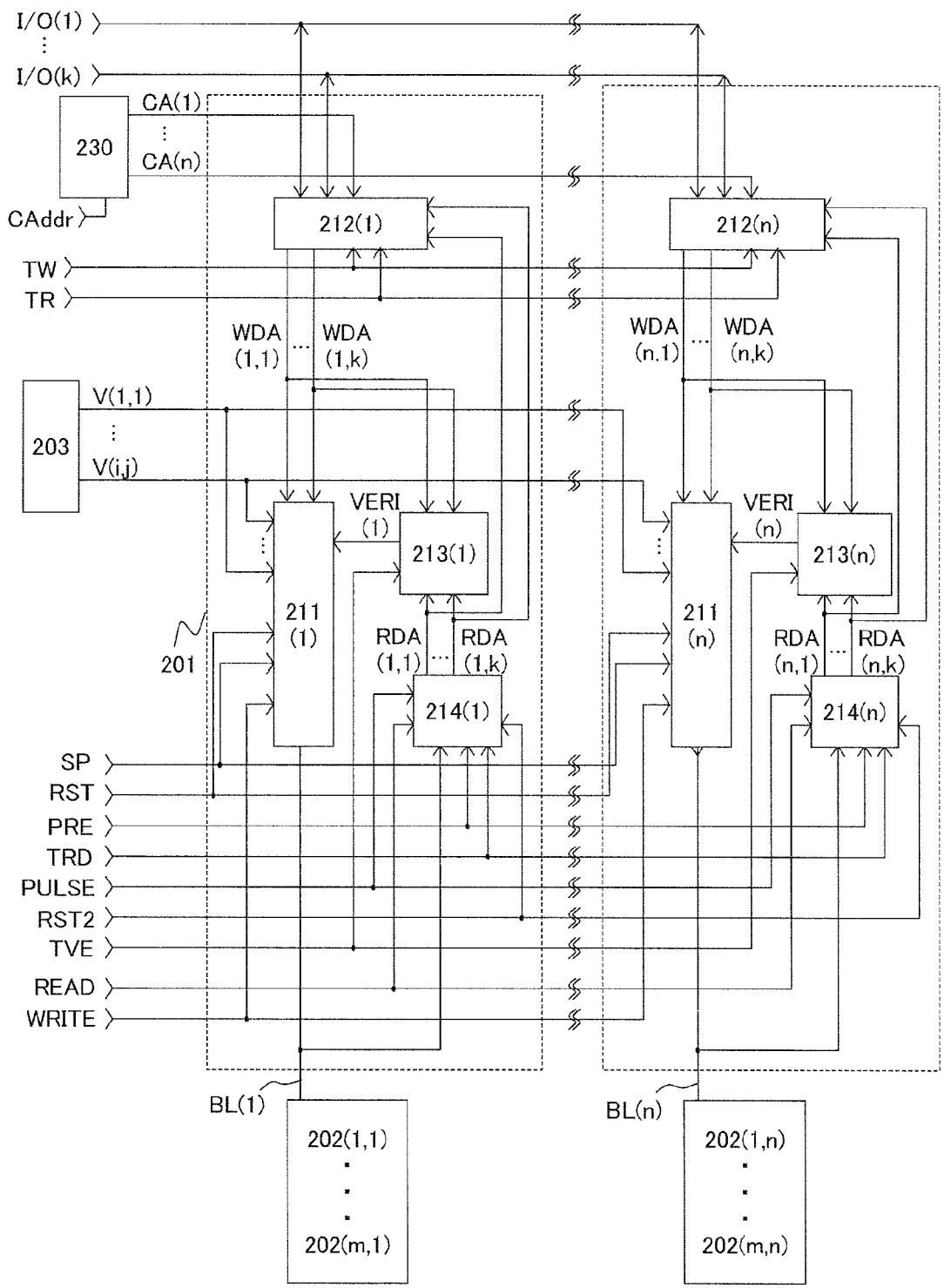
FIG. 12 is a circuit diagram of a semiconductor device.

FIG. 12 is a block diagram of a semiconductor device.

The driver circuit 201 includes the data buffer 212, the writing circuit 211, the verifying circuit 213, and the reading circuit 214, and functions to perform writing, reading, and verifying of data. The driver circuit 201 is provided for each column.

The potential generating circuit 203 is electrically connected to i×j (i and j are each an integer of 2 or more) write potential supply lines (corresponding to the first signal lines 221 in FIG. 1). Each of the write potential supply lines V(1,1) to V(i,j) is electrically connected to writing circuits 211(1) to 211(n) in the driver circuit 201 and supplies a plurality of write potentials to the writing circuits 211(1) to 211(n). Note that i represents the number of levels (value) of data that can be stored in the memory cell 202, and j represents the maximum number of times of verifying.

The number of the memory cells 202 is n (rows)×m (columns), and the memory cells 202 are electrically connected to the driver circuits 201 through the bit lines BL(1) to BL(n) (corresponding to the second signal line 222 or the third signal line 223 in FIG. 1) in respective rows. The memory cells 202 store potentials supplied to the bit lines BL(1) to BL(n) when writing is performed, and output stored data to the bit lines BL(1) to BL(n) when reading is performed. Note that FIG. 12 illustrates an example in which the bit lines BL(1) to BL(n) serve as both write signal lines and read signal lines; however, the write signal lines and the read signal lines may be separately provided.

Data buffers 212(1) to 212(n) are electrically connected to the writing circuits 211(1) to 211(n), verifying circuits 213(1) to 213(n), and reading circuits 214(1) to 214(n). Further, the data buffers 212(1) to 212(n) are electrically connected to data input/output lines I/O(1) to I/O(k) (k is an integer of 2 or more), address selection signal lines CA(1) to CA(n), a write data transfer signal line TW, and a read data transfer signal line TR. As for the data buffers 212(1) to 212(n), the data buffer 212 which is selected by the address selection signal lines CA(1) to CA(n) is electrically connected to the data input/output lines I/O(1) to I/O(k) when writing is performed; thus, data input through the data input/output lines I/O(1) to I/O(k) is held in any of the data buffers 212(1) to 212(n). Then, when a write data transfer signal is input through the write data transfer signal line TW, the data held in the data buffers 212(1) to 212(n) is output to the writing circuits 211(1) to 211(n) and the verifying circuits 213(1) to 213(n). When a read data transfer signal is input through the read data transfer signal line TR in reading, data output from the reading circuits 214(1) to 214(n) is held in the data buffers 212(1) to 212(n). Then, any of the data buffers 212(1) to 212(n), which is selected by the address selection signal lines CA(1) to CA(n), is electrically connected to the data input/output lines I/O(1) to I/O(k), and the data held in the data buffers 212(1) to 212(n) is output to the data input/output lines I/O(1) to I/O(k). Note that k represents the amount of information of write data; k can be 2 in the case where four levels of data can be stored in one memory cell, and k can be 3 in the case where eight levels of data can be stored in one memory cell.

The writing circuits 211(1) to 211(n) are electrically connected to the potential generating circuit 203 through the write potential supply lines V(1,1) to V(i,j). Further, the writing circuits 211(1) to 211(n) are electrically connected to the data buffers 212(1) to 212(n), the verifying circuits 213(1) to 213(n), and the memory cells 202(1,1) to 202(m,n). A signal line SP, a signal line RST, and a write signal line WRITE are electrically connected to the writing circuits 211(1) to 211(n). The writing circuits 211(1) to 211(n) select one of the write potential supply lines V(1,1) to V(i,j) in accordance with data input from the data buffers 212 and verify signals VERI(1) to VERI(n) input from the verifying circuits 213, and electrically connect the one of the write potential supply lines V(1,1) to V(i,j) to the bit lines BL(1) to BL(n).

The verifying circuits 213(1) to 213(n) are electrically connected to the writing circuits 211(1) to 211(n), the data buffers 212(1) to 212(n), and the reading circuits 214(1) to 214(n). Further, the verifying circuits 213(1) to 213(n) are electrically connected to a verify output signal line TVE. The verifying circuits 213(1) to 213(n) compare write data input from the data buffers 212 with read data input from the reading circuits 214. When a verify output signal is input to the verify output signal line TVE, the verifying circuits 213(1) to 213(n) output comparison results of data to the writing circuits 211.

The reading circuits 214(1) to 214(n) are electrically connected to the data buffers 212(1) to 212(n), the verifying circuits 213(1) to 213(n), and the memory cells 202(1,1) to 202(m,n). Further, the reading circuits 214(1) to 214(n) are electrically connected to a signal line PRE, a signal line TRD, a signal line PULSE, a signal line RST2, and a read signal line READ. The reading circuits 214(1) to 214(n) read data from the memory cells 202(1,1) to 202(m,n) when a read signal is input through the read signal line READ. When a pulse is input to the signal line TRD, the reading circuits 214(1) to 214(n) output the read data to the data buffers 212(1) to 212(n) and the verifying circuits 213(1) to 213(n).

A decoder 230 is electrically connected to an address signal line CAddr and the data buffers 212(1) to 212(n) (n is an integer of 2 or more) in the driver circuits 201 and selects the driver circuit 201 in which writing and reading of data are to be performed, in accordance with an address signal CAddr.

Specific circuit configurations and operation of the data buffer 212, the potential generating circuit 203, the writing circuit 211, the verifying circuit 213, the reading circuit 214, and the memory cell 202 will be described later.

(Data Buffer)

Figure 13:
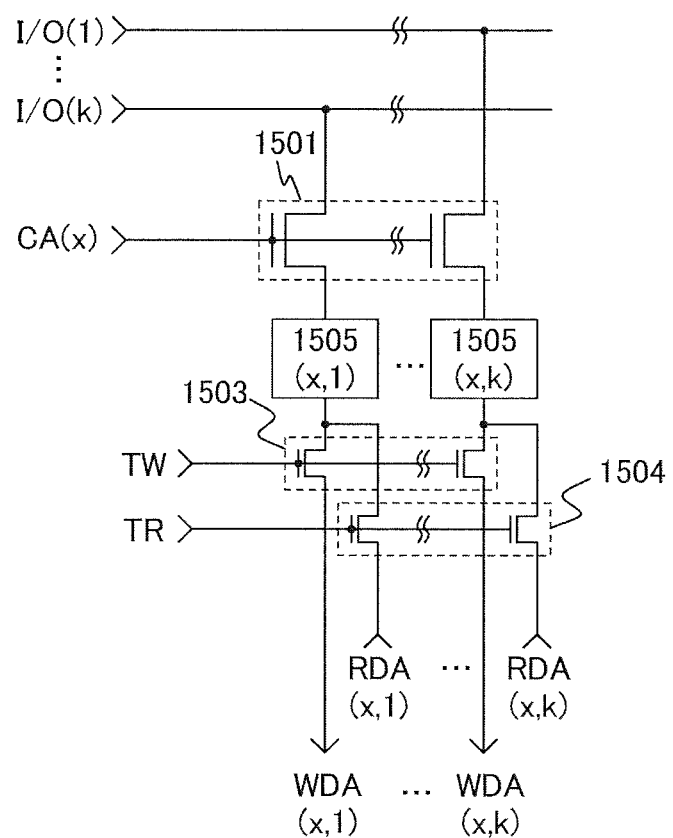
FIG. 13 is a circuit diagram of a data buffer included in a semiconductor device.
Figure 14:
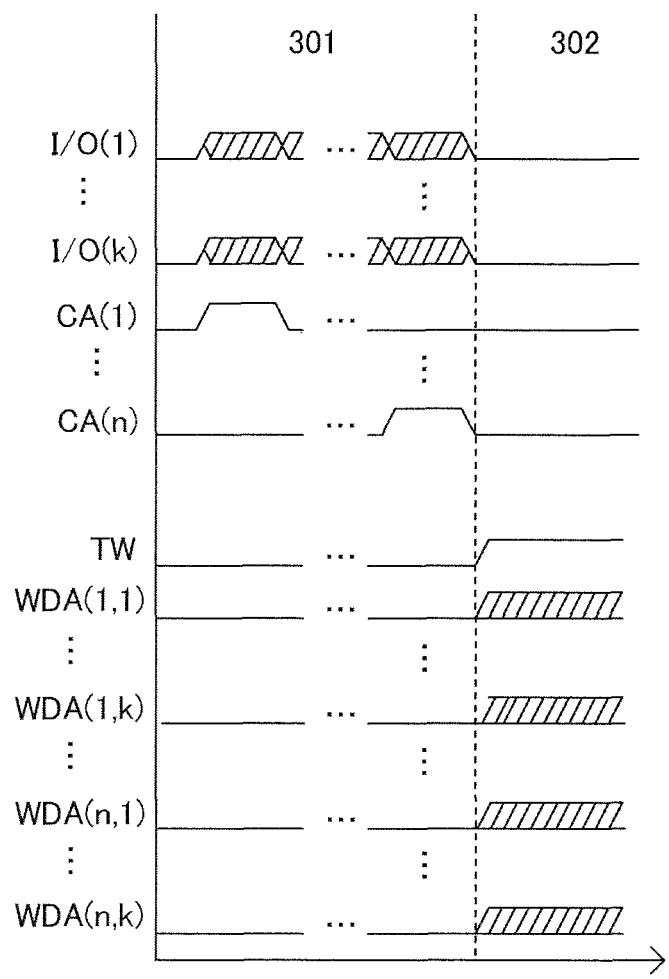
FIG. 14 is a timing chart of a data buffer included in a semiconductor device.

FIG. 13 illustrates an example of a circuit of the data buffer 212 in FIG. 12. FIG. 14 is a timing chart of input of write data to the data buffer 212.

First, a configuration of the data buffer 212 will be described with reference to FIG. 13. The data input/output lines I/O(1) to I/O(k) are electrically connected to respective drain electrodes of transistors 1501. The address selection signal line CA(x) (x is an integer greater than or equal to 1 and less than or equal to n) is electrically connected to gate electrodes of the transistors 1501. Source electrodes of the transistors 1501 are electrically connected to respective one terminals of latch circuits LAT1505(x,1) to LAT1505(x,k). The other terminals of the latch circuits LAT1505(x,1) to LAT1505(x,k) are electrically connected to respective drain electrodes of transistors 1503 and transistors 1504. Each gate electrode of the transistors 1503 is electrically connected to the write data transfer signal line TW. Source electrodes of the transistors 1503 are electrically connected to respective signal lines WDA(x,1) to WDA(x,k). Each gate electrode of the transistors 1504 is electrically connected to the read data transfer signal line TR. Source electrodes of the transistors 1504 are electrically connected to respective signal lines RDA(x,1) to RDA(x,k).

Next, input operation of write data to the data buffer 212 will be described with reference to FIG. 14. First, input of write data is performed in a period 301 as follows. Given write data is sequentially transmitted through the data input/output lines I/O(1) to I/O(k). In synchronization with the timing of transmitting the data, a high potential VH (e.g., 5 V) is supplied to the address selection signal line CA(x) to turn on the transistors 1501, so that data of the data input/output lines I/O(1) to I/O(k) is held in the latch circuits LAT1505(x,1) to LAT1505(x,k). Then, a low potential VL (e.g., 0 V) is supplied to the address selection signal line CA(x) to which the high potential VH has been supplied and the transistors 1501 are turned off. After data is held by the above-described procedure in all the latch circuits LAT1505 in 1 to n rows or data is held by the above-described procedure in the latch circuits LAT1505 in rows on which writing needs to be performed, the input given write data is transferred to the writing circuit 211 in a period 302 as follows. The high potential VH is supplied to the write data transfer signal line TW to turn on the transistors 1503, so that the given data held in the latch circuits LAT1505(1,1) to LAT1505(*m,k*) is transmitted to signal lines WDA(1,1) to WDA(m,k). Note that a shaded portion in the drawing indicates given data.

(Potential Generating Circuit)

Figure 15:
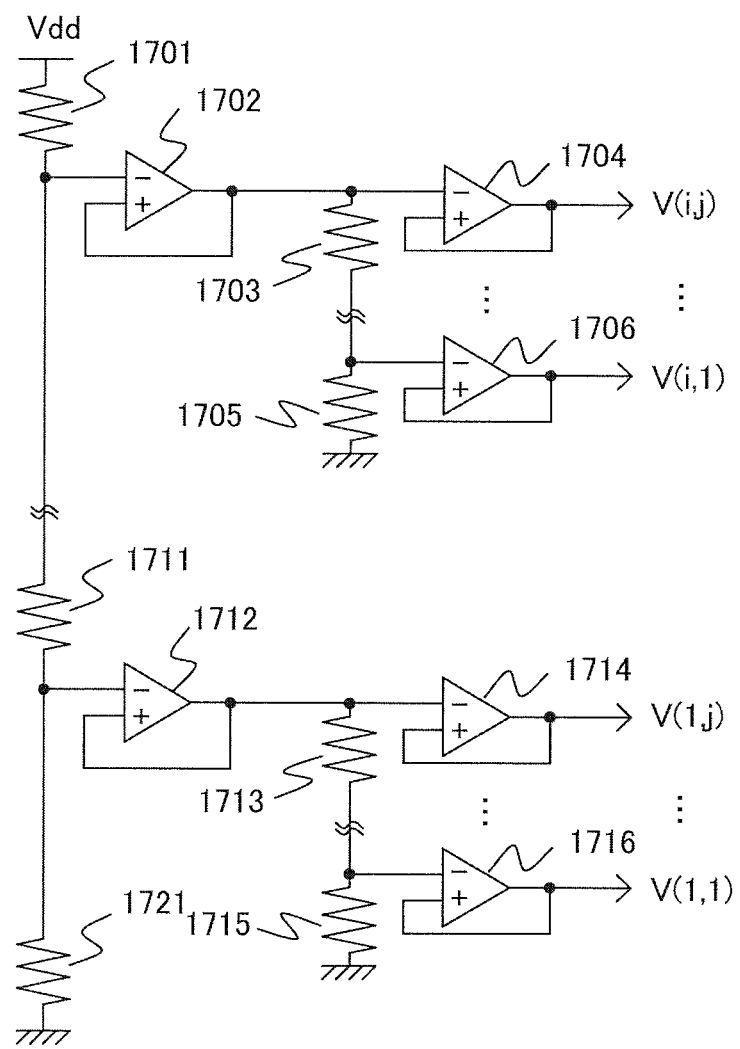
FIG. 15 is a circuit diagram of a potential generating circuit included in a semiconductor device.

FIG. 15 illustrates an example of a configuration of the potential generating circuit 203 in FIG. 12. The potential generating circuit 203 has a function of generating a potential supplied to the bit line BL(n) of the memory cell 202.

First, a configuration of the potential generating circuit 203 will be described with reference to FIG. 15. The potential generating circuit 203 has the following configuration. A power supply potential Vdd (e.g., 5 V) is electrically connected to one terminal of a resistor 1701. The other terminal of the resistor 1701 is electrically connected to one terminal of a resistor 1711. The other terminal of the resistor 1711 is electrically connected to one terminal of a resistor 1721. The other terminal of the resistor 1721 is grounded (or supplied with a low potential). Input terminals of a voltage follower 1702 and a voltage follower 1712 are electrically connected between the resistors. A resistor 1703 and a resistor 1705 are electrically connected between an output terminal of the voltage follower 1702 and a ground potential (or a low potential). A resistor 1713 and a resistor 1715 are electrically connected between an output terminal of the voltage follower 1712 and a ground potential (or a low potential). A voltage follower 1704 and a voltage follower 1706 are electrically connected between the output terminal of the voltage follower 1702 and the resistors 1703 and 1705. A voltage follower 1714 and a voltage follower 1716 are electrically connected between the output terminal of the voltage follower 1712 and the resistors 1713 and 1715. Output terminals of the voltage follower 1704, the voltage follower 1706, the voltage follower 1714, and the voltage follower 1716 are electrically connected to the write potential supply lines V(1,1) to V(i,j).

Next, operation of the potential generating circuit 203 will be described. When the power supply potential Vdd is supplied, the ratio of the resistance of the resistor electrically connected between the power supply potential Vdd and the voltage follower 1702 or the voltage follower 1712 with respect to the sum of the resistance of the resistor 1701, the resistor 1711, and the resistor 1721 is input through voltage drop to the input terminals of the voltage follower 1702 and the voltage follower 1712. Then, output potentials of the voltage follower 1702 and the voltage follower 1712 also become the same as the input potentials of the voltage follower 1702 and the voltage follower 1712. The output potentials of the voltage follower 1702 and the voltage follower 1712 are input to the voltage follower 1704 and the voltage follower 1714, respectively. Output potentials of the voltage follower 1704 and the voltage follower 1714 are input to the write potential supply lines as V(i,j) and V(1,*j*), respectively, which are equal to the input potentials of the voltage follower 1704 and the voltage follower 1714. Meanwhile, the resistor 1703 and the resistor 1705 are electrically connected in series between the output terminal of the voltage follower 1702 and the ground potential (or the low potential), and the resistor 1713 and the resistor 1715 are electrically connected in series between the output terminal of the voltage follower 1712 and the ground potential (or the low potential). In addition, an input terminal of the voltage follower 1706 is electrically connected between the resistor 1703 and the resistor 1705. Therefore, as an input potential of the voltage follower 1706, a potential which is voltage-dropped from the output potential of the voltage follower 1702 by an amount corresponding to the ratio of the resistance of the resistor electrically connected between the output terminal of the voltage follower 1702 and the voltage follower 1706 with respect to the sum of the resistance of the resistor 1703 and the resistor 1705 is input. Then, a potential equal to the input potential of the voltage follower 1706 is output as V(1,*l*) from the output terminal of the voltage follower 1706 to the write potential supply line. In a similar manner, a potential equal to an input potential of the voltage follower 1716 is output as V(1,1) from the output terminal of the voltage follower 1716 to the write potential supply line.

By using one write potential supply line only when data "0" is written (when the potential written into the memory cell 202 is 0 V), the number of write potential supply lines connected to the potential generating circuit 203 can be (i−1)×j+1. Accordingly, the number of write potential supply lines is reduced, and thus the area occupied by the memory cell 202 can be increased owing to a reduction in the number of wirings. By using one write potential supply line only when data "i" is written (when the maximum potential is written into the memory cell 202), an effect similar to that described above can be obtained. Furthermore, by using one write potential supply line when data "0" and data "i" are written, the number of write potential supply lines connected to the potential generating circuit 203 can be (i−2)×j+2; accordingly, the area occupied by the memory cell 202 can be further increased owing to a reduction in the number of wirings.

The potential generating circuit 203 is not limited to the circuit in FIG. 15 and can be formed to be a circuit including a plurality of different potential supply lines with the use of a known circuit.

(Writing Circuit)

Figure 16:
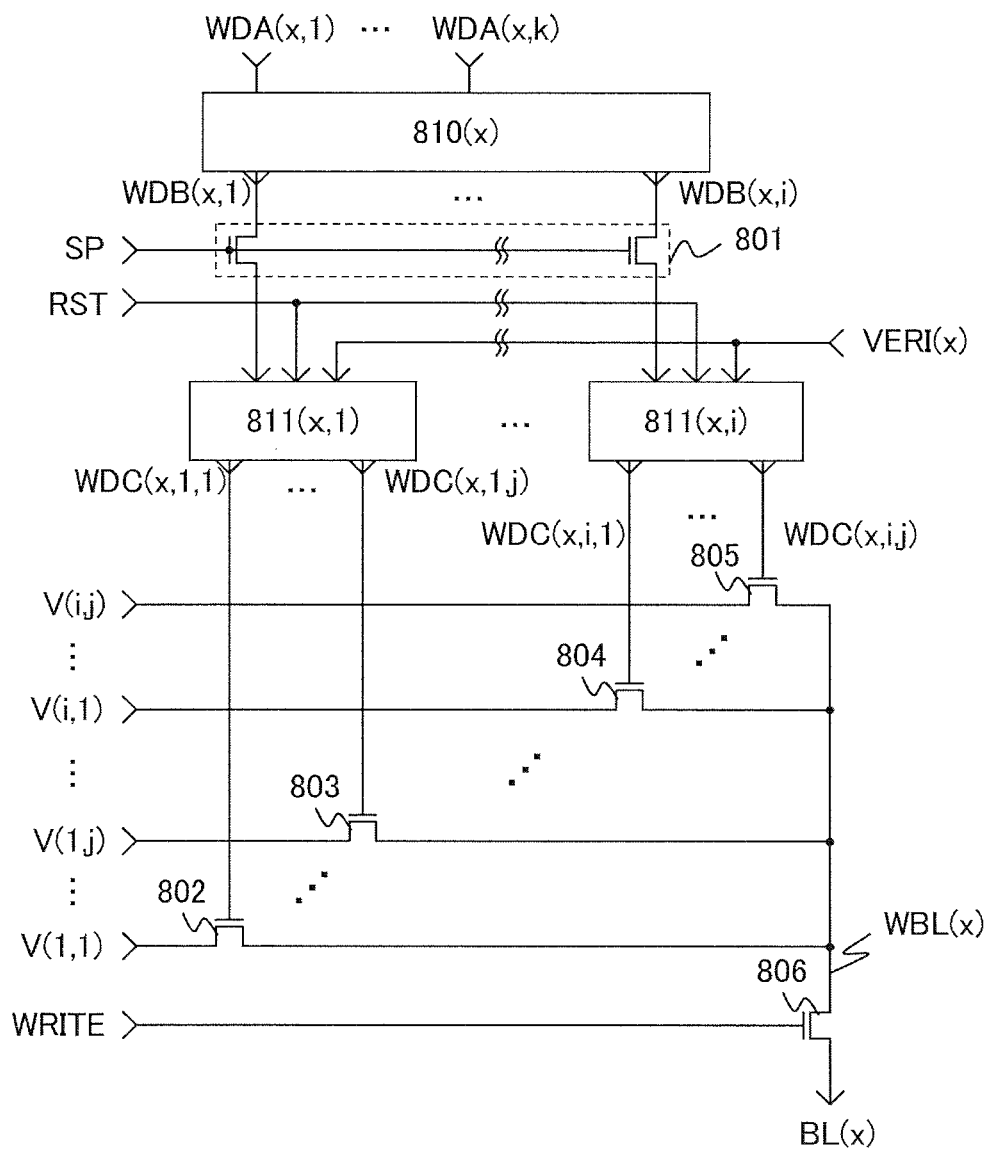
FIG. 16 is a circuit diagram of a writing circuit included in a semiconductor device.
Figure 17:
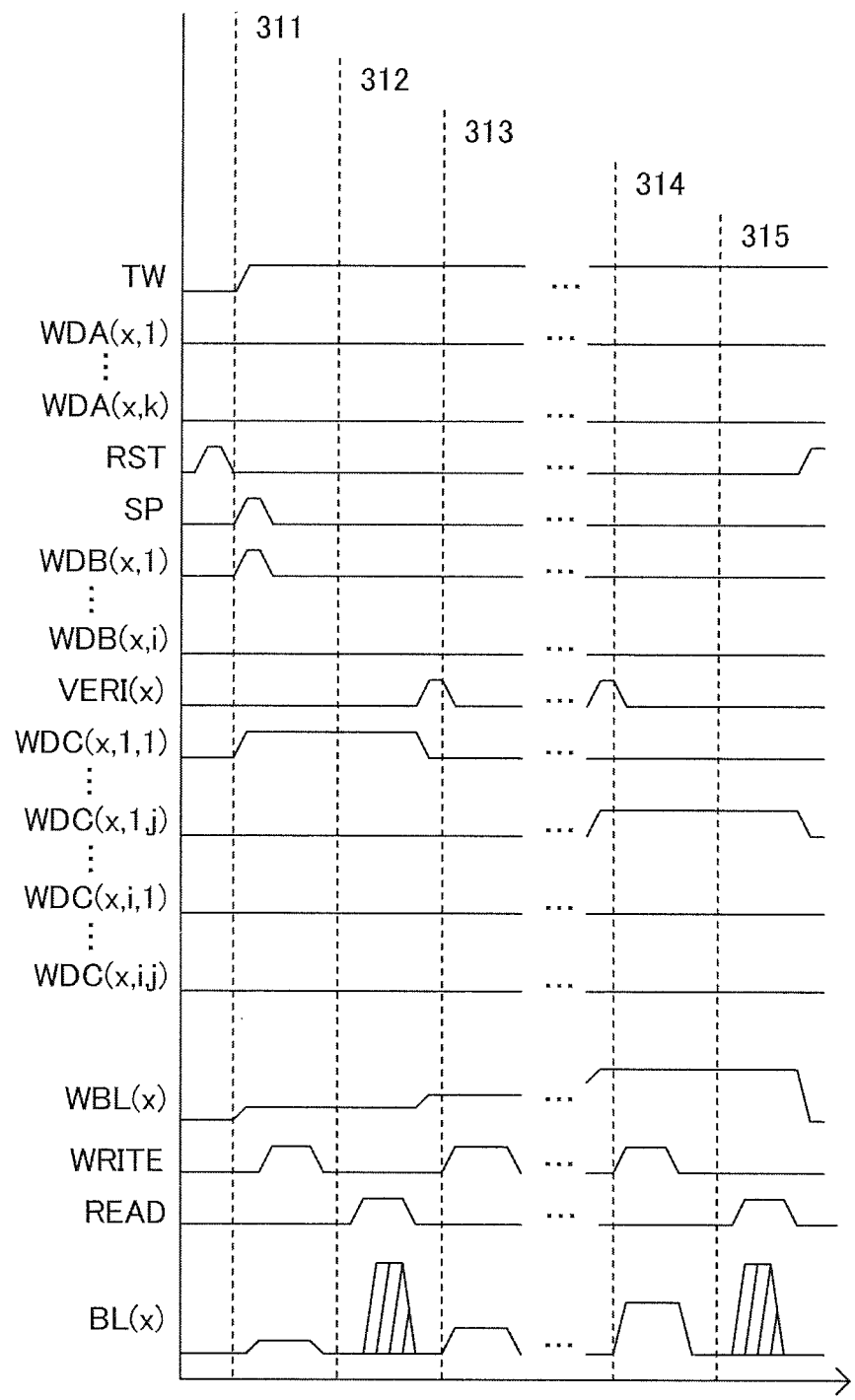
FIG. 17 is a timing chart of a writing circuit included in a semiconductor device.
Figure 18:
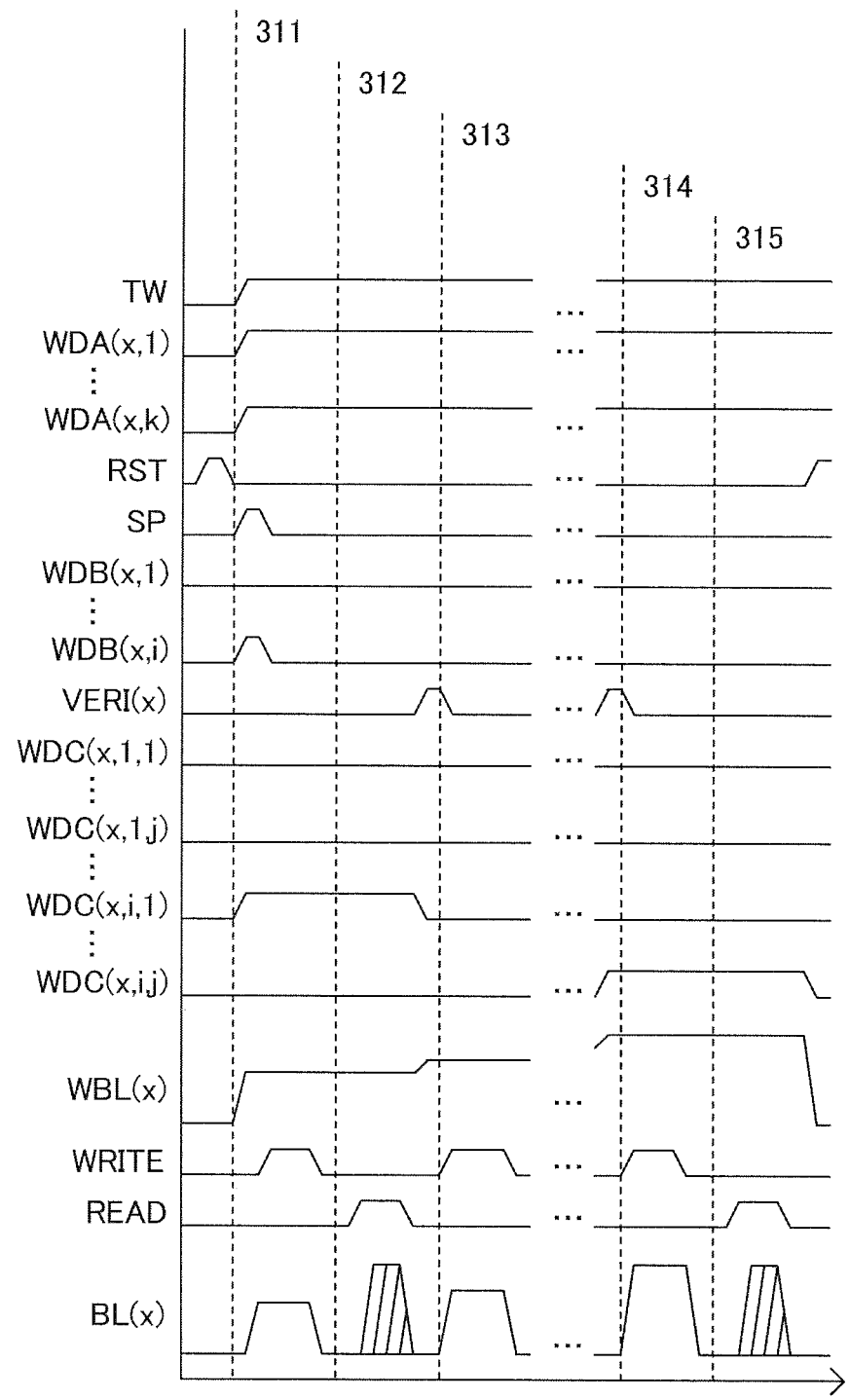
FIG. 18 is a timing chart of a writing circuit included in a semiconductor device.

FIG. 16 illustrates an example of a configuration of the writing circuit 211 in FIG. 12. FIG. 17 is a timing chart showing operation of the writing circuit 211 in the case where data "0" is written, write data does not agree with read data as a result of verify reading, and then writing and verify reading are performed j−1 times. FIG. 18 is a timing chart showing operation of the writing circuit 211 in the case where data "i" is written, write data does not agree with read data as a result of verify reading, and then writing and verify reading are performed j−1 times. The writing circuit 211 has a function of electrically connecting one of a plurality of write potential supply lines to a bit line to supply a write potential to the bit line.

First, a configuration of the writing circuit 211 will be described with reference to FIG. 16. The signal lines WDA(x,1) to WDA(x,k) which are electrically connected to the data buffer 212 are electrically connected to input terminals of a decoder 810(*x*). Signal lines WDB(x,1) to WDB(x,i) connected to the decoder 810(*x*) are electrically connected to respective drain electrodes of transistors 801. Each gate electrode of the transistors 801 is electrically connected to the signal line SP. Source electrodes of the transistors 801 are electrically connected to respective shift registers 811(*x*,1) to 811(*x,i*). The signal line RST and a verify signal line VERI(x) are eclectically connected to the shift registers 811(*x*,1) to 811(*x,i*) (x is an integer greater than or equal to 1 and less than or equal to n). Further, signal lines WDC(x,1,1) to WDC(x,i,j) connected to the shift registers 811 are electrically connected to respective gate electrodes of transistors 802, transistors 803, transistors 804, and transistors 805. Drain electrodes of the transistors 802, the transistors 803, the transistors 804, and the transistors 805 are electrically connected to the write potential supply lines V(1,1) to V(i,j). Source electrodes of the transistors 802, the transistors 803, the transistors 804, and the transistors 805 are electrically connected to a drain electrode of a transistor 806. A gate electrode of the transistor 806 is electrically connected to the write signal line WRITE. A source electrode of the transistor 806 is electrically connected to the bit line BL(x).

Next, operation of the writing circuit 211 will be described with reference to FIG. 17 and FIG. 18. First, the high potential VH is supplied to the signal line RST to reset the shift registers 811(x,1) to 811(x,i), so that the low potential VL is output to all of the signal lines WDC(x,1,1) to WDC(x,i,j). Accordingly, the transistors 802, the transistors 803, the transistors 804, and the transistors 805 are all turned off. The low potential VL is also supplied to the write signal line WRITE to turn off the transistor 806, so that a signal line WBL(x) is brought into a floating state. After that, the low potential VL is supplied to the signal line RST and reset operation of the shift registers 811 is completed.

When the reset operation of the shift registers 811 is completed, first writing is performed in a period 311 as follows. The high potential VH is supplied to the write data transfer signal line TW, and write data output from the data buffer 212 is input to the decoder 810 through the signal lines WDA(x,1) to WDA(x,k). The decoder 810 decodes the write data and outputs the results to the signal lines WDB(x,1) to WDB(x,i). Table 1 shows a relation between input and output of the decoder 810.

TABLE 1

| Write Data | Input Signal of Decoder | | | Output Signal of Decoder | | |
|---|---|---|---|---|---|---|
| | WDA (x, 1) | WDA (x, 2) | WDA (x, k) | WDB (x, 1) | WDB (x, 2) | WDB (x, i) |
| Data "0" | 0 | 0 | ... 0 | 1 | 0 | ... 0 |
| Data "1" | 1 | 0 | ... 0 | 0 | 1 | ... 0 |
| Data "i" | 1 | 1 | ... 1 | 0 | 0 | ... 1 | x: integer greater than or equal to 1 and less than or equal to n
1: VH
0: VL

For example, in the case where data "0" is written into an eight-valued (i=8, k=3) memory cell, the low potential VL is supplied to the signal lines WDA(x,1) to WDA(x,3) and input to the decoder 810. As output results of the decoder 810, the high potential VH is output to the signal line WDB(x,1) and the low potential VL is output to the signal lines WDB(x,2) to WDB(x,8). In FIG. 17, for example, the low potential VL is supplied to the signal lines WDA(x,1) to WDA(x,k) and input to the decoder 810. As output results of the decoder 810, the high potential VH is output to the signal line WDB(x,1) and the low potential VL is output to the signal lines WDB(x,2) to WDB(x,i).

The high potential VH is supplied to the write data transfer signal line TW and the signal line SP at the same time, so that the transistors 801 are turned on and output results of the decoder 810 are input to the shift registers 811(x,1) to 811(x,i) through the signal lines WDB(x,1) to WDB(x,i). When the output results of the decoder 810 are input to the shift registers 811, only the shift register 811 to which the high potential VH is input operates. When the shift register 811 operates, the high potential VH is supplied to the signal line WDC(x,y,1) (y is an integer greater than or equal to 1 and less than or equal to i) with the lowest output (i.e., a signal line supplied with the lowest potential among output potentials), and the low potential VL is supplied to all the signal lines WDC to which output potentials of the shift registers 811 are input but the signal line WDC(x,y,1). Then, among the transistors 802, the transistors 803, the transistors 804, and the transistors 805, a transistor whose gate electrode is electrically connected to the signal line WDC(x,y,1) is turned on, so that a potential of the write potential supply line V(y,1) which is electrically connected to a drain electrode of the transistor in an on state is supplied to the signal line WBL(x). In FIG. 17, for example, the high potential VH is supplied to the signal line WDC(x,1,1), and the low potential VL is output to the other signal lines WDC. Then, the transistor 802 whose gate electrode is electrically connected to the signal line WDC(x,1,1) is turned on, so that a potential of the write potential supply line V(1,1) which is electrically connected to the drain electrode of the transistor 802 in an on state is supplied to the signal line WBL(x).

After the write potential is supplied to the signal line WBL(x), the signal lines WDB(x,1) to WDB(x,i) to which output potentials of the decoder 810 are input and input terminals of the shift registers 811(x,1) to 811(x,i) are brought into an insulating state (also referred to as a non-conduction state) by supply of the low potential VL to the signal line SP, whereas the output of the shift registers 811 is kept in the state at the start of operation. In synchronization with the timing of supplying the low potential VL to the signal line SP, the high potential VH is supplied to the write signal line WRITE to turn on the transistor 806, so that a potential of the signal line WBL(x) is supplied to the bit line BL(x) and writing is performed on the memory cell 202. When the writing is completed, the potential of the write signal line WRITE is changed to VL to turn off the transistor 806, so that the bit line BL(x) is brought into an electrically floating state (also referred to as a floating state).

When the bit line BL(x) is in a floating state, first verify reading is performed in a period 312 (verify reading is also referred to as verifying). When data to be written into the memory cell 202 (i.e., data held in the data buffer 212) agrees with verify-read data as a result of verify reading, the verify signal VERI(x) keeps the low potential VL, potentials of the signal lines WDC(x,1,1) to WDC(x,i,j) to which output potentials of the shift registers 811(x,1) to 811(x,i) are input are kept, and the write potential V(y,1) is kept as the potential of the signal line WBL(x). The potential V(y,1) is kept as the potential of the signal line WBL(x) as described above; in other words, the potential V(y,1) is determined as the write potential or the potential V(y,1) is employed as the write potential.

On the other hand, when data to be written into the memory cell 202 (i.e., data held in the data buffer) does not agree with verify-read data, the high potential VH is applied as the verify signal VERI(x). When the high potential VH is input to the shift registers 811(x,1) to 811(x,i) as the verify signal VERI(x), only the shift register 811 which outputs the high potential VH to the lowest signal line WDC(x,y,1) outputs the high potential VH to another signal line such as the signal line WDC(x,y,2) which is one-level higher than the signal line WDC(x,y,1) (i.e., a signal line supplied with the second lowest potential among output potentials). The low potential VL is output to all the signal lines WDC(x,1,1) to WDC(x,i,j) but the signal line WDC(x,y,2). Then, among the transistors 802, the transistors 803, the transistors 804, and the transistors 805, a transistor whose gate electrode is electrically connected to the signal line WDC(x,y,2) is turned on, so that a potential of the write potential supply line V(y,2) which is electrically connected to a drain electrode of the transistor in an on state is supplied to the signal line WBL(x). At this time, the write potential supply line V(y,2) has a higher potential than the write potential supply line V(y,1). For example, the high potential VH is supplied to the signal line WDC(x,1,2), and the low potential VL is output to the other signal lines WDC. Then, a transistor whose gate electrode is electrically connected to the signal line WDC(x,1,2) is turned on, so that a potential of the write potential supply line V(1,2) which is electrically connected to a drain electrode of the transistor in an on state is supplied to the signal line WBL(x).

After that, the potential of the verify signal VERI(x) is changed to the low potential VL, whereas the output of the shift registers 811 is kept without change. Then, second writing is performed in a period 313. That is, the high potential VH is supplied to the write signal line WRITE to turn on the transistor 806, so that a potential of the signal line WBL(x) is supplied to the bit line BL(x) and writing is performed again on the memory cell 202. A shaded portion in the drawing indicates that the timing at which the potential of the bit line BL(x) is raised to the high potential VH varies depending on read data.

The above writing and verify reading are each performed j times at a maximum. By repeatedly changing potentials supplied to the bit line BL(x) until data to be written agrees with a result of verify reading, the write potentials can be determined and variation in the threshold voltages of the memory cells 202 can be reduced. FIG. 17 and FIG. 18 each show an example in which the above writing and verify reading are performed j times. That is, j-th writing is performed in a period 314 and j-th verify reading is performed in a period 315.

Data "i" shown in FIG. 18 can be written in a manner similar to that in the case of writing data "0" shown in FIG. 17.
(Memory Cell)

Figure 19:
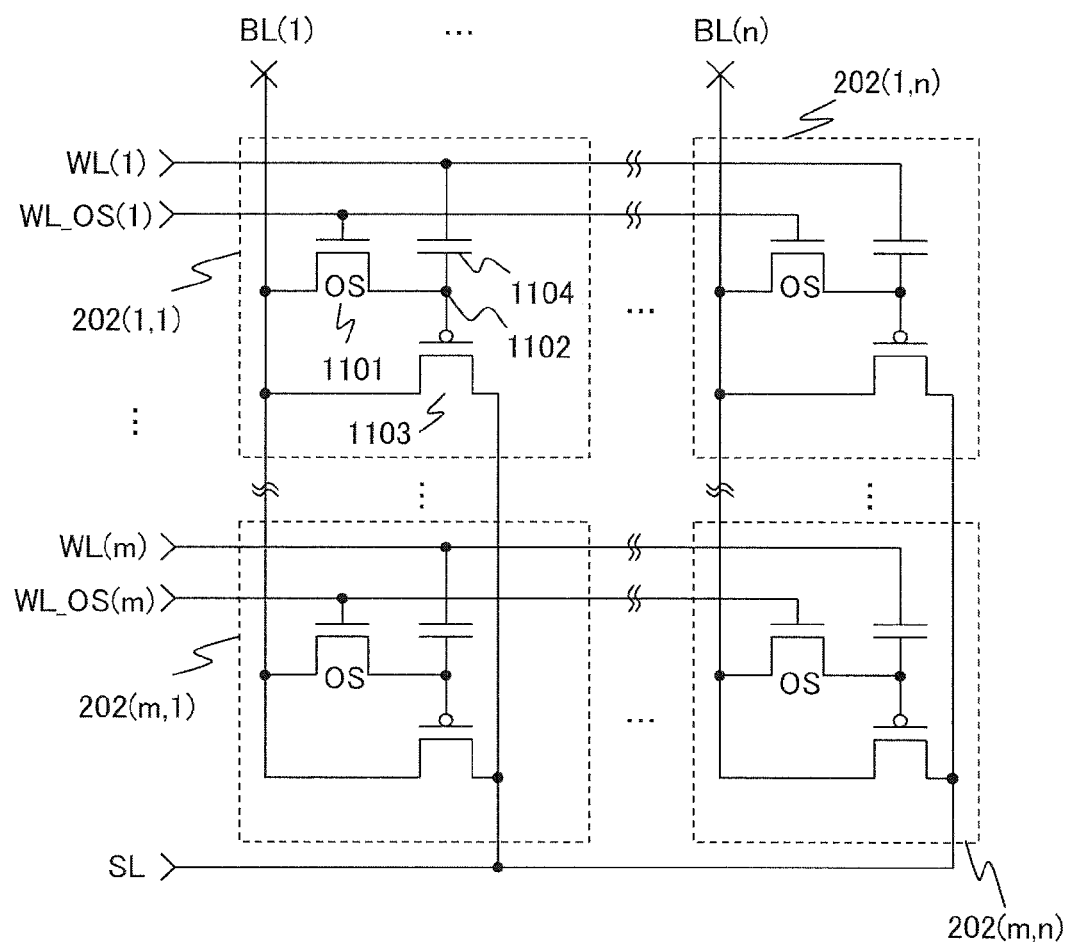
FIG. 19 is a circuit diagram of memory cells included in a semiconductor device.
Figure 20:
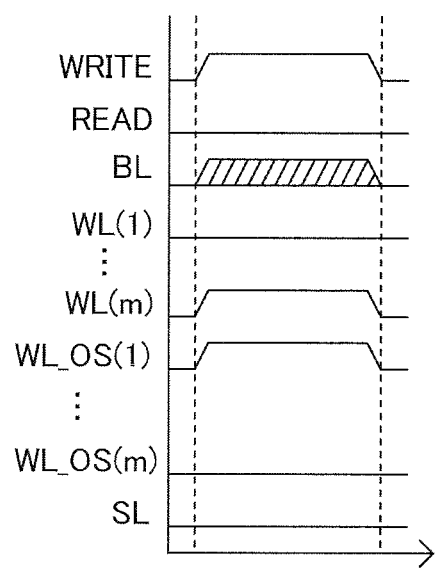
FIG. 20 is a timing chart of memory cells included in a semiconductor device.

FIG. 19 illustrates the memory cells 202(1,1) to 202(m,n) in FIG. 12. FIG. 20 is a timing chart of the memory cells 202 in writing.

First, a configuration of the memory cell 202 will be described. In the memory cell 202(1,1), the bit line BL(1) is electrically connected to a drain electrode of a transistor 1101, a gate electrode of the transistor 1101 is electrically connected to a word line WL_OS(1), a source electrode of the transistor 1101 and a gate electrode of a transistor 1103 are electrically connected to one electrode of a capacitor 1104, and the other electrode of the capacitor 1104 is connected to a word line WL(1). Further, the bit line BL(1) is electrically connected to a source electrode of the transistor 1103, and the transistor 1103 is electrically connected to the signal line SL. One memory cell 202 has the above configuration.

Next, writing operation will be described with reference to FIG. 20. When data is written into the memory cells 202, the potential of the write signal line WRITE is raised to the high potential VH and a write potential is supplied to the bit lines BL(1) to BL(n). The potential of the write signal line WRITE and the potential of any of word lines WL_OS(1) to WL_OS(m) are raised to the high potential VH at the same time. For example, when the potential of the word line WL_OS(1) is raised to the high potential VH, the high potential VH is applied to the gate electrode of the transistor 1101 and gate electrodes of all transistors in the first row which are electrically connected to the word line WL_OS(1), so that each of the transistors is turned on. Then, charge with a potential equal to the write potential supplied to the bit line BL(1) is stored in a floating node 1102 in the memory cell 202. After that, the potential of the write signal line WRITE and the potential of the word line WL_OS(1) are lowered to the potential VL, so that the transistor 1101 and all the transistors in the first row whose gate electrodes are electrically connected to the word line WL_OS(1) are turned off and writing is completed. The transistor 1101 has a characteristic of extremely low off-state current, which facilitates holding of charge stored in the floating node 1102 and reading of stored data. Note that a shaded portion in the drawing indicates given data.

The high potential VH is supplied to the signal line SL in reading and verify reading, and the low potential VL is supplied to the signal line SL in operation other than reading and verify reading.
(Reading Circuit)

Figure 21:
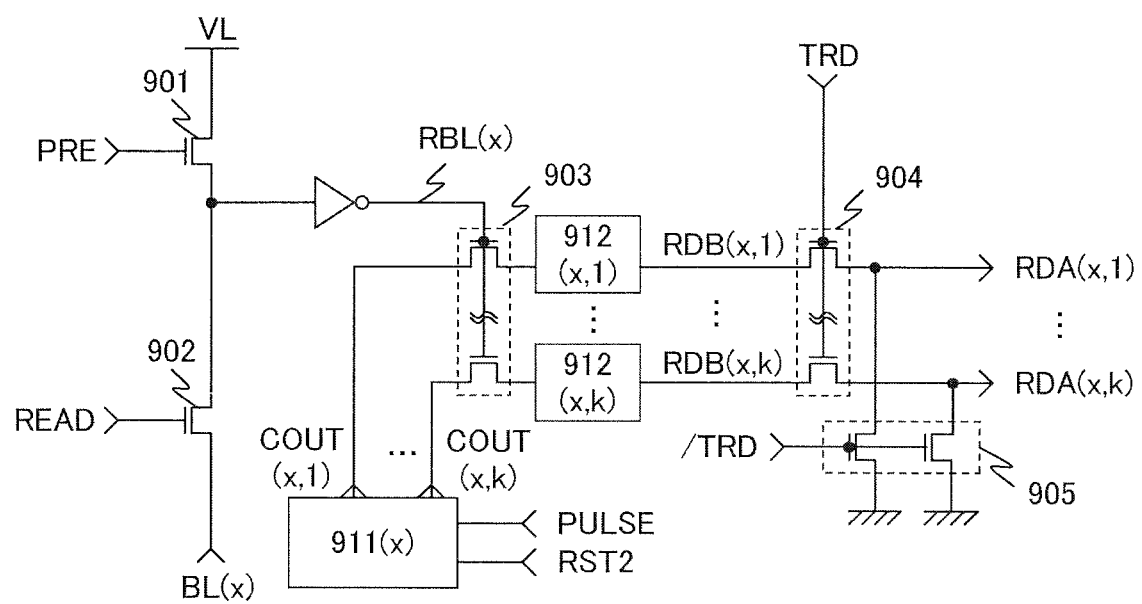
FIG. 21 is a circuit diagram of a reading circuit included in a semiconductor device.
Figure 22:
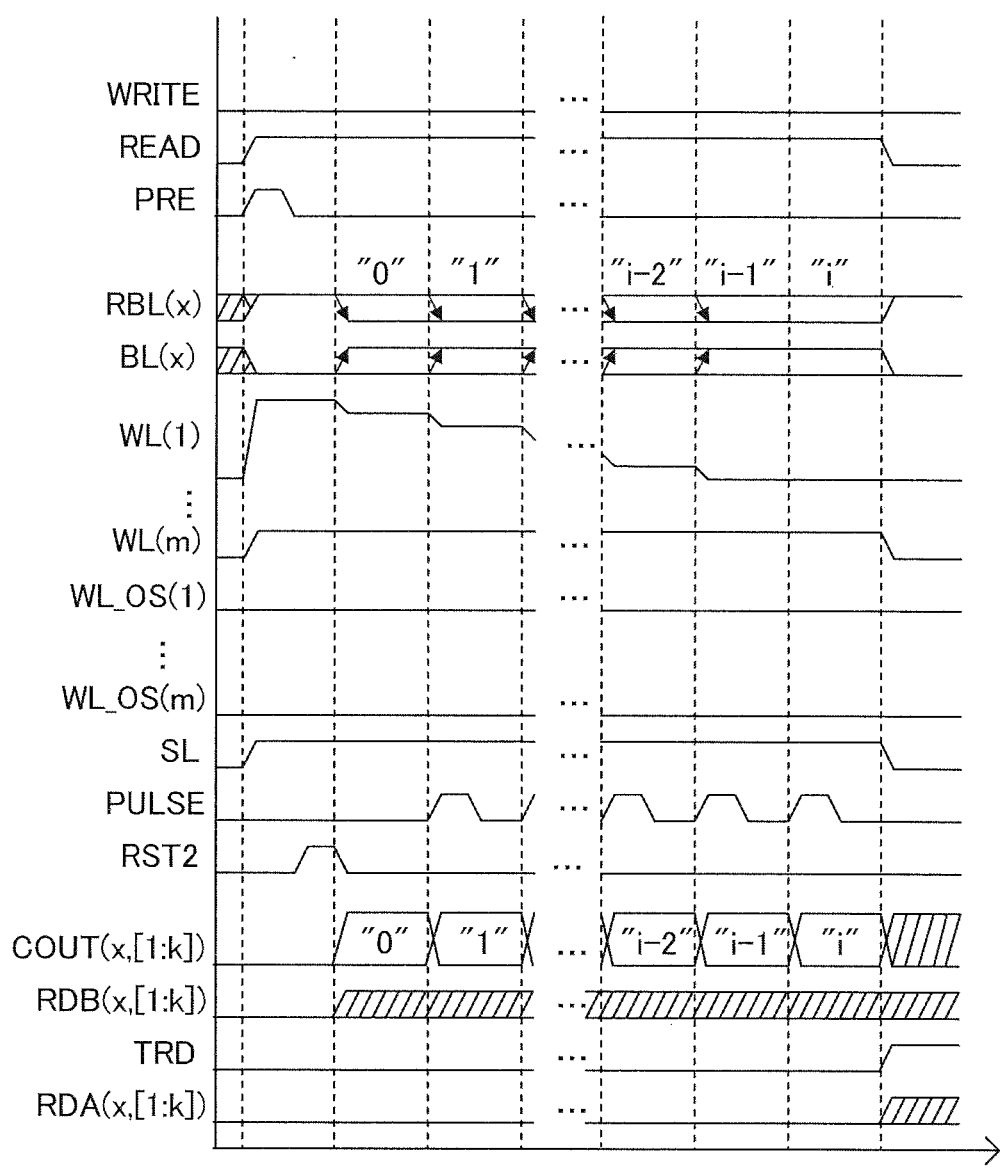
FIG. 22 is a timing chart of a reading circuit included in a semiconductor device.

FIG. 21 illustrates an example of a configuration of the reading circuit 214 in FIG. 12. FIG. 22 is a timing chart in reading and verify reading. The reading circuit 214 has a function of reading data written into the memory cell 202.

First, a configuration of the reading circuit 214 will be described with reference to FIG. 21. The reading circuit 214 has the following configuration. The low potential VL is applied to a drain electrode of a transistor 901. A gate electrode of the transistor 901 is electrically connected to the signal line PRE. A source electrode of the transistor 901 and a drain electrode of a transistor 902 are electrically connected to an input terminal of an inverter. An output terminal of the inverter is connected to a signal line RBL(x). The signal line RBL(x) is electrically connected to each gate electrode of transistors 903. Further, a gate electrode of the transistor 902 is electrically connected to the read signal line READ, and a source electrode of the transistor 902 is electrically connected to the bit line BL(x). Drain electrodes of the transistors 903 are electrically connected to respective signal lines COUT(x, 1) to COUT(x,k). The signal lines COUT(x,1) to COUT(x,k) are electrically connected to output terminals of a counter 911(x). Input terminals of the counter 911(x) are electrically connected to the signal line PULSE and the signal line RST2. Source electrodes of the transistors 903 are electrically connected to respective input terminals of latch circuits 912(x,1) to 912(x,k). Output terminals of the latch circuits 912(x,1) to 912(x,k) are electrically connected to respective drain electrodes of transistors 904. Each gate electrode of the transistors 904 is electrically connected to the signal line TRD. Source electrodes of the transistors 904 and drain electrodes of transistors 905 are electrically connected to the respective signal lines RDA(x,1) to RDA(x,k). Each gate electrode of the transistors 905 is electrically connected to a signal line /TRD. Each source electrode of the transistors 905 is grounded (or supplied with a low potential).

Next, operation of the reading circuit 214 will be described with reference to FIG. 22. When reading or verify reading is performed, the potential of the read signal line READ and the potential of the signal line PRE are raised to the high potential VH, so that the transistor 901 and the transistor 902 are turned on. Then, the potential of the bit line BL(x) becomes equal to the low potential VL. At this time, the potential of the signal line RBL(x) is raised to the high potential VH, so that the high potential VH is applied to the gate electrodes of the transistors 903 and the transistors 903 are turned on. At the same time, the high potential VH is also supplied to the signal line SL and the word lines WL(1) to WL(m) of the memory cells 202 in FIG. 19, so that the potentials of the signal line SL and the word lines WL(1) to WL(m) are raised to the high potential VH. Note that in FIG. 22, the vertical axis of WL(1) is expanded in order to emphasize the change in potential; however, the maximum potential supplied to WL(1) is equal to the high potential VH.

After that, the potential of the signal line PRE is lowered to the low potential VL, so that the transistor 901 is turned off and the bit line BL(x) is brought into a floating state while keeping the low potential VL. Here, given that the threshold voltage of the memory cell 202 in the case where data "0" is written into the memory cell 202 is $V_{th\_L0}$ (<0 V) and that the threshold voltages of the memory cell 202 in the case where data "1" to "i" is written into the memory cell 202 are $V_{th\_L1}$ to $V_{th\_Li}$, respectively, the amount of charge stored in the gate electrode of the transistor 1103 is larger in the case where data "1" to "i" is written than in the case where data "0" is written. Accordingly, the threshold voltages $V_{th\_L1}$ to $V_{th\_Li}$ of the memory cell 202 are lower than the threshold voltage $V_{th\_L0}$ of the memory cell 202. Then, the low potential VL is applied to the drain electrode of the transistor 1103 in the memory cell 202, the high potential VH is applied to the source electrode of the transistor 1103, and the high potential VH is supplied to the word line WL(z) (z is an integer greater than or equal to 1 and less than or equal to m) of the memory cell 202 on which reading is performed; consequently, the memory cell 202 is turned off and the bit line BL(x) keeps the low potential VL.

When a pulse is input to the signal line RST2 in FIG. 22, the counter 911 is reset, the low potential VL is output to each of the signal lines COUT(x,1) to COUT(x,k), and data of the signal lines COUT(x,1) to COUT(x,k) is held in the respective latch circuits 912(x,1) to 912(x,k). At the same time as fall of the pulse of the signal line RST2, the potential supplied to the word line WL(z) of the memory cell 202 on which reading is performed is lowered from the high potential VH to a potential at which data "0" can be read, that is, the sum of the high potential VH and $V_{th\_L0}$ ($V_{th\_L0}$<0 V) and whether data "0" or any of data "1" to "i" is written into the memory cell 202 is determined. In the case where data "0" is written, the transistor 1103 in the memory cell 202 is turned on; as a result, the potential of the bit line BL(x) is raised from the low potential VL to the high potential VH, the potential of the signal line RBL(x) is lowered to the low potential VL, the low potential VL is applied to each of the gate electrodes of the transistors 903, and the transistors 903 are turned off. On the other hand, in the case where data other than data "0" is written, the transistor 1103 in the memory cell 202 is turned off; as a result, the bit line BL(x) keeps the low potential VL, the signal line RBL(x) keeps the high potential VH, and the transistors 903 remain in an on state.

After that, a pulse is input to the signal line PULSE and data in the counter 911(x) is increased by "1"; at the same time, data of the signal lines COUT(x,1) to COUT(x,k) is also changed. At this time, in the case where the transistors 903 are in an off state, that is, in the case where data "0" is written, the data of the signal lines COUT(x,1) to COUT(x,k) is not input to the latch circuits 912(x,1) to 912(x,k) and the latch circuits 912(x,1) to 912(x,k) remain in the state of data "0". On the other hand, in the case where the transistors 903 are in an on state, that is, in the case where data other than data "0" is written, the data of the signal lines COUT(x,1) to COUT(x,k) is input to the latch circuits 912(x,1) to 912(x,k) and the state of the latch circuits 912(x,1) to 912(x,k) is changed to the state of data "1". At the same time as input of a pulse to the signal line PULSE, the potential supplied to the word line WL(z) of the memory cell 202 on which reading is performed is lowered from the sum of the high potential VH and $V_{th\_L0}$ to a potential at which data "1" can be read, that is, the sum of the high potential VH and $V_{th\_L1}$ ($V_{th\_L1}$<$V_{th\_L0}$<0 V) and whether either of data "0" and "1" or any of data "2" to "i" is written into the memory cell 202 is determined.

By repeating the above-described procedure, data read from the memory cells 202 is held in the latch circuits 912(x,1) to 912(x,k). After whether the data is any of "0" to "i=1" or "i" is determined, the potential of the read signal line READ is lowered to the low potential VL, the transistor 902 is turned off, and the potential of the signal line SL of the memory cell 202 is also lowered to the low potential VL. The potential of the signal line TRD is raised to the high potential VH, so that the transistors 904 are each turned on. Then, the read data held in the latch circuits 912(x,1) to 912(x,k) is output to the signal lines RDA(x,1) to RDA(x,k) through the signal lines RDB(x,1) to RDB(x,k), respectively. The potential of the signal line TRD is lowered to the low potential VL after output of the read data, so that the transistors 904 are each turned off. Meanwhile, the potential of the signal line /TRD is raised to the high potential VH, so that the transistors 905 are each turned on and the signal lines RDA(x,1) to RDA(x,k) are each grounded (or supplied with a low potential).

(Verifying Circuit)

Figure 23:
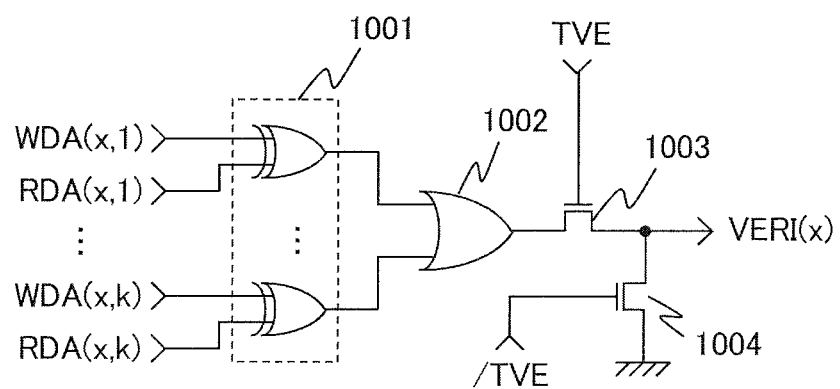
FIG. 23 is a circuit diagram of a verifying circuit included in a semiconductor device.
Figure 24:
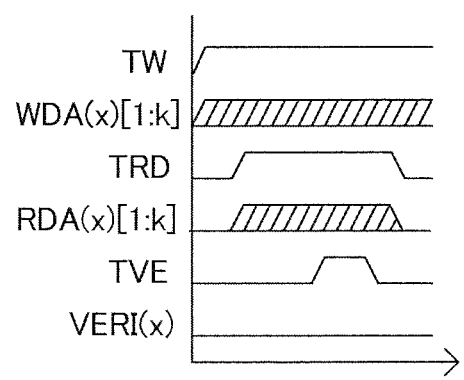
FIG. 24 is a timing chart of a verifying circuit included in a semiconductor device.
Figure 25:
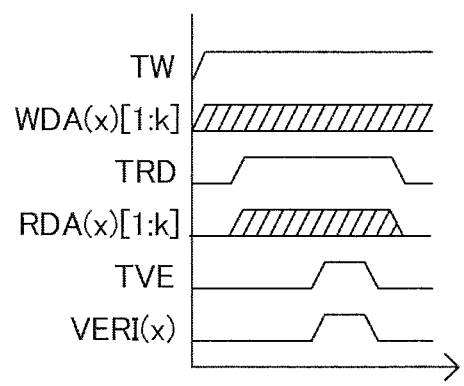
FIG. 25 is a timing chart of a verifying circuit included in a semiconductor device.

FIG. 23 illustrates an example of a configuration of the verifying circuit 213. FIG. 24 and FIG. 25 are timing charts showing operation of the verifying circuit 213. The verifying circuit 213 functions to compare write data with data of verify reading and to judge whether writing is normally completed or not.

First, a configuration of the verifying circuit 213 will be described with reference to FIG. 23. The verifying circuit 213 has the following configuration. Pairs of the signal lines WDA(x,1) to WDA(x,k) and the signal lines RDA(x,1) to RDA(x,k) are electrically connected to respective input terminals of two-input one-output XOR circuits 1001. Output terminals of the two-input one-output XOR circuits 1001 are electrically connected to input terminals of a k-input one-output OR circuit 1002. An output terminal of the k-input one-output OR circuit 1002 is electrically connected to a drain electrode of a transistor 1003. A gate electrode of the transistor 1003 is electrically connected to the signal line TVE. A source electrode of the transistor 1003 and a drain electrode of a transistor 1004 are electrically connected to the signal line VERI(x). A gate electrode of the transistor 1004 is electrically connected to a signal line /TVE. A source electrode of the transistor 1004 is grounded (or supplied with a low potential).

Next, operation of the verifying circuit 213 will be described with reference to FIG. 24 and FIG. 25. When writing is performed, the potential of the write data transfer signal line TW is raised to the high potential VH and write data is input to the signal lines WDA(x,1) to WDA(x,k). Then, writing is performed on the memory cells 202, and verify reading is performed after completion of writing. When verify reading is performed, a pulse is input to the signal line TRD of the reading circuit 214 and data of verify reading is input to the signal lines RDA(x,1) to RDA(x,k). When the write data is input to the signal lines WDA(x,1) to WDA(x,k) and the data of verify reading is input to the signal lines RDA(x,1) to RDA(x,k), the low potential VL is output as an output potential of the XOR circuit 1001 in the case where the potentials of the signal line WDA(x,1) and the signal line RDA(x,1) are both the low potential VL or the high potential VH. On the other hand, in the case where one of input potentials of the signal line WDA(x,1) and the signal line RDA(x,1) is the low potential VL and the other thereof is the high potential VH, the high potential VH is output as an output potential of the XOR circuit 1001. In a manner similar to that described above, the potentials of the signal lines WDA(x,2) to WDA(x,k) and the signal lines RDA(x,2) to RDA(x,k) are compared with each other, respectively, by the XOR circuits 1001, and the low potential VL or the high potential VH is output as output potentials of the XOR circuits 1001.

Each output of the XOR circuits 1001 is input to the OR circuit 1002. In the case where the high potential VH is output as at least one of the output potentials of the XOR circuits 1001, the high potential VH is output as an output potential of the OR circuit 1002. On the other hand, in the case where all the output potentials of the XOR circuits 1001 are the low potential VL, the low potential VL is output as an output potential of the OR circuit 1002. Then, the potential of the signal line TVE is raised to the high potential VH, so that the transistor 1003 is turned on. In the case where the output of the OR circuit 1002 is the high potential VH (i.e., in the case of Verify NG), the potential of the signal line VERI(x) is raised to the high potential VH as shown in FIG. 25. In the case where the output of the OR circuit 1002 is the low potential VL (i.e., in the case of Verify OK), the potential of the signal line VERI(x) is the low potential VL as shown in FIG. 24. In a period during which write data and data of verify reading are not compared with each other, the high potential VH is supplied to the signal line /TVE to turn on the transistor 1004. As a result, the signal line VERI(x) is grounded (or a supplied with a low potential). Note that a shaded portion in FIG. 24 indicates given data, and WDA(x)[1:k] and RDA(x)[1:k] have the same data. In addition, a shaded portion in FIG. 25 indicates given data, and WDA(x)[1:k] and RDA(x)[1:k] have different data.

Note that the verifying circuit 213 can be formed using known circuits in combination without being limited to the circuit in FIG. 23. As the verifying circuit 213, a circuit configured to compare write data with data of verify reading and output a pulse to the signal line VERI(x) in the case where the write data and the data of verify reading are different may be used.

In the semiconductor device according to the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 6

In this embodiment, a circuit configuration and operation of a semiconductor device according to one embodiment of the disclosed invention will be described with reference to FIG. 26.

Figure 26:
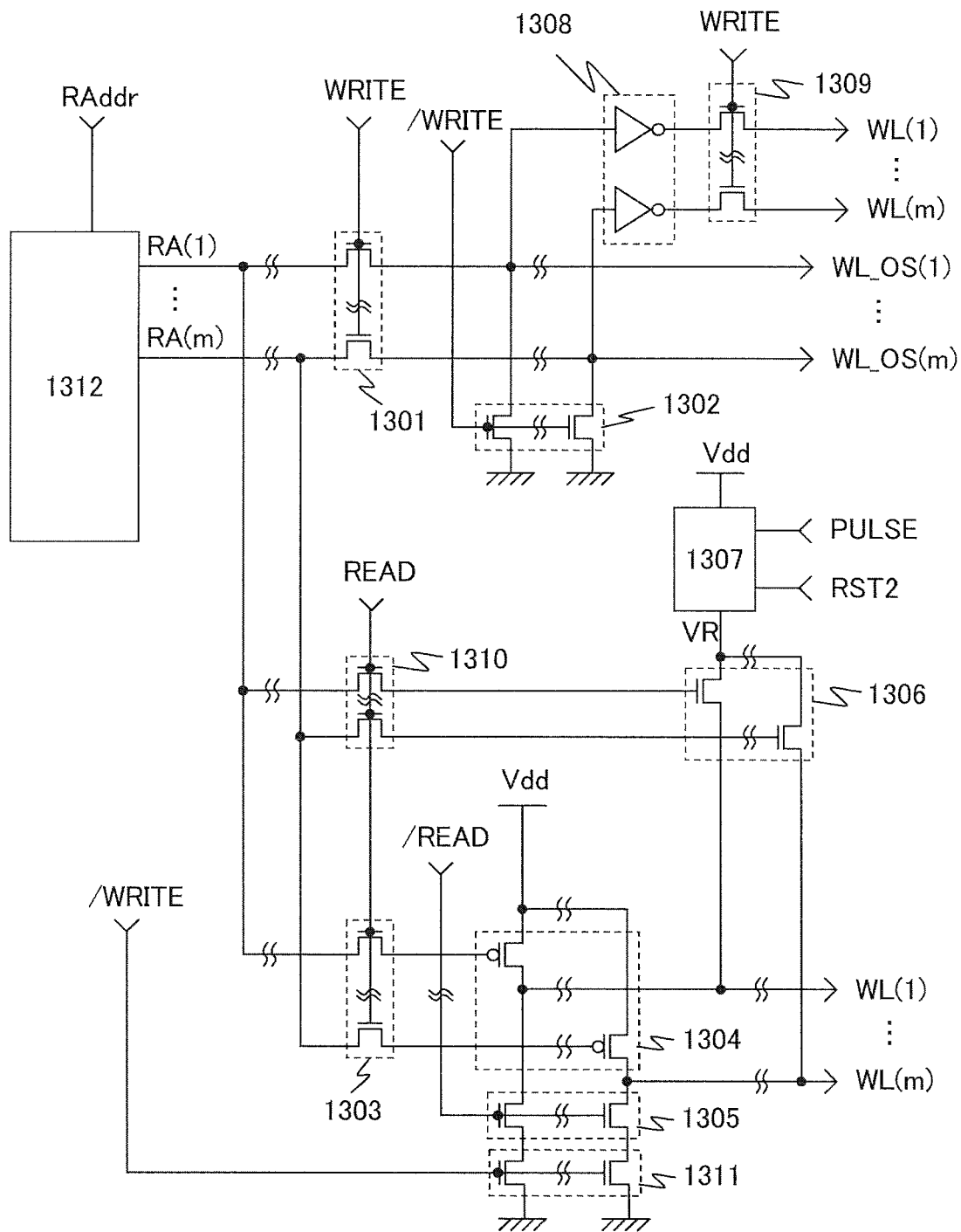
FIG. 26 is a circuit diagram of a word line driver circuit.

FIG. 26 illustrates an example of a word line driver circuit for driving the memory cells 202 illustrated in FIG. 19. The word line driver circuit has a function of controlling potentials of the word lines WL(1) to WL(m) and the word lines WL_OS(1) to WL_OS(m) illustrated in FIG. 19 in writing, reading, and verify reading.

First, a configuration of the word line driver circuit will be described with reference to FIG. 26. The word line driver circuit has the following configuration. A signal line RAddr is electrically connected to an input terminal of a decoder 1312. Signal lines RA(1) to RA(m) are electrically connected to respective output terminals of the decoder 1312. The signal lines RA(1) to RA(m), drain electrodes of transistors 1301, and drain electrodes of transistors 1310 are electrically connected to respective drain electrodes of transistors 1303. Each gate electrode of the transistors 1301 is electrically connected to the write signal line WRITE. Source electrodes of the transistors 1301, drain electrodes of transistors 1302, and input terminals of inverters 1308 are electrically connected to the respective word lines WL_OS(1) to WL_OS(m). Each gate electrode of the transistors 1302 is electrically connected to an inverted write signal line /WRITE. Each source electrode of the transistors 1302 is grounded (or supplied with a low potential). Output terminals of the inverters 1308 are electrically connected to respective drain electrodes of transistors 1309. Each gate electrode of the transistors 1309 is electrically connected to the write signal line WRITE. Source electrodes of the transistors 1309 are electrically connected to the respective word lines WL(1) to WL(m). Each gate electrode of the transistors 1303 and each gate electrode of the transistor 1310 are electrically connected to the read signal line READ. Source electrodes of the transistors 1310 are electrically connected to respective gate electrodes of transistors 1306. Source electrodes of the transistors 1303 are electrically connected to respective gate electrodes of transistors 1304. The power supply potential Vdd is applied to each source electrode of the transistors 1304. Drain electrodes of the transistors 1304, drain electrodes of transistors 1305, and source electrodes of the transistors 1306 are electrically connected to the respective word lines WL(1) to WL(m). Each gate electrode of the transistors 1305 is electrically connected to an inverted read signal line /READ. Source electrodes of the transistors 1305 are electrically connected to respective drain electrodes of transistors 1311. Each gate electrode of the transistors 1311 is electrically connected to the inverted write signal line /WRITE. Each source electrode of the transistors 1311 is grounded (or supplied with a low potential). Each drain electrode of the transistors 1306 is electrically connected to a signal line VR. The signal line VR is electrically connected to an output terminal of a resistance selection circuit 1307. The signal line PULSE is electrically connected to an input terminal of the resistance selection circuit 1307. The signal line RST2 is electrically connected to an input terminal of the resistance selection circuit 1307. The power supply potential Vdd is applied to an input terminal of the resistance selection circuit.

Next, operation of the word line driver circuit will be described. In writing operation, a signal that specifies a row address where writing is performed is input to the decoder 1312 through the signal line RAddr. In accordance with the signal of the signal line RAddr, the decoder 1312 outputs the high potential VH to only one signal line of the signal lines RA(1) to RA(m) and outputs the low potential VL to the other signal lines. Then, the potential of the write signal line WRITE is raised to the high potential VH to turn on each of the transistors 1301, so that potentials of the signal lines RA(1) to RA(m) are output to the respective word lines WL_OS(1) to WL_OS(m). When the transistors 1301 are each turned on, the potentials of the signal lines RA(1) to RA(m) are also input to the respective input terminals of the inverters 1308. Since the potential of the write signal line WRITE is raised to the high potential VH, the transistors 1309 are turned on and potentials of the output terminals of the inverters 1308, that is, inverted signals of signals of the signal lines RA(1) to RA(m) are output to the respective word lines WL(1) to WL(m). On the other hand, when writing operation is not performed, the high potential VH is supplied to the inverted write signal line /WRITE having an inverted signal of that of the write signal line WRITE to turn on the transistors 1302, so that the word lines WL_OS(1) to WL_OS(m) are each grounded (or supplied with a low potential). In addition, the low potential VL is supplied to the write signal line WRITE to turn off the transistors 1309, so that WL(1) to WL(m) are insulated from the respective output terminals of the inverters 1308.

In reading operation and verify reading operation, a signal that specifies a row address where data reading is performed is input to the decoder 1312 through the signal line RAddr. In accordance with the signal of the signal line RAddr, the decoder 1312 outputs the high potential VH to only one signal line of the signal lines RA(1) to RA(m) and outputs the low potential VL to the other signal lines. Then, the high potential VH is supplied to the read signal line READ to turn on the transistors 1303 and the transistors 1310, so that potentials of the signal lines RA(1) to RA(m) are applied to the respective gate electrodes of the transistors 1304 and the respective gate electrodes of the transistors 1306. The potentials of the signal lines RA(1) to RA(m) except for the one selected signal line are all the low potential VL; thus, the low potential VL is applied to the gate electrodes of the transistors 1304 electrically connected to row addresses that are not selected, so that the transistors 1304 are turned on and the potentials of the word lines WL(1) to WL(m) (except for the word line WL(z) connected to the selected row address) connected to the row addresses that are not selected are raised to the high potential VH. On the other hand, the high potential VH is supplied to the signal line RA(z) in the selected row address; thus, the transistor 1304 whose gate electrode is electrically connected to the signal line RA(z) is turned off. In reading operation and verify reading operation, the transistors 1310 are turned on and the potentials of the signal lines RA(1) to RA(m) are applied to the respective gate electrodes of the transistors 1306. The transistor is turned off when the low potential VL is applied to the gate electrode thereof, whereas the transistor is turned on when the high potential VH is applied to the gate electrode thereof; accordingly, a potential VR is supplied to the selected word line WL(z). At this time, the potential VR is controlled by the resistance selection circuit. The resistance selection circuit functions to output the potential VR so that the potential VR equals to the high potential VH when a pulse is input to the signal line RST2 and to lower the potential VR every time a pulse is input to the signal line PULSE.

When none of writing, reading, and verify reading is performed, both the potential of the inverted read signal line /READ and the potential of the inverted write signal line /WRITE are the high potential VH; thus, the transistors 1305 and the transistors 1311 are all turned on and the word lines WL(1) to WL(m) are grounded (or supplied with a low potential).

The structures, methods, and the like described in this embodiment can be combined as appropriate with any of the structures, methods, and the like described in the other embodiments.

Embodiment 7

Figure 28A:
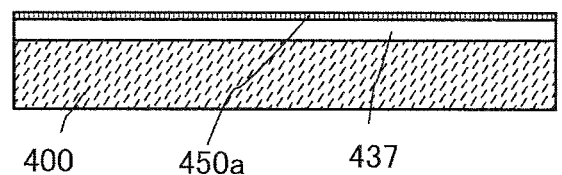
FIGS. 28A to 28C are cross-sectional views illustrating a manufacturing process of a semiconductor device.
Figure 28B:
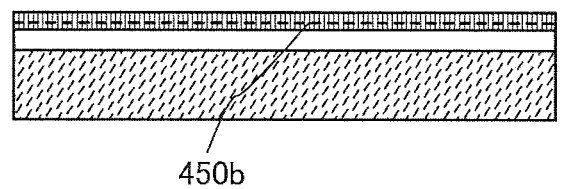

One embodiment of an oxide semiconductor layer which can be used as any of the semiconductor layers of the transistors in the above embodiments will be described with reference to FIGS. 28A to 28C.

The oxide semiconductor layer of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over an insulating layer 400. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon nitride film, a silicon oxynitride film, an aluminum oxynitride film, and a silicon nitride oxide film or a stack of any of these films can be used.

Next, a first oxide semiconductor layer with a thickness greater than or equal to 1 nm and less than or equal to 10 nm is formed over the insulating layer 437. The first oxide semiconductor layer is formed by a sputtering method, and the substrate temperature in the film formation by a sputtering method is set to be higher than or equal to 200° C. and lower than or equal to 400° C.

In this embodiment, the first oxide semiconductor layer is formed to a thickness of 5 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 28A).

Depending on the substrate temperature at the time of deposition or the temperature of the first heat treatment, the depostition or the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the amount of oxygen in the stoichiometric composition ratio.

Next, a second oxide semiconductor layer with a thickness more than 10 nm is formed over the first crystalline oxide semiconductor layer 450a. The second oxide semiconductor layer is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor layer is formed to a thickness of 25 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. Through the second heat treatment, a second crystalline oxide semiconductor layer 450b is formed (see FIG. 28B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 28C:
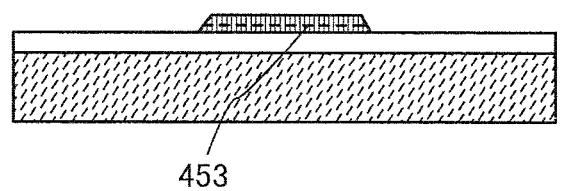

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 28C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

Note that examples of a material for the first crystalline oxide semiconductor layer and the second crystalline oxide semiconductor layer include a four-component metal oxide such as an In—Sn—Ga—Zn—O-based material; three-component metal oxides such as an In—Ga—Zn—O-based material (also referred to as IGZO), an In—Sn—Zn—O-based material (also referred to as ITZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above materials may include $SiO_2$. Here, for example, an In—Ga—Zn—O-based material means an oxide film including indium (In), gallium (Ga), and zinc (Zn), and there is no particular limitation on the composition ratio. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the transistor including an oxide semiconductor in Embodiment 1, the transistor 162 in Embodiment 2 and Embodiment 4, or the transistor 510 in Embodiment 3) which can be applied to a semiconductor device disclosed in this specification.

In a transistor in which the stack of the oxide semiconductor layers of this embodiment is used as an oxide semiconductor layer, an electric field is not applied from one surface to the other surface of the oxide semiconductor layer and current does not flow in the thickness direction (from one surface to the other surface; e.g., in the vertical direction in FIG. 11B) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be implemented in an appropriate combination with any of the structures described in the other embodiments.

Embodiment 8

In this embodiment, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 30A to 30E, FIGS. 31A to 31C, and FIGS. 32A to 32C. In FIGS. 30A to 30E, FIGS. 31A to 31C, and FIGS. 32A to 32C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 30A:
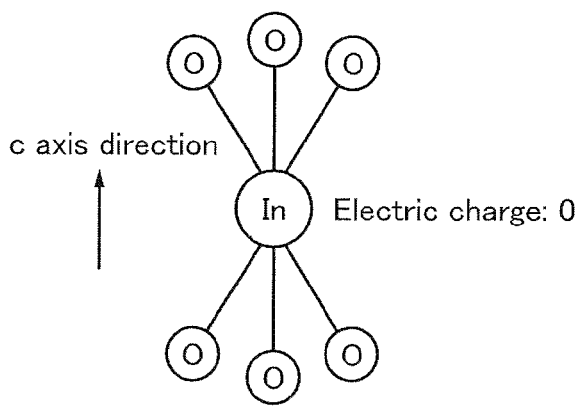
FIGS. 30A to 30E illustrate structures of oxide materials.

FIG. 30A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 30A is actually an octahedral structure, but is illustrated as a planar structure for simplicity. Note that three tetracoordinate O atoms exist in each of an upper half and a lower half in FIG. 30A. In the small group illustrated in FIG. 30A, electric charge is 0.

Figure 30D:
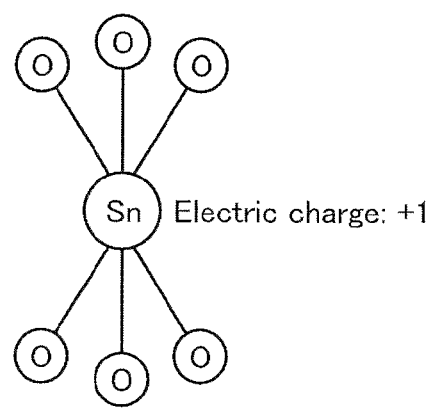
Figure 30B:
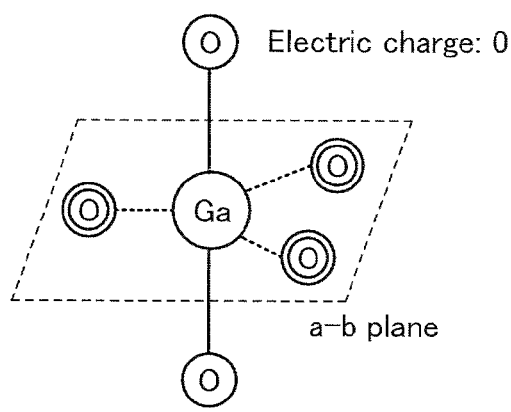

FIG. 30B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 30B. An In atom can also have the structure illustrated in FIG. 30B because an In atom can have five ligands. In the small group illustrated in FIG. 30B, electric charge is 0.

Figure 30E:
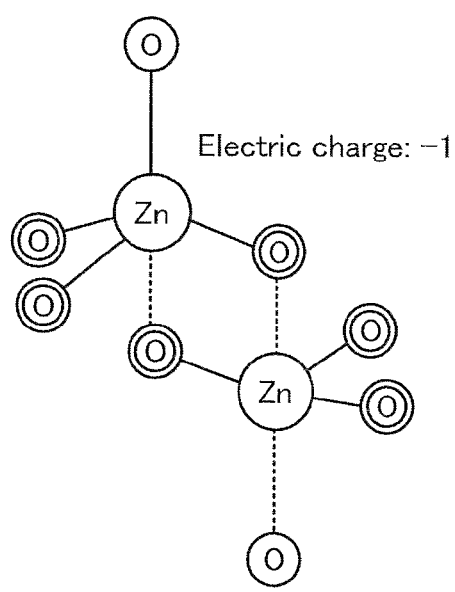
Figure 30C:
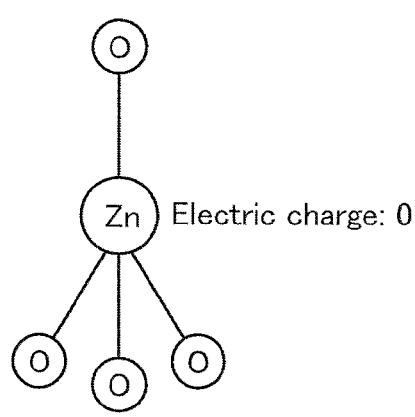

FIG. 30C illustrates a structure including one tetracoordinate Zn atom and four tetracoordinate O atoms proximate to the Zn atom. In FIG. 30C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 30C. In the small group illustrated in FIG. 30C, electric charge is 0.

FIG. 30D illustrates a structure including one hexacoordinate Sn atom and six tetracoordinate O atoms proximate to the Sn atom. In FIG. 30D, three tetracoordinate O atoms exist in each of an upper half and a lower half. In the small group illustrated in FIG. 30D, electric charge is +1.

FIG. 30E illustrates a small group including two Zn atoms. In FIG. 30E, one tetracoordinate O atom exists in each of an upper half and a lower half. In the small group illustrated in FIG. 30E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 30A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 31A illustrates a model of a medium group included in a layered structure of an In—Sn—Zn—O-based material. FIG. 31B illustrates a large group including three medium groups. Note that FIG. 31C illustrates an atomic arrangement in the case where the layered structure in FIG. 31B is observed from the c-axis direction.

In FIG. 31A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 31A, one tetracoordinate O atom existing in each of an upper half and a lower half with respect to an In atom is denoted by circled 1. FIG. 31A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 31A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 30E can be given. For example, with one small group including two Zn atoms, electric charge of one small group including a Sn atom can be cancelled, so that the total electric charge of the layered structure can be 0.

When the large group illustrated in FIG. 31B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_2(ZnO)_m$ (m is 0 or a natural number).

The above-described rule also applies to the following materials: a four-component metal oxide such as an In—Sn—Ga—Zn—O-based material; a three-component metal oxide such as an In—Ga—Zn—O-based material (also referred to as IGZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; and the like.

Figures 32A, 32B, 32C:
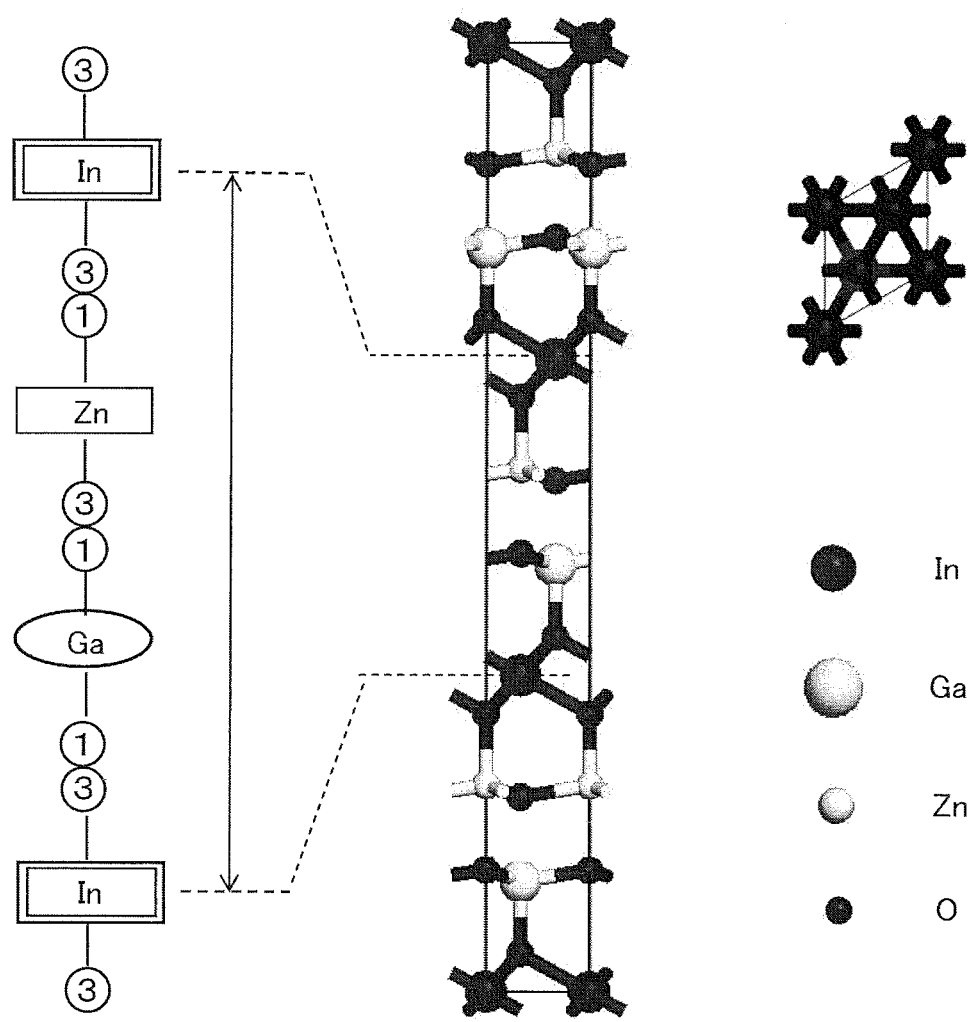
FIGS. 32A to 32C illustrate a structure of an oxide material.

As an example, FIG. 32A illustrates a model of a medium group included in a layered structure of an In—Ga—Zn—O-based material.

In the medium group included in the layered structure of the In—Ga—Zn—O-based material in FIG. 32A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 32B illustrates a large group including three medium groups. Note that FIG. 32C illustrates an atomic arrangement in the case where the layered structure in FIG. 32B is observed from the c-axis direction.

Here, since electric charge of a (hexacoordinate or pentacoordinate) In atom, electric charge of a (tetracooridinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 32A but also a medium group in which the arrangement of the In atom, the Ga atom, and the Zn atom is different from that in FIG. 32A.

Embodiment 9

In this embodiment, the field-effect mobility of a transistor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g}$$ [FORMULA 3]

Here, e represents the elementary charge, N represents the average defect density per unit area in a channel, ε represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L} \exp\left(-\frac{E}{kT}\right)$$ [FORMULA 4]

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) =$$ [FORMULA 5]

$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/cm^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right)$$ [FORMULA 6]

Here, D represents the electric field in the gate direction, and B and G are constants. B and G can be obtained from actual measurement results; according to the above measurement results, B is 4.75×10$^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 33:
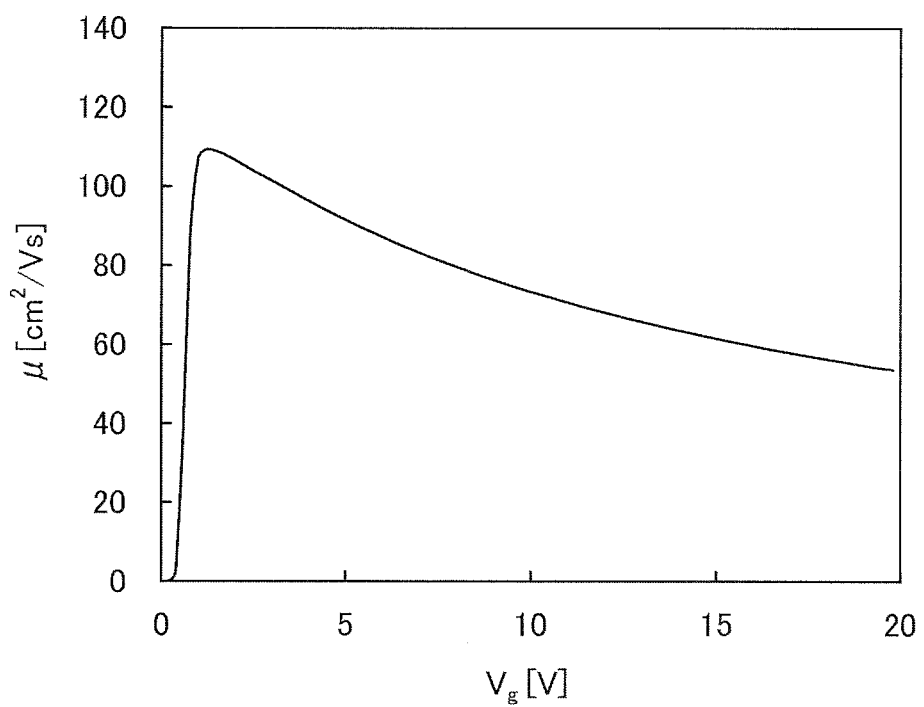
FIG. 33 shows gate voltage dependence of mobility obtained by calculation.

Calculation results of the mobility $\mu_2$ of a transistor whose channel includes an ideal oxide semiconductor without a defect inside the semiconductor are shown in FIG. 33. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 33, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 34A to 34C, FIGS. 35A to 35C, and FIGS. 36A to 36C. FIGS. 37A and 37B illustrate cross-sectional structures of the transistors used for the calculation. The transistors illustrated in FIGS. 37A and 37B each include a semiconductor region 2103a and a semiconductor region 2103c which have n$^+$-type conductivity in an oxide semiconductor layer. The resistivities of the semiconductor region 2103a and the semiconductor region 2103c are 2×10$^{-3}$ Ωcm.

The transistor illustrated in FIG. 37A is formed over a base insulating layer 2101 and an embedded insulator 2102 which is embedded in the base insulating layer 2101 and formed of aluminum oxide. The transistor includes the semiconductor region 2103a, the semiconductor region 2103c, an intrinsic semiconductor region 2103b serving as a channel formation region therebetween, and a gate 2105. The width of the gate 2105 is 33 nm.

A gate insulating layer 2104 is formed between the gate 2105 and the semiconductor region 2103b. In addition, a sidewall insulator 2106a and a sidewall insulator 2106b are formed on both side surfaces of the gate 2105, and an insulator 2107 is formed over the gate 2105 so as to prevent a short circuit between the gate 2105 and another wiring. The sidewall insulator has a width of 5 nm. A source 2108a and a drain 2108b are provided in contact with the semiconductor region 2103a and the semiconductor region 2103c, respectively. Note that the channel width of this transistor is 40 nm.

The transistor of FIG. 37B is the same as the transistor of FIG. 37A in that it is formed over the base insulating layer 2101 and the embedded insulator 2102 formed of aluminum oxide and that it includes the semiconductor region 2103a, the semiconductor region 2103c, the intrinsic semiconductor region 2103b provided therebetween, the gate 2105 having a width of 33 nm, the gate insulating layer 2104, the sidewall insulator 2106a, the sidewall insulator 2106b, the insulator 2107, the source 2108a, and the drain 2108b.

The transistor illustrated in FIG. 37A is different from the transistor illustrated in FIG. 37B in the conductivity type of semiconductor regions under the sidewall insulator 2106a and the sidewall insulator 2106b. In the transistor illustrated in FIG. 37A, the semiconductor regions under the sidewall insulator 2106a and the sidewall insulator 2106b are part of the semiconductor region 2103a having n⁺-type conductivity and part of the semiconductor region 2103c having n⁺-type conductivity, whereas in the transistor illustrated in FIG. 37B, the semiconductor regions under the sidewall insulator 2106a and the sidewall insulator 2106b are part of the intrinsic semiconductor region 2103b. In other words, in the semiconductor layer of FIG. 37B, a region having a width of $L_{off}$ which overlaps with neither the semiconductor region 2103a (the semiconductor region 2103c) nor the gate 2105 is provided. This region is called an offset region, and the width $L_{off}$ is called an offset length. As is seen from the drawing, the offset length is equal to the width of the sidewall insulator 2106a (the sidewall insulator 2106b).

Figure 34A:
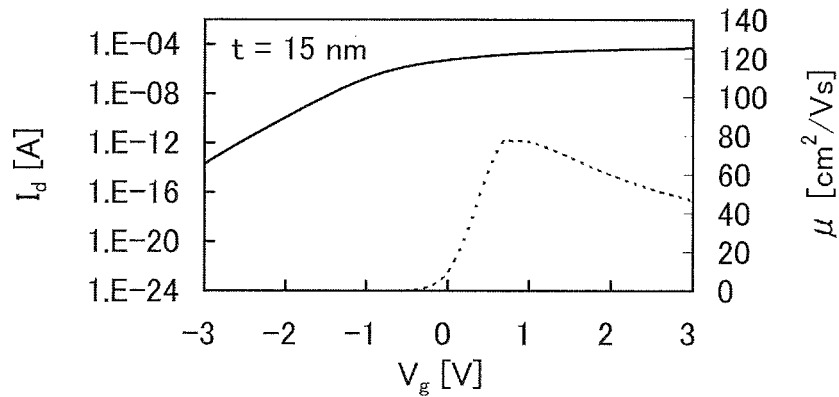
FIGS. 34A to 34C show gate voltage dependence of drain current and mobility obtained by calculation.
Figure 34B:
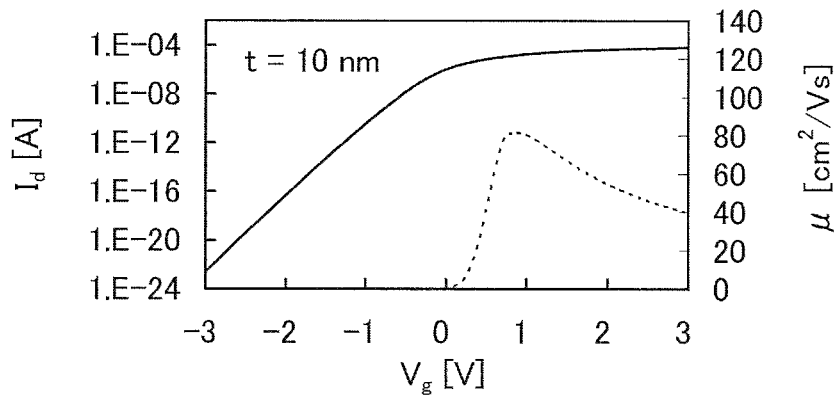
Figure 34C:
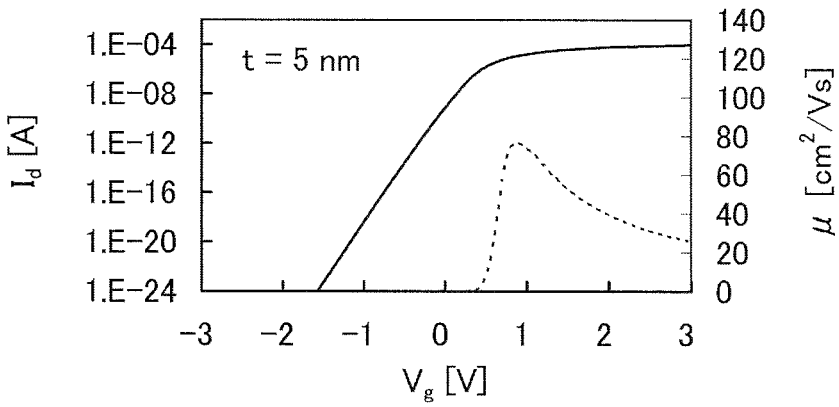

The other parameters used in calculation are as described above. For the calculation, device simulation software Sentaurus Device manufactured by Synopsys, Inc. was used. FIGS. 34A to 34C show the gate voltage ($V_g$: a potential difference between the gate and the source) dependence of the drain current ($I_d$, a solid line) and the mobility ($\mu$, a dotted line) of the transistor having the structure illustrated in FIG. 37A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 34A shows the gate voltage dependence of the transistor in the case where the thickness of the gate insulating layer is 15 nm, FIG. 34B shows that of the transistor in the case where the thickness of the gate insulating layer is 10 nm, and FIG. 34C shows that of the transistor in the case where the thickness of the gate insulating layer is 5 nm. As the gate insulating layer is thinner, the drain current $I_d$ particularly in an off state (off-state current) is significantly decreased. In contrast, there is no noticeable change in the peak value of the mobility $\mu$ and the drain current $I_d$ (on-state current) in an on state. The graphs show that the drain current exceeds 10 µA, which is required in a memory cell and the like, at a gate voltage of around 1 V.

Figure 35A:
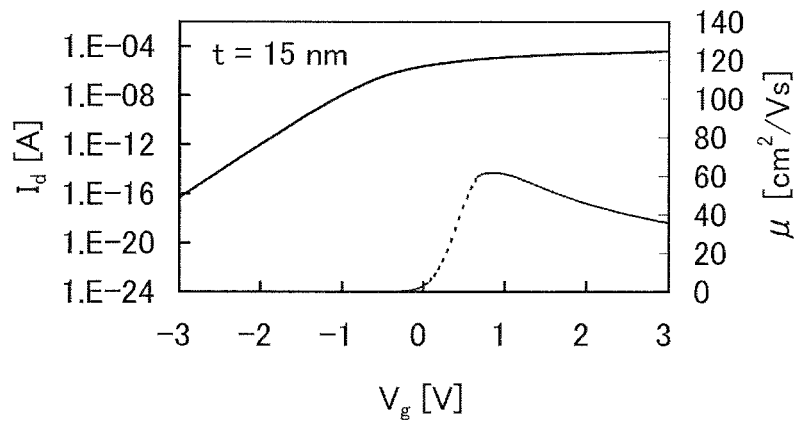
FIGS. 35A to 35C show gate voltage dependence of drain current and mobility obtained by calculation.
Figure 35B:
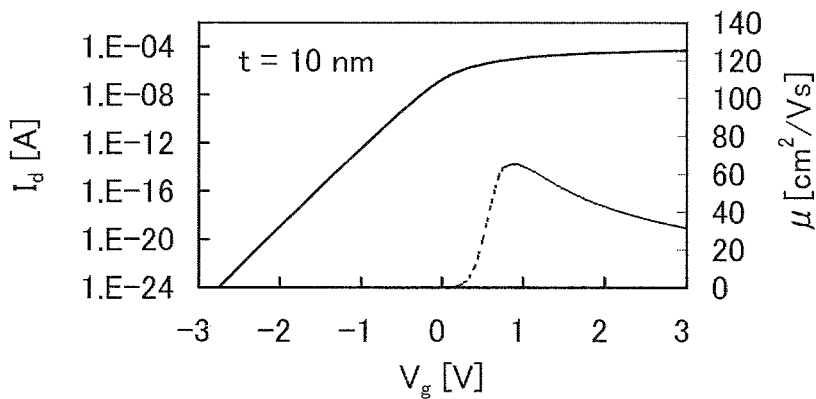
Figure 35C:
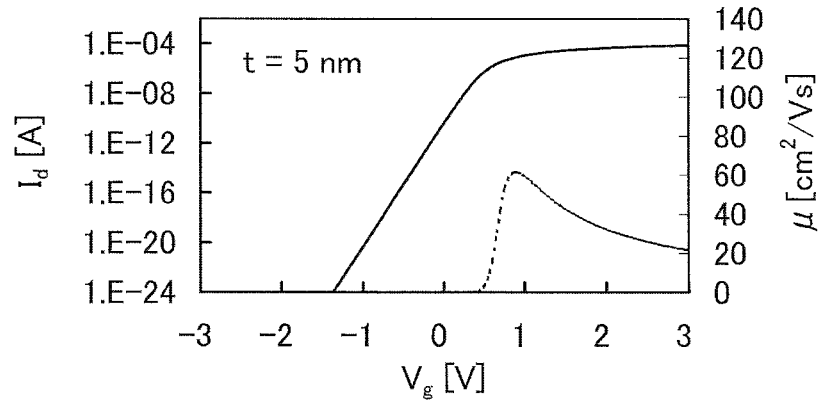

FIGS. 35A to 35C show the gate voltage $V_g$ dependence of the drain current $I_d$ (a solid line) and the mobility $\mu$ (a dotted line) of the transistor having the structure illustrated in FIG. 37B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 35A shows the gate voltage dependence of the transistor in the case where the thickness of the gate insulating layer is 15 nm, FIG. 35B shows that of the transistor in the case where the thickness of the gate insulating layer is 10 nm, and FIG. 35C shows that of the transistor in the case where the thickness of the gate insulating layer is 5 nm.

Figure 36A:
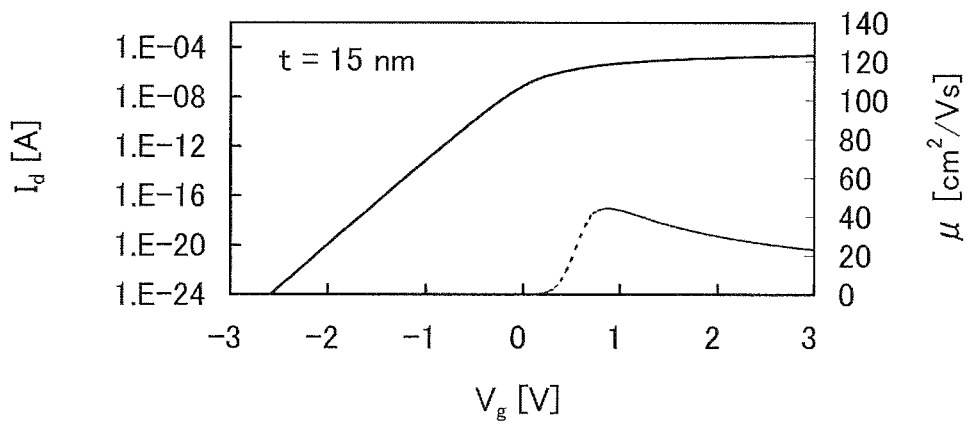
FIGS. 36A to 36C show gate voltage dependence of drain current and mobility obtained by calculation.
Figure 36B:
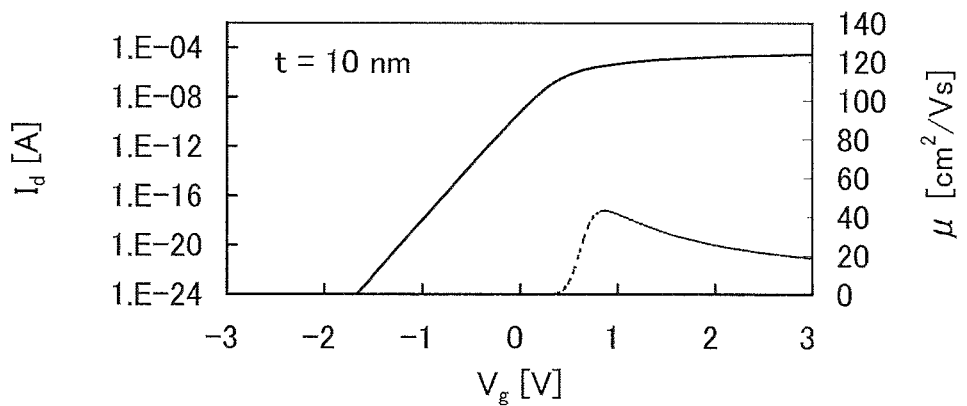
Figure 36C:
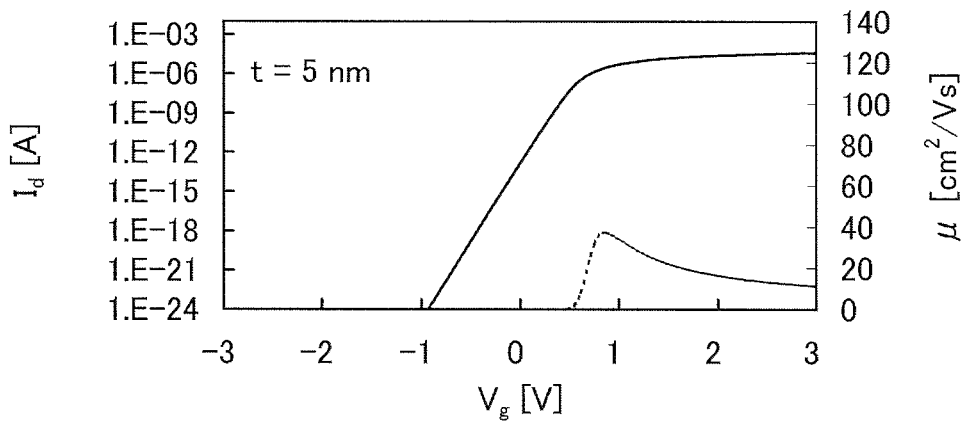
Figure 37A:
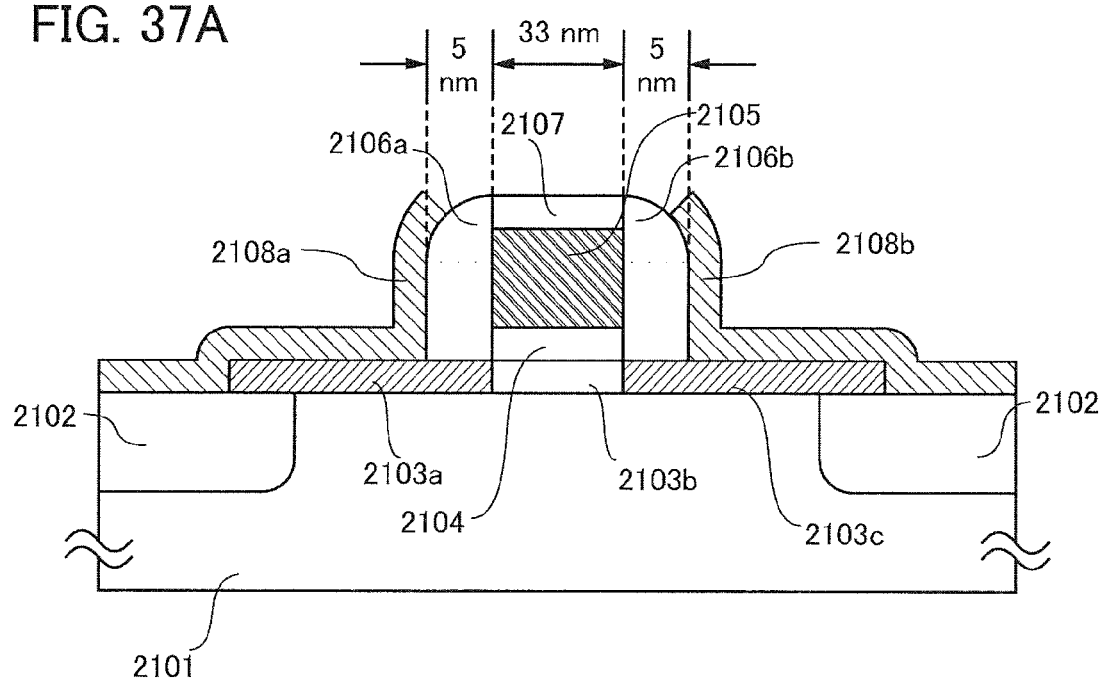
FIGS. 37A and 37B illustrate cross-sectional structures of transistors used for calculation.
Figure 37B:
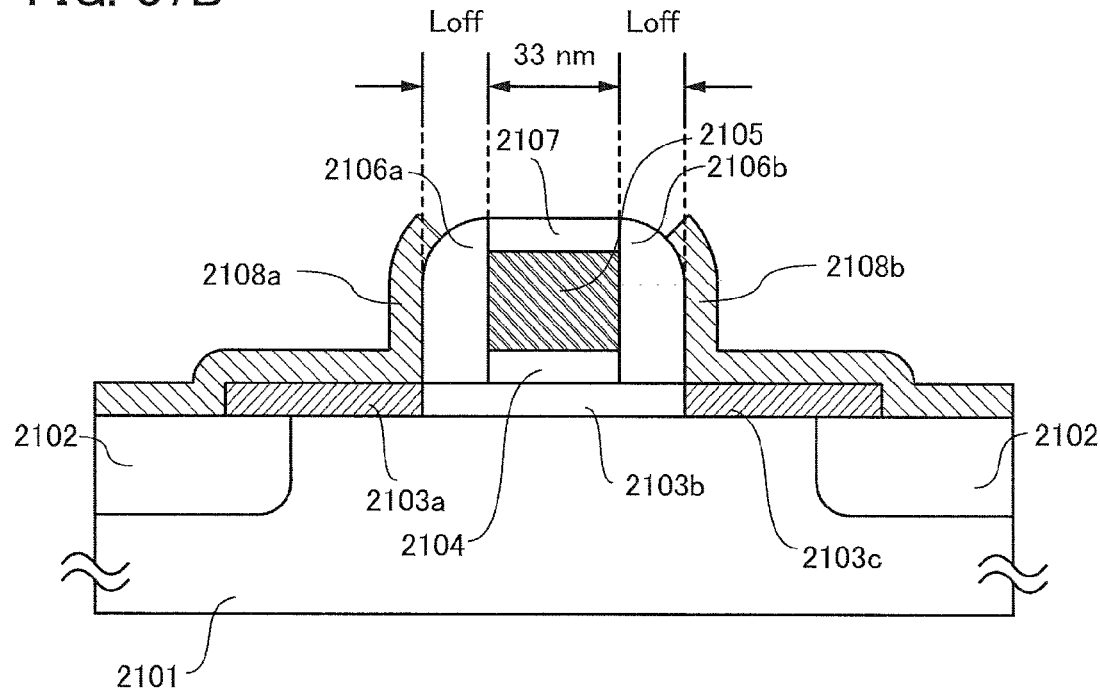

Further, FIGS. 36A to 36C show the gate voltage dependence of the drain current $I_d$ (a solid line) and the mobility $\mu$ (a dotted line) of the transistor having the structure illustrated in FIG. 37B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 36A shows the gate voltage dependence of the transistor in the case where the thickness of the gate insulating layer is 15 nm, FIG. 36B shows that of the transistor in the case where the thickness of the gate insulating layer is 10 nm, and FIG. 36C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm²/Vs in FIGS. 34A to 34C, approximately 60 cm²/Vs in FIGS. 35A to 35C, and approximately 40 cm²/Vs in FIGS. 36A to 36C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA, which is required in a memory cell and the like, at a gate voltage of around 1 V.

Embodiment 10

In this embodiment, a transistor in which an oxide semiconductor including In, Sn, and Zn as main components is used as an oxide semiconductor will be described.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 38A:
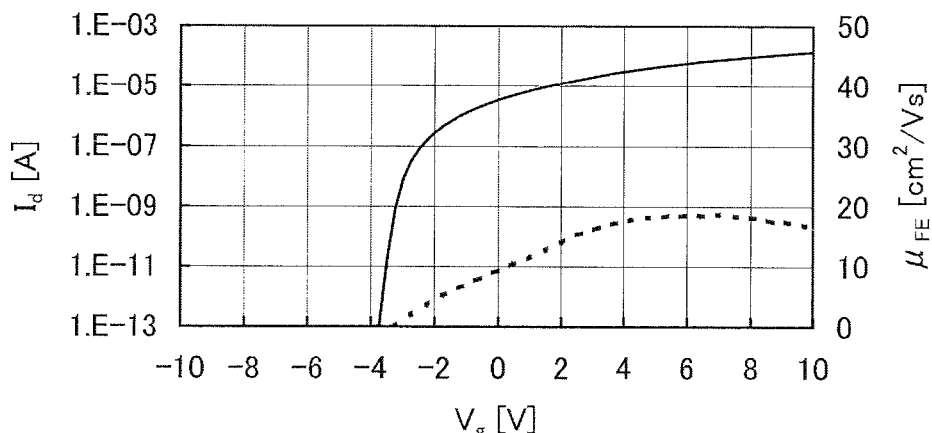
FIGS. 38A to 38C show characteristics of transistors.
Figure 38B:
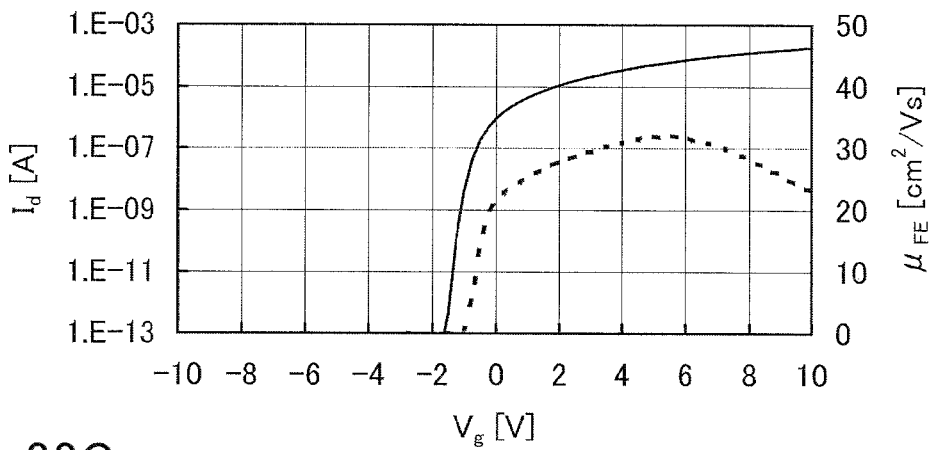
Figure 38C:
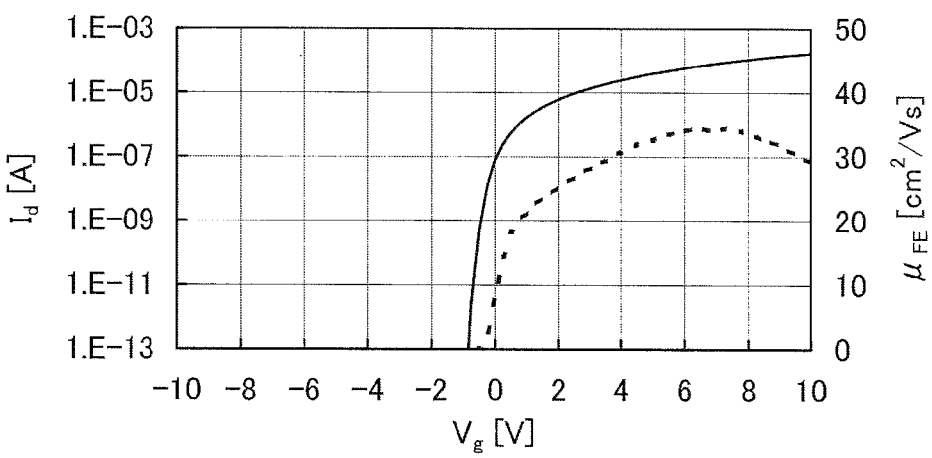

As an example, FIGS. 38A to 38C each show characteristics of a transistor in which an oxide semiconductor film including In, Sn, and Zn as main components and having a channel length L of 3 µm and a channel width W of 10 µm, and a gate insulating layer with a thickness of 100 nm are used. Note that $V_d$ was set to 10 V.

FIG. 38A shows characteristics of a transistor whose oxide semiconductor film including In, Sn, and Zn as main components was formed by a sputtering method without heating a substrate intentionally. The field-effect mobility of the transistor is 18.8 cm²/Vsec. On the other hand, when the oxide semiconductor film including In, Sn, and Zn as main components is formed while heating the substrate intentionally, the field-effect mobility can be improved. FIG. 38B shows characteristics of a transistor whose oxide semiconductor film including In, Sn, and Zn as main components was formed while heating a substrate at 200° C. The field-effect mobility of the transistor is 32.2 cm²/Vsec.

The field-effect mobility can be further improved by performing heat treatment after formation of the oxide semiconductor film including In, Sn, and Zn as main components. FIG. 38C shows characteristics of a transistor whose oxide semiconductor film including In, Sn, and Zn as main components was formed by sputtering at 200° C. and then subjected to heat treatment at 650° C. The field-effect mobility of the transistor is 34.5 cm²/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 38A and 38B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2.2 megavolts ("MV")/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $I_d$–$V_g$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $I_d$–$V_g$ characteristics of the transistors were measured at a substrate temperature of 25° C. and $V_d$ of 10 V. This process is called a positive BT test.

In a similar manner, first, $I_d$–$V_g$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $I_d$–$V_g$ characteristics of the transistors were measured at a substrate temperature of 25° C. and $V_d$ of 10 V. This process is called a negative BT test.

Figure 39A:
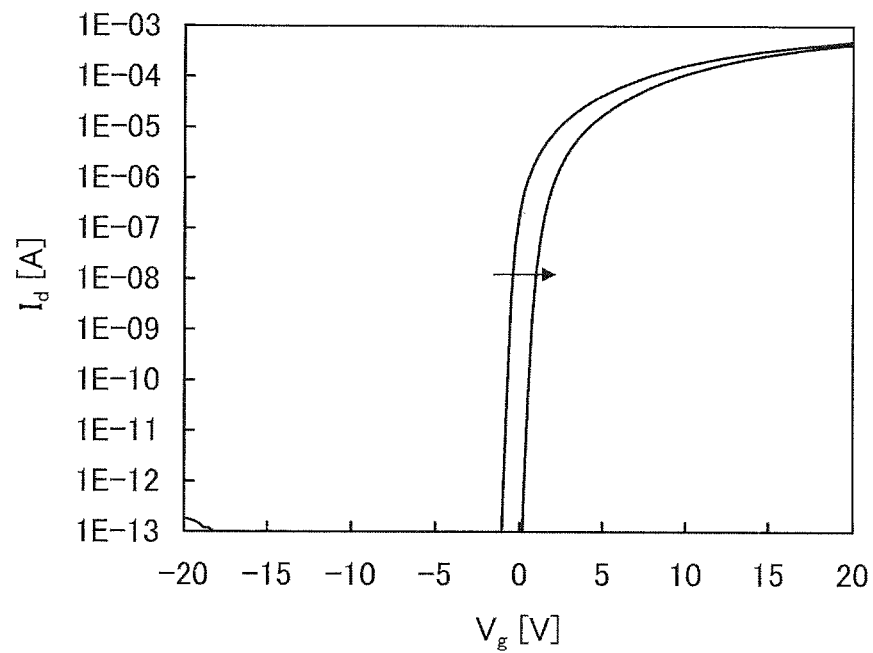
FIGS. 39A and 39B show characteristics of a transistor.
Figure 39B:
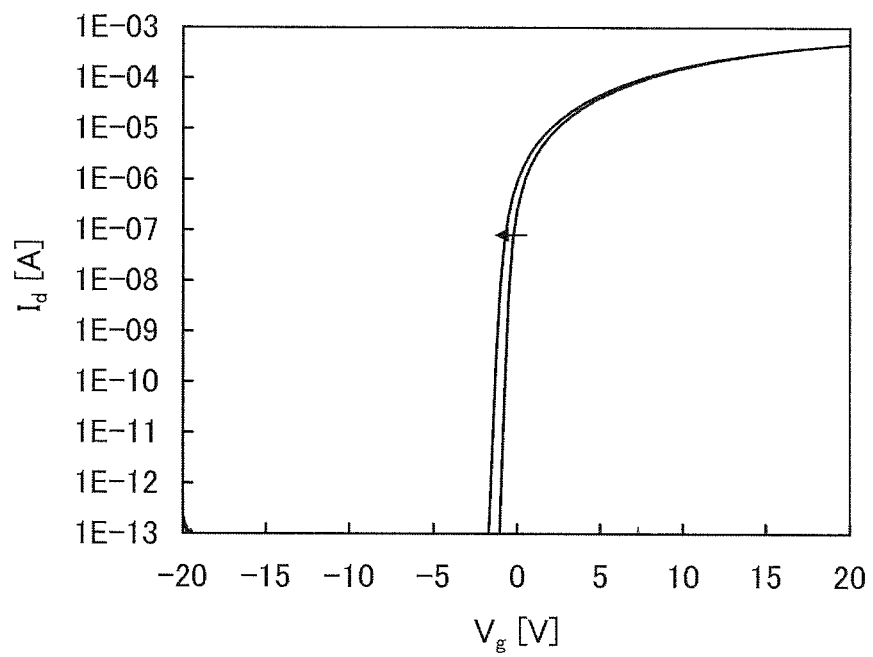
Figure 40A:
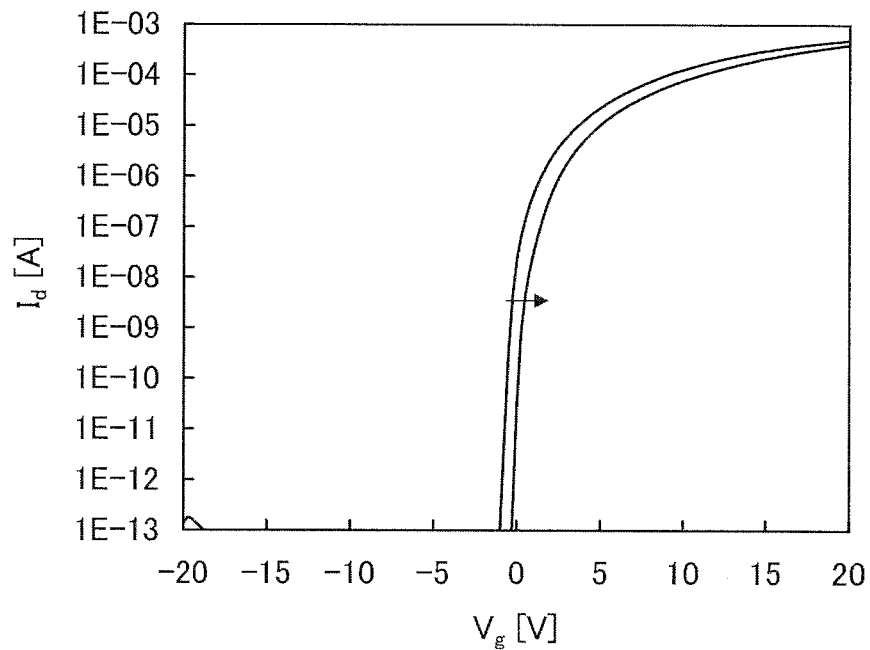
FIGS. 40A and 40B show characteristics of a transistor.
Figure 40B:
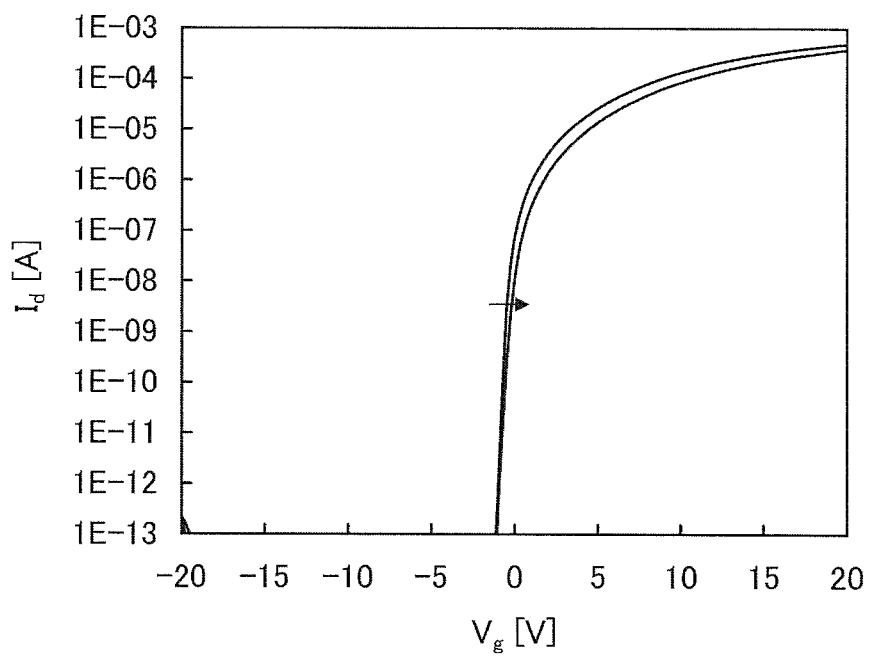

FIGS. 39A and 39B show a result of the positive bias temperature ("BT") test of Sample 1 and a result of the negative BT test of Sample 1, respectively. FIGS. 40A and 40B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 43:
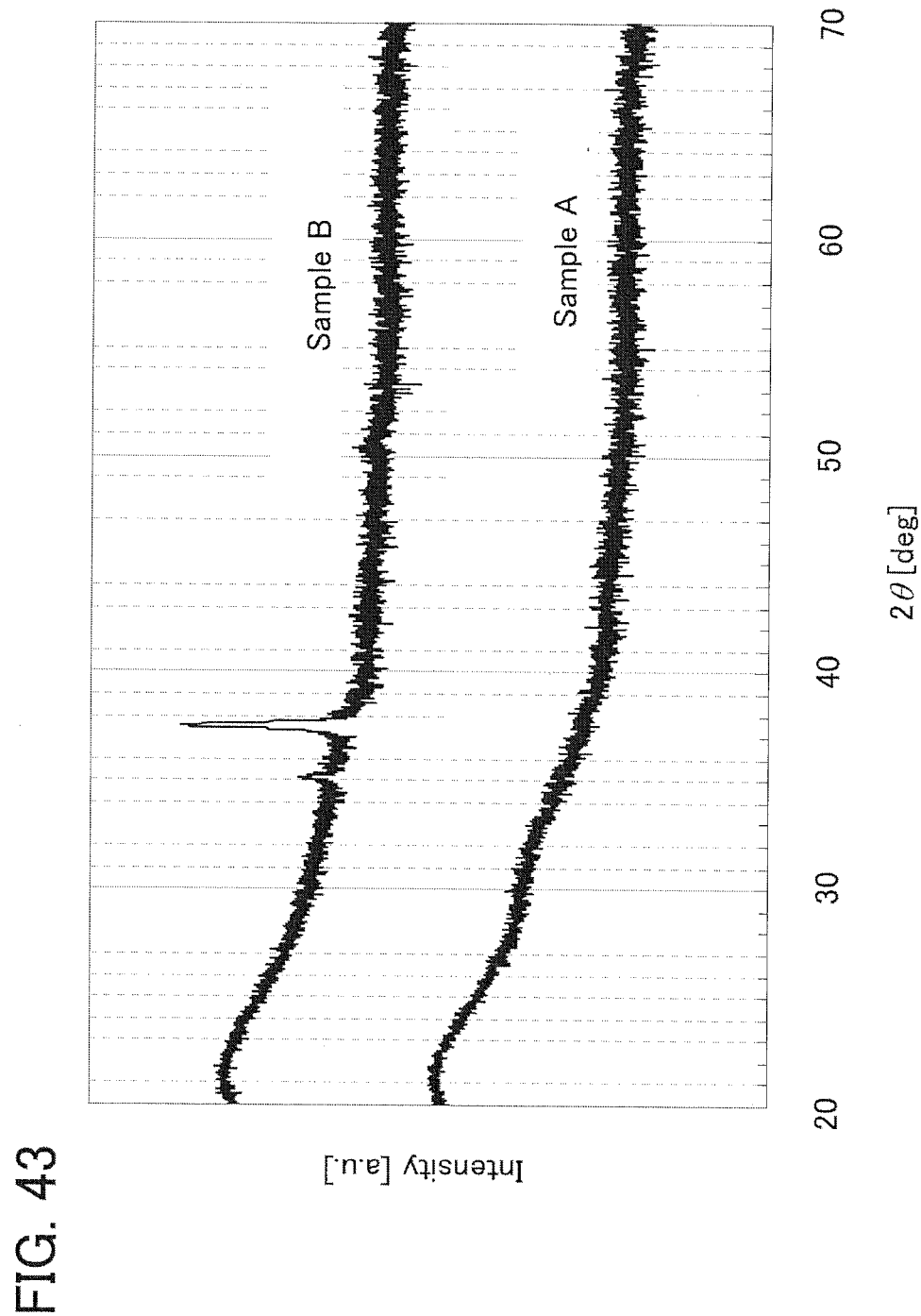
FIG. 43 shows XRD spectra of oxide materials.

FIG. 43 shows XRD spectra of Sample A and Sample B. No peak derived from crystal was observed in Sample A, whereas peaks derived from crystal were observed when 2θ was around 35 deg. at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current is used to indicate current per micrometer of a channel width.

Figure 44:
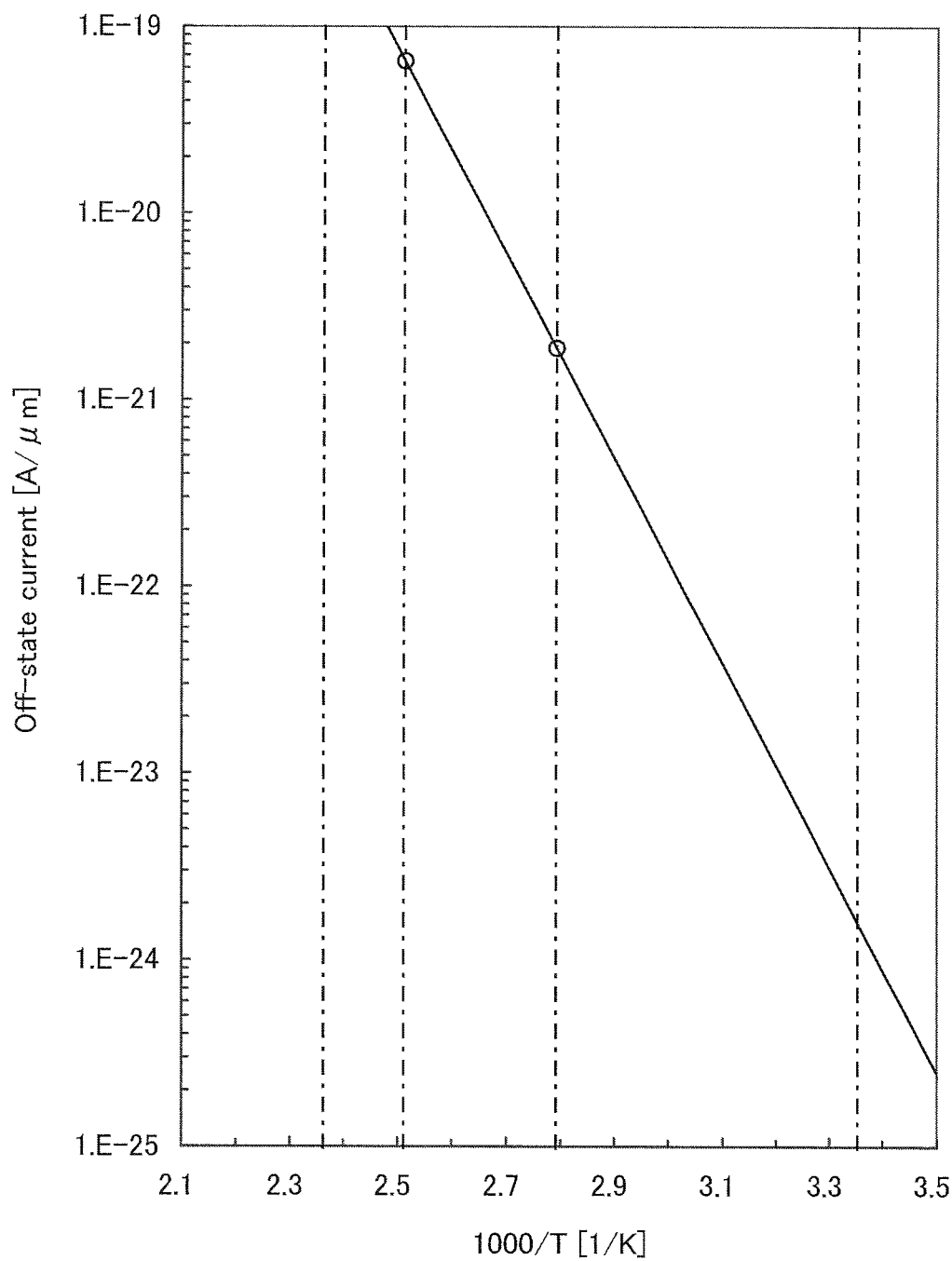
FIG. 44 shows characteristics of a transistor.

FIG. 44 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 44, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 41:
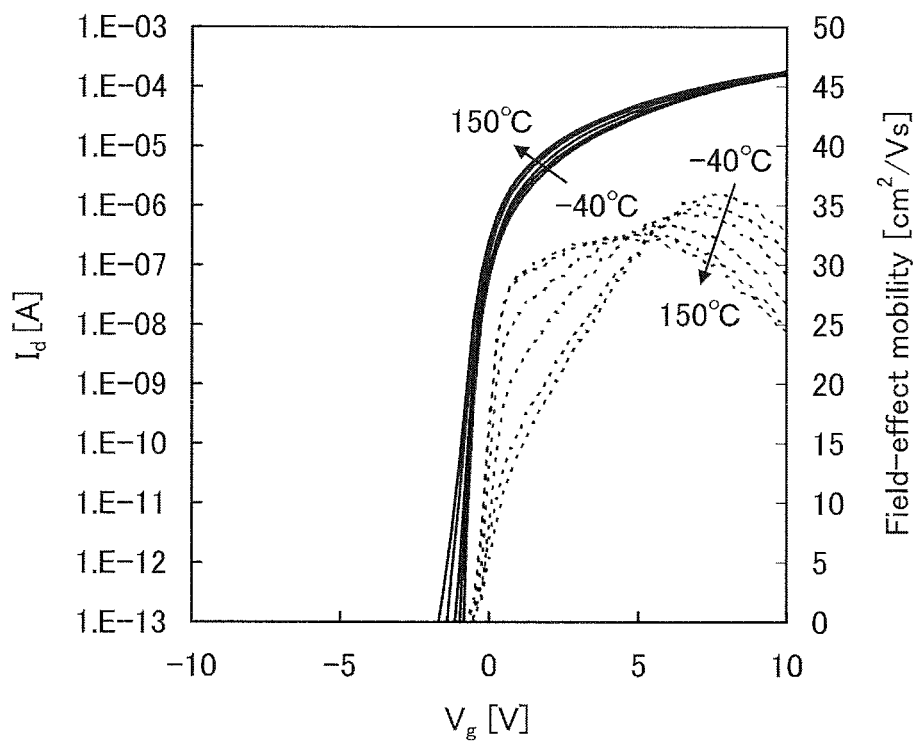
FIG. 41 shows characteristics of a transistor.
Figure 42A:
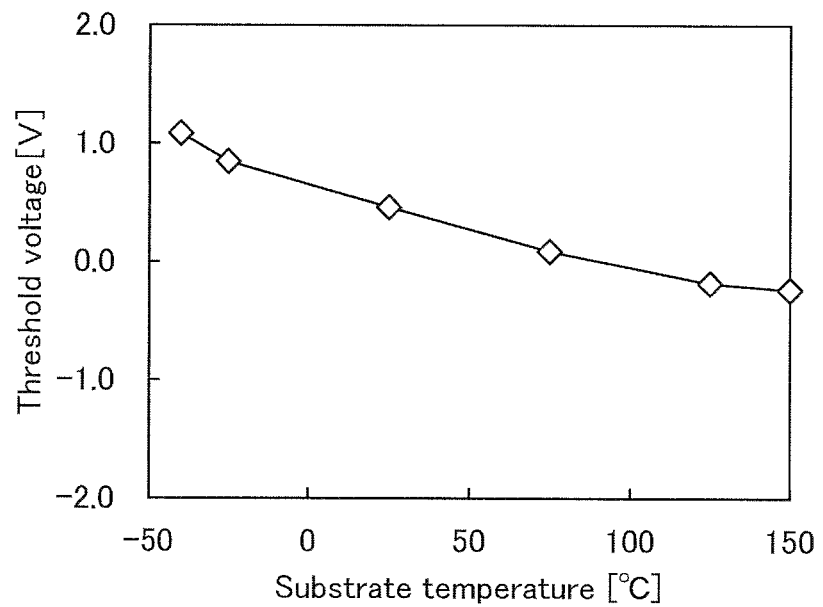
FIGS. 42A and 42B show characteristics of a transistor.

FIG. 41 shows the $V_g$ dependence of $I_d$ (a solid line) and field-effect mobility (a dotted line). FIG. 42A shows a relation between the substrate temperature and the threshold voltage, and FIG. 42B shows a relation between the substrate temperature and the field-effect mobility.

From FIG. 42A, it is found that the threshold voltage gets lower as the substrate temperature increases. Note that the threshold voltage is decreased from 1.09 V to −0.23 V in the range from −40° C. to 150° C.

Figure 42B:
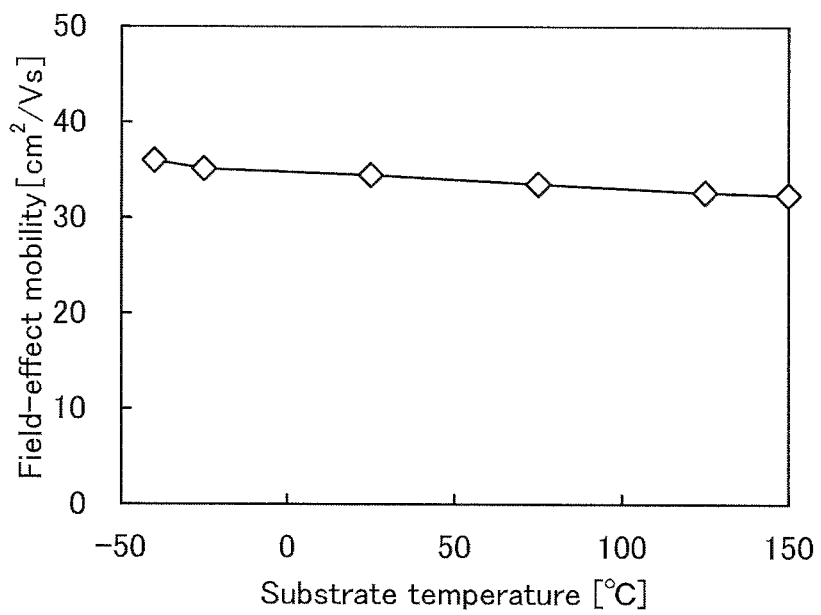

From FIG. 42B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

An example of a transistor in which an In—Sn—Zn—O film is used as an oxide semiconductor film will be described below.

Figure 45A:
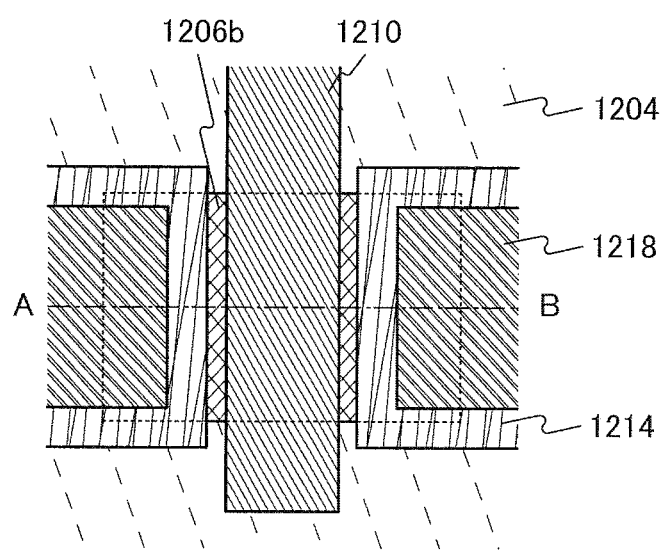
FIGS. 45A and 45B are a top view and a cross-sectional view of a semiconductor device.
Figure 45B:
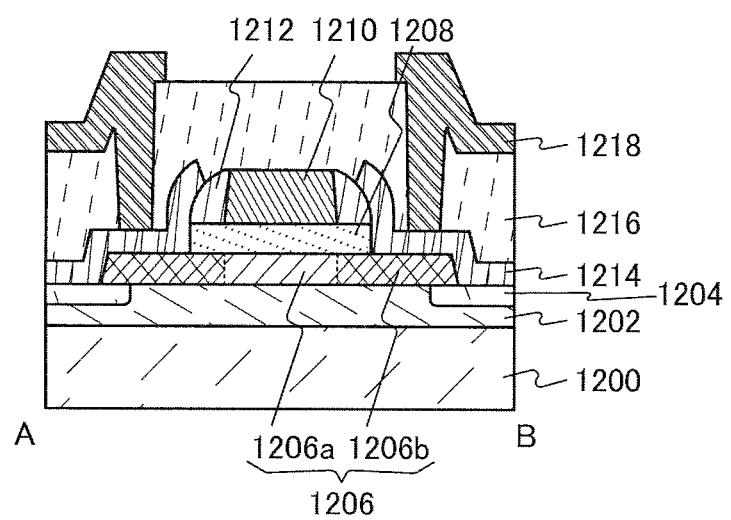

FIGS. 45A and 45B are a top view and a cross-sectional view of a coplanar transistor having a top-gate top-contact structure. FIG. 45A is the top view of the transistor.

FIG. 45B illustrates cross section A-B along dashed-dotted line A-B in FIG. 45A.

The transistor illustrated in FIG. 45B includes a substrate 1200; a base insulating layer 1202 provided over the substrate 1200; a protective insulating film 1204 provided in the periphery of the base insulating layer 1202; an oxide semiconductor film 1206 provided over the base insulating layer 1202 and the protective insulating film 1204 and including a high-resistance region 1206a and low-resistance regions 1206b; a gate insulating layer 1208 provided over the oxide semiconductor film 1206; a gate electrode 1210 provided to overlap with the oxide semiconductor film 1206 with the gate insulating layer 1208 positioned therebetween; a sidewall insulating film 1212 provided in contact with a side surface of the gate electrode 1210; a pair of electrodes 1214 provided in contact with at least the low-resistance regions 1206*b*; an interlayer insulating film 1216 provided to cover at least the oxide semiconductor film 1206, the gate electrode 1210, and the pair of electrodes 1214; and a wiring 1218 provided to be connected to at least one of the pair of electrodes 1214 through an opening formed in the interlayer insulating film 1216.

Although not illustrated, a protective film may be provided to cover the interlayer insulating film 1216 and the wiring 1218. With the protective film, a minute amount of leakage current generated by surface conduction of the interlayer insulating film 1216 can be reduced and thus the off-state current of the transistor can be reduced.

Another example of a transistor in which an In—Sn—Zn—O film is used as an oxide semiconductor film will be described below.

Figure 46A:
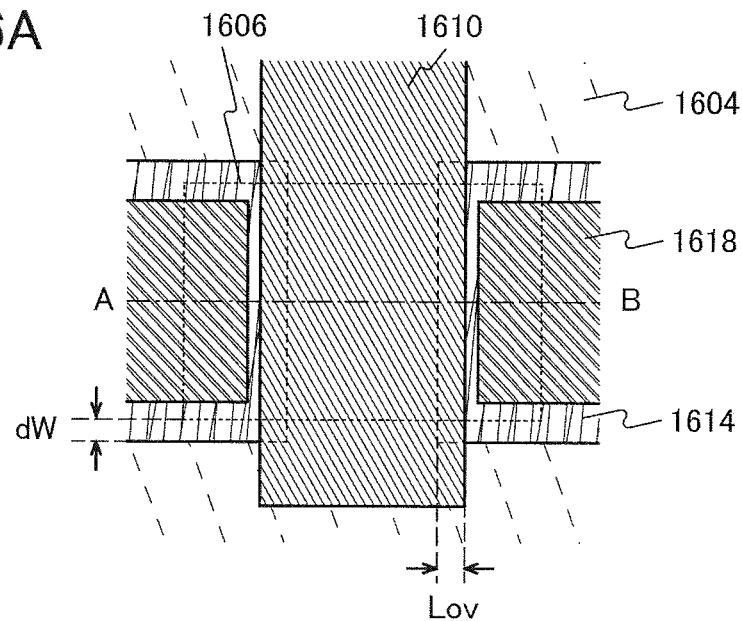
FIGS. 46A and 46B are a top view and a cross-sectional view of a semiconductor device.
Figure 46B:
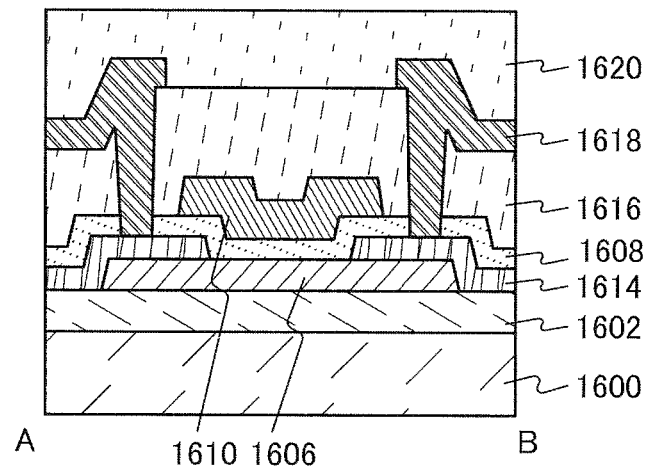

FIGS. 46A and 46B are a top view and a cross-sectional view which illustrate a structure of a transistor. FIG. 46A is the top view of the transistor. FIG. 46B is a cross-sectional view along dashed-dotted line A-B in FIG. 46A.

The transistor illustrated in FIG. 46B includes a substrate 1600; a base insulating layer 1602 provided over the substrate 1600; an oxide semiconductor film 1606 provided over the base insulating layer 1602; a pair of electrodes 1614 in contact with the oxide semiconductor film 1606; a gate insulating layer 1608 provided over the oxide semiconductor film 1606 and the pair of electrodes 1614; a gate electrode 1610 provided to overlap with the oxide semiconductor film 1606 with the gate insulating layer 1608 positioned therebetween; an interlayer insulating film 1616 provided to cover the gate insulating layer 1608 and the gate electrode 1610; wirings 1618 connected to the pair of electrodes 1614 through openings formed in the interlayer insulating film 1616; and a protective film 1620 provided to cover the interlayer insulating film 1616 and the wirings 1618.

As the substrate 1600, a glass substrate can be used. As the base insulating layer 1602, a silicon oxide film can be used. As the oxide semiconductor film 1606, an In—Sn—Zn—O film can be used. As the pair of electrodes 1614, a tungsten film can be used. As the gate insulating layer 1608, a silicon oxide film can be used. The gate electrode 1610 can have a stacked structure of a tantalum nitride film and a tungsten film. The interlayer insulating film 1616 can have a stacked structure of a silicon oxynitride film and a polyimide film. The wirings 1618 can each have a stacked structure in which a titanium film, an aluminum film, and a titanium film are formed in this order. As the protective film 1620, a polyimide film can be used.

Note that in the transistor having the structure illustrated in FIG. 46A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

Embodiment 11

In this embodiment, the case where the semiconductor device described in any of the above embodiments is applied to an electronic device will be described with reference to FIGS. 29A to 29F. In this embodiment, examples of the electronic device to which the above semiconductor device is applied include a computer, a mobile phone (also referred to as a cellular phone or a mobile phone device), a portable information terminal (including a portable game machine, an audio reproducing device, and the like), a camera such as a digital camera or a digital video camera, electronic paper, and a television device (also referred to as a television or a television receiver).

Figure 29A:
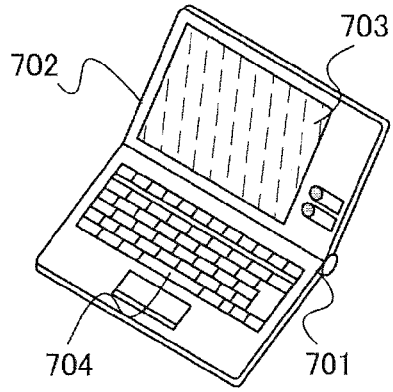
FIGS. 29A to 29F each illustrate an electronic device including a semiconductor device.

FIG. 29A illustrates a laptop computer including a housing 701, a housing 702, a display portion 703, a keyboard 704, and the like. The semiconductor device described in any of the above embodiments is provided in at least one of the housing 701 and the housing 702. Therefore, a laptop computer in which writing and reading of data are performed at high speed, data is held for a long time, and power consumption is sufficiently reduced can be realized.

Figure 29D:
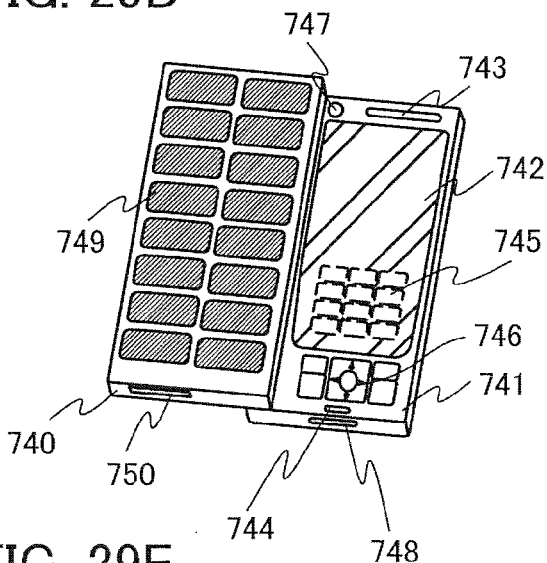
Figure 29B:
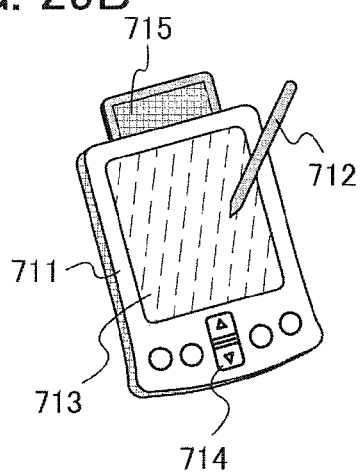

FIG. 29B illustrates a portable information terminal (PDA). A main body 711 is provided with a display portion 713, an external interface 715, operation buttons 714, and the like. Further, a stylus 712 or the like for operation of the portable information terminal is provided. In the main body 711, the semiconductor device described in any of the above embodiments is provided. Therefore, a portable information terminal in which writing and reading of data are performed at high speed, data is held for a long time, and power consumption is sufficiently reduced can be realized.

Figure 29E:
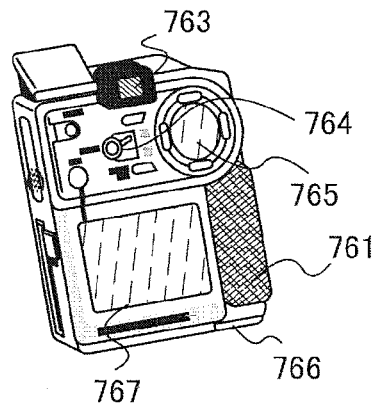
Figure 29C:
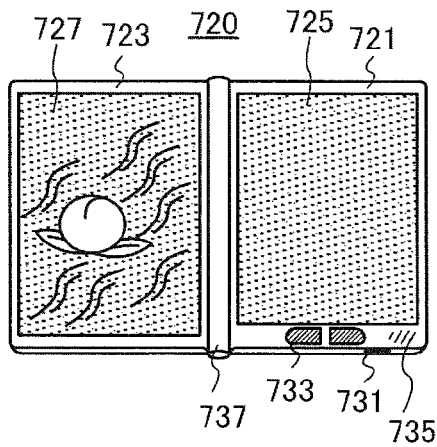

FIG. 29C illustrates an electronic book reader 720 incorporating electronic paper, which includes two housings, a housing 721 and a housing 723. The housing 721 and the housing 723 are provided with a display portion 725 and a display portion 727, respectively. The housings 721 and 723 are connected by a hinge 737 and can be opened or closed using the hinge 737 as an axis. The housing 721 is provided with a power switch 731, an operation key 733, a speaker 735, and the like. At least one of the housing 721 and the housing 723 is provided with the semiconductor device described in any of the above embodiments. Therefore, an electronic book reader in which writing and reading of data are performed at high speed, data is held for a long time, and power consumption is sufficiently reduced can be realized.

FIG. 29D illustrates a mobile phone including two housings, a housing 740 and a housing 741. Further, the housing 740 and the housing 741 in a state where they are developed as illustrated in FIG. 29D can be slid so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housing 740 and the housing 741 is provided with the semiconductor device described in any of the above embodiments. Therefore, a mobile phone in which writing and reading of data are performed at high speed, data is held for a long time, and power consumption is sufficiently reduced can be realized.

FIG. 29E illustrates a digital camera including a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data is held for a long time, and power consumption is sufficiently reduced can be realized.

Figure 29F:
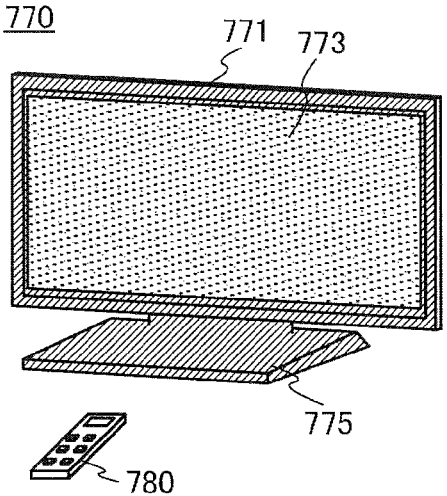

FIG. 29F illustrates a television set including a housing 771, a display portion 773, a stand 775, and the like. The television set 770 can be operated with a switch of the housing 771 or a remote controller 780. The semiconductor device described in any of the above embodiments is mounted on the housing 771 and the remote controller 780. Therefore, a television set in which writing and reading of data are performed at high speed, data is held for a long time, and power consumption is sufficiently reduced can be realized.

As described above, the electronic devices described in this embodiment each include the semiconductor device according to any of the above embodiments. Therefore, electronic devices with low power consumption can be realized.

This application is based on Japanese Patent Application serial no. 2010-178146 filed with the Japan Patent Office on Aug. 6, 2010 and Japanese Patent Application serial no. 2011-108643 filed with the Japan Patent Office on May 13, 2011, the entire contents of which are hereby incorporated by reference.

What is claimed is:

1. A semiconductor device comprising:
a memory cell comprising a first transistor including an oxide semiconductor and a second transistor including a material other than the oxide semiconductor;
a driver circuit configured to drive the memory cell, wherein the driver circuit comprises a data buffer, a writing circuit, a reading circuit and a verifying circuit; and
a potential generating circuit configured to generate potentials supplied to the driver circuit through a plurality of first signal lines,
wherein the writing circuit is electrically connected to the memory cell through a second signal line,
wherein the reading circuit is electrically connected to the memory cell through a third signal line, and
wherein the verifying circuit is electrically connected to the reading circuit, the data buffer and the writing circuit.

2. The semiconductor device according to claim 1, wherein the first transistor is provided over the second transistor.

3. The semiconductor device according to claim 1, wherein one of a source and a drain of the first transistor is electrically connected to a gate of the second transistor.

4. The semiconductor device according to claim 1,
wherein the writing circuit is electrically connected to one of a source and a drain of the first transistor, and
wherein the reading circuit is electrically connected to one of a source and a drain of the second transistor.

5. The semiconductor device according to claim 1, wherein the second transistor comprises a channel formation region provided in a substrate including a semiconductor material.

6. The semiconductor device according to claim 5, wherein the substrate is a single crystal semiconductor substrate or an SOI substrate.

7. The semiconductor device according to claim 1, wherein the oxide semiconductor comprises an oxide semiconductor material including In, Ga, and Zn.

8. A semiconductor device comprising:
a memory cell comprising a first transistor including an oxide semiconductor and a second transistor including a material other than the oxide semiconductor;
a driver circuit configured to drive the memory cell, wherein the driver circuit comprises a data buffer, a writing circuit, a reading circuit and a verifying circuit;
a potential generating circuit configured to generate potentials supplied to the driver circuit through a plurality of first signal lines; and
an input/output line,
wherein the writing circuit is electrically connected to the memory cell through a second signal line,
wherein the reading circuit is electrically connected to the memory cell through a third signal line,
wherein the verifying circuit is electrically connected to the reading circuit, the data buffer and the writing circuit, and
wherein the data buffer and the reading circuit are electrically connected to the input/output line.

9. The semiconductor device according to claim 8, wherein the first transistor is provided over the second transistor.

10. The semiconductor device according to claim 8, wherein one of a source and a drain of the first transistor is electrically connected to a gate of the second transistor.

11. The semiconductor device according to claim 8,
wherein the writing circuit is electrically connected to one of a source and a drain of the first transistor, and
wherein the reading circuit is electrically connected to one of a source and a drain of the second transistor.

12. The semiconductor device according to claim 8, wherein the second transistor comprises a channel formation region provided in a substrate including a semiconductor material.

13. The semiconductor device according to claim 12, wherein the substrate is a single crystal semiconductor substrate or an SOI substrate.

14. The semiconductor device according to claim 8, wherein the oxide semiconductor comprises an oxide semiconductor material including In, Ga, and Zn.

* * * * *